US006995833B2

(12) United States Patent
Kato et al.

(10) Patent No.: US 6,995,833 B2
(45) Date of Patent: Feb. 7, 2006

(54) PROJECTION OPTICAL SYSTEM, EXPOSURE APPARATUS, AND DEVICE MANUFACTURING METHOD

(75) Inventors: Takashi Kato, Tochigi (JP); Chiaki Terasawa, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 62 days.

(21) Appl. No.: 10/851,869

(22) Filed: May 21, 2004

(65) Prior Publication Data

US 2004/0233405 A1   Nov. 25, 2004

(30) Foreign Application Priority Data

| May 23, 2003 | (JP) | ............................. 2003-146442 |
| Jun. 30, 2003 | (JP) | ............................. 2003-187469 |
| Jul. 1, 2003 | (JP) | ............................. 2003-189594 |
| May 10, 2004 | (JP) | ............................. 2004-139679 |
| May 10, 2004 | (JP) | ............................. 2004-139680 |

(51) Int. Cl.
   *G03B 27/54* (2006.01)
   *G03B 27/42* (2006.01)
   *G02B 5/08* (2006.01)

(52) U.S. Cl. ........................... 355/67; 355/53; 359/861
(58) Field of Classification Search .................. 355/52, 355/53, 55, 67–71, 77; 250/548; 359/365, 359/727, 858–861
   See application file for complete search history.

(56) References Cited

U.S. PATENT DOCUMENTS

| 4,953,960 A | 9/1990 | Williamson ................. 350/442 |
| 5,220,454 A | 6/1993 | Ichihara et al. ............. 359/487 |
| 5,592,329 A | 1/1997 | Ishiyama et al. ........... 359/399 |
| 5,650,877 A | 7/1997 | Phillips, Jr. et al. ........ 359/732 |
| 5,668,673 A | 9/1997 | Suenaga et al. ............. 359/731 |
| 5,686,728 A | 11/1997 | Shafer ..................... 250/492.2 |
| 5,815,310 A | 9/1998 | Williamson ................. 359/365 |
| 5,861,997 A | 1/1999 | Takahashi ................... 359/727 |
| 6,172,825 B1 * | 1/2001 | Takahashi ................... 359/859 |
| 6,496,306 B1 | 12/2002 | Shafer et al. ............... 359/355 |
| 6,909,492 B2 * | 6/2005 | Omura ......................... 355/67 |
| 2002/0044260 A1 | 4/2002 | Takahashi et al. ............ 353/31 |
| 2003/0011755 A1 * | 1/2003 | Omura et al. ................ 355/67 |

FOREIGN PATENT DOCUMENTS

| EP | 0 816 892 A2 | 1/1998 |
| EP | 0 828 172 A1 | 3/1998 |
| JP | 62-210415 | 9/1987 |
| JP | 62-258414 | 11/1987 |
| JP | 02-066510 | 3/1990 |
| JP | 03-282527 | 12/1991 |
| JP | 05-188298 | 7/1993 |

(Continued)

*Primary Examiner*—Henry Hung Nguyen
(74) *Attorney, Agent, or Firm*—Morgan & Finnegan, LLP

(57) ABSTRACT

A projection optical system for projecting an image of a first object onto a second object includes a first imaging optical system that forms a first intermediate image of the first object, and includes a lens, a second imaging optical system that forms a second intermediate image of the first object, and includes a lens and a concave mirror, and a third imaging optical system that forms an image of the first object onto the second object, and includes a lens, wherein the first, second and third imaging optical systems are arranged along an optical path from the first object in this order, and $0.7<|\beta1\cdot\beta2|<3.0$ is met where $\beta1$ is a paraxial magnification of the first imaging optical system, and $\beta2$ is a paraxial magnification of the second imaging optical system.

35 Claims, 25 Drawing Sheets

FOREIGN PATENT DOCUMENTS

| | | |
|---|---|---|
| JP | 06-230287 | 8/1994 |
| JP | 08-062502 | 3/1996 |
| JP | 09-211332 | 8/1997 |
| JP | 10-003039 | 1/1998 |
| JP | 10-079345 | 3/1998 |
| JP | 10-090602 | 4/1998 |
| JP | 2000-047114 | 2/2000 |
| JP | 2002-083766 | 3/2002 |

* cited by examiner

PROJECTION OPTICAL SYSTEM, EXPOSURE APPARATUS, AND DEVICE MANUFACTURING METHOD

This application claims a benefit of a foreign priority based on Japanese Patent Applications Nos. 2003-146442, filed on May 23, 2003, 2003-187469, filed on Jun. 30, 2003, 2003-189594, filed on Jul. 1, 2003, 2004-139679, filed on May 10, 2004, and 2004-139680, filed on May 10, 2004, each of which is hereby incorporated by reference herein in its entirety as if fully set forth herein.

BACKGROUND OF THE INVENTION

The present invention relates generally to a projection optical system, a projection exposure apparatus having the projection optical system, and a device fabrication method, and more particularly to a catadioptric projection optical system that uses a mirror for a projection optical system that projects and exposes a reticle pattern onto a wafer.

The photolithography process for fabricating semiconductor integrated circuits employs a projection exposure apparatus that uses a projection optical system to project and expose a pattern on a mask or reticle onto a wafer to which photoresist and the like are applied. The recent, more highly integrated circuits require stricter specification and performance for a projection exposure optical system.

The projection exposure optical system needs a shorter exposure wavelength and/or a higher numerical aperture ("NA") to improve resolution. With a short exposure wavelength ranging such as 193 nm (ArF), 157 nm ($F_2$) and the like for higher resolution, transmission optical elements other than quartz or calcium fluoride lenses hardly provide high transmittance. Therefore, lens materials are limited to quartz and calcium fluoride for an expected light intensity. An optical system for a projection exposure apparatus using light in such a wave range as 193 nm and 157 nm includes only dioptric lenses as in Japanese Patent Application, Publication No. 10-79345 (corresponding to EP A1 828172). An optical system having many lenses made of a glass material with a large total thickness absorbs the large amount of light, and reduces the exposure dose on a wafer, causing a decrease in throughput. The lens's heat absorption and resultant temperature rise disadvantageously fluctuate a focal position, (heat) aberrations, etc. While the quartz and calcium fluoride lenses are viable to an exposure wavelength of 193 nm, small differences in their dispersion values have difficulties in corrections to chromatic aberrations and the correction to chromatic aberrations needs plural achromatic lenses with an achromatic surface and a small radius of curvature. Plural achromatic lenses in the optical system will increase the total thickness of the glass materials, which enhances the problems of lowered transmittance and occurrence of heat aberration. Calcium fluoride can hardly provide a lens with designed performance suitable for a projection optical system, and complicates a fabrication of a large-aperture lens. This complicates color corrections, and increases the cost. For an exposure wavelength of 157 nm, only calcium fluoride is usable for materials for a lens and only a single material has difficulties in chromatic aberration corrections. Since it is hard to construct a projection optical system just by using a dioptric system, various proposals that use a mirror for an optical system have been made to solve the disadvantageous reduced transmittance and difficult chromatic aberration corrections.

For example, a catoptric projection optical system including only mirrors is disclosed in Japanese Patent Application Publication No. 09-211332 (corresponding to U.S. Pat. No. 5,815,310), 10-90602 (corresponding to U.S. Pat. No. 5,686,728), etc. A catadioptric projection optical system combining a mirror and a lens is disclosed in U.S. Pat. No. 5,650,877, Japanese Patent Applications, Publication Nos. 62-210415, 62-258414, 02-66510 (corresponding to U.S. Pat. No. 4,953,960), 03-282527 (corresponding to U.S. Pat. No. 5,220,454), 05-188298 (corresponding to U.S. Pat. No. 5,668,673), 06-230287 (corresponding to U.S. Pat. No. 5,592,329), 10-3039 (corresponding to EP A2 816892), 2000-47114 (corresponding to EP A2 989434), 08-62502 (corresponding to U.S. Pat. No. 5,861,997), and 2002-83766 (corresponding to EP A2 1168028) etc.

In configuring a projection optical system that includes a reflective optical system with a shorter exposure wavelength and a higher NA and, it is desirable, in addition to feasible chromatic aberration corrections, to maintain a large enough imaging area ideally on an image surface, secure a sufficient working distance image-side, and provide a simple structure. If a large enough imaging area is obtainable on an image surface, a scanning type projection exposure apparatus will be advantageous in terms of throughput, thus, making it possible to control exposure fluctuations. If a sufficient image-side working distance can be secured, that is desirable from the viewpoint of constructing an apparatus's auto-focusing system, a wafer-stage's transport system, and the like, a simple structure would not complicate a mechanical lens-barrel and the like, thus being a merit to assembly production.

When prior art examples are thus viewed, U.S. Pat. No. 5,650,877 arranges a Mangin mirror and a refractor in an optical system, and exposes a reticle image onto a wafer. Disadvantageously, this optical system blocks light on a pupil's central part for all the angles of view to be used (hollow illumination), and cannot enlarge an exposure area. An attempt to enlarge the exposure area results in the undesirable expansion of the light blockage on the pupil's central part. In addition, since a refractive surface of the Mangin mirror forms the light splitting surface that halves light intensity when the light passes through its surface, and reduces light intensity down to about 10%. Japanese Patent Applications, Publication Nos. 09-211332 and 10-90602 basically use a catoptric optical system, but have difficulties in securing a sufficient width for the imaging area on the image surface, because of problems, such as deteriorated aberrations (the sum of the Petzval terms) and complicate mirror arrangements. Even an apparatus that includes a concave mirror with a strong power mainly near the image surface as an imaging function can hardly provide a high NA. A convex mirror arranged at a position right just before the concave mirror does not provide a sufficient image-side working distance. Japanese Patent Application Publication Nos. S62-210415 and S62-258414 apply Cassegrain and Schwarzschild mirror systems, and propose an optical system that has an opening at the center of the mirror for a hollow illumination to the pupil to image only the pupil's periphery. However, there is a concern about the influence of the hollow illumination to the pupil on the imaging performance. An attempt to lessen the hollow illumination to the pupil inevitably adds to the power of the mirror and enlarges a reflection angle incident upon the mirror. An attempt to have a higher NA causes a mirror's diameter to grow remarkably. According to Japanese Patent Applications, Publication Nos. 05-188298 and 06-230287, the deflected optical path complicates an apparatus's configuration. A high NA is structurally difficult because the concave mirror is responsible for most powers in the optical elements for imaging an intermediate image onto a final image. Since a lens system located between the concave mirror and the image surface is a reduction system and the magnification has a positive sign, the image-side working distance cannot be sufficiently secured. Since an optical path needs to be split, it is structurally difficult to secure an imaging area width. The insufficient imaging area width is not suitable for foot-printing in a large optical system.

Japanese Patent Applications, Publication Nos. 02-66510 and 03-282527 first split an optical path using by the light-splitter, and complicate the structure of a lens-barrel. They need the light-splitter with a large diameter and if the light-splitter is a prism type, a loss of the light intensity is large due to its thickness. A higher NA needs a larger diameter and increases a loss of the light intensity. Use of a flat-plate beam splitter is also problematic even with axial light, because it causes astigmatism and coma. In addition, asymmetrical astigmatism due to heat absorptions and aberrations due to characteristic changes on the light splitting surface complicate accurate productions of the light splitter.

Japanese Patent Applications, Publication Nos. 10-3039 and 200047114 propose a twice-imaging catadioptric optical system for forming an intermediate image once. It includes a first imaging optical system that has a reciprocating optical system which includes concave mirrors to form an intermediate image of an object (e.g., a reticle), and a second imaging optical system that forms the intermediate image onto a surface of a second object (e.g., a wafer). Japanese Patent Application, Publication No. 10-3039 arranges a first plane mirror near the intermediate image for deflecting an optical axis and light near the intermediate image. The deflected optical axis is made approximately parallel to a reticle stage and is deflected once again by a second plane mirror, or an image is formed onto a second object without a second plane mirror. In Japanese Patent Application, Publication No. 2000-47114, a positive lens refracts light from a first object (e.g., a reticle), and a first plane mirror deflects the optical axis. A second plane mirror in a first imaging optical system again deflects the light reflected by a reciprocating optical system that includes a concave mirror to form an intermediate image. The intermediate image is projected onto a second object (e.g., a wafer) with a second imaging optical system. Thus, both references inevitably arrange the first object surface (e.g., a reticle), a lens, plane mirror and the deflected beam close to one another, and create a problem of interference between the first object surface (e.g., a reticle) or a reticle stage and a lens or a plane mirror or an insufficient space.

Optical systems in FIGS. 13 and 9 in Japanese Patent Application, Publication No. 2002-183766, and an optical system in FIGS. 7 and 9 in Japanese Patent Application, Publication No. 08-62502 are a three-time imaging catadioptric optical system for forming an intermediate image twice. It includes a first imaging optical system for forming a first intermediate image of a first object (e.g., a reticle), a second imaging optical system that includes a concave mirror and forms a second intermediate image from the first intermediate image, and a third imaging optical system for forming the second intermediate image onto a third object surface (e.g., a wafer). The second imaging optical system includes concave mirrors as a reciprocating optical system. The optical system with an NA of 0.75 in FIG. 13 of Japanese Patent Application, Publication No. 2002-83766 arranges a plane mirror (reflection block) near the first and second intermediate images, and aligns optical axes of the first and third imaging optical systems with each other. Thus, the first object (e.g., a reticle) and the second object (e.g., a wafer) are arranged in parallel. However, a higher NA disadvantageously makes an overall length (or a distance from the first object to the second object) too long to correct aberrations. The plane mirrors (reflection block) necessary to deflect light near the positions of the first and the second intermediate image cause dust and flaws to greatly affect the imaging performance of the two plane mirrors performance. Since the first imaging optical system maintains a large reduction magnification (corresponding to a paraxial magnification $|\beta 1|$ of about 0.625 of the first imaging optical system), the first intermediate image needs to increase a NA by the reduction magnification against an object-side NA at the first object (e.g., a reticle), thus increasing an incident angle range upon the plane mirror. As the NA becomes higher, this problem becomes more serious: The first imaging optical system that is too responsible for a reduction magnification with a higher NA excessively increases the incident angle range upon the plane mirror, and a coating on the plane mirror causes a large difference in reflected light's intensity between p-polarized light and s-polarized light. In addition, the first imaging optical system that is too responsible for the reduction magnification lowers an image point of the first intermediate image, and makes it difficult for the plane mirror to reflect all the light at the lowest view angle onto the second imaging optical system. The optical system with NAs of 0.45 to 0.5 in FIGS. 7 and 9 in the latter Japanese Patent Application, Publication No. 08-62502 is similarly a catadioptric projection optical system for forming an image three times or an intermediate image twice. This type of a projection optical system needs another plane mirror to arrange a first object (e.g., a reticle) and a second object (e.g., a wafer) in parallel. In that case, as described in the above references, a mirror is arranged in the first imaging optical system, and provides the same arrangement as the optical system in FIG. 13 of Japanese Patent Application, Publication No. 2002-83766, if arranged near the first intermediate image. The reduction magnifications in the first and second imaging optical systems significantly affect the system's reduction magnification (where the first imaging optical system has a paraxial magnification of $|\beta 1|$ of about 0.438 to 0.474), and an attempt at a higher NA poses a fatal problem similar to the optical system in the former Japanese Patent Application, Publication No. 2002-83766.

BRIEF SUMMARY OF THE INVENTION

Accordingly, it is an exemplary object of the present invention to provide a projection optical system that can easily secure a space near a first object (e.g., a reticle), simplify a mechanical structure, and minimize an influence of a coating in a plane mirror.

A projection optical system of one aspect according to the present invention is a catadioptric projection optical system which includes, along an optical path from a first object side (in the sequence in which light exiting from the first object passes), a first imaging optical system that includes at least one lens, and forms a first intermediate image of the first object, a second imaging optical system that includes at least one lens and at least one concave mirror, and forms a second intermediate image of the first object, and a third imaging optical system that includes at least one lens, and forms an image of the first object onto a second object, thus, forming the image of the first object onto the second object, wherein $0.70 < |\beta 1 \cdot \beta 2| < 3.0$ is met where $\beta 1$ is a paraxial magnification of the first imaging optical system, $\beta 2$ is a paraxial magnification of the second imaging optical system.

A projection optical system of another aspect according to the present invention for projecting an image of a first object onto a second object includes a first imaging optical system that forms a first intermediate image of the first object, and includes a lens, a second imaging optical system that forms a second intermediate image of the first object, and includes, in order from a side of the first object, a first deflective reflector, a dioptric lens group, and a concave mirror, and a third imaging optical system that forms an image of the first object onto the second object, and includes a second deflective reflector having a normal that makes practically 90° with a normal for the lens and the first deflective reflector, wherein the first, second and third imaging optical systems are arranged along an optical path from a side of the first object in this order, wherein the concave mirror is arranged opposite to the first object, wherein light from the first imaging optical system reflects in turn at the concave mirror and the first deflective reflector, thus being led to the third imaging optical system, and wherein light from the first deflective reflector is deflected at the second deflective reflector, then being led to the second object.

A projection optical system of another aspect according to the present invention for projecting an image of a first object onto a second object includes a first imaging optical system that forms a first intermediate image of the first object, and includes a lens, a second imaging optical system that forms a second intermediate image of the first object, and includes, in order from a side of the first object, a deflective reflector, a dioptric lens group, and a concave mirror, and a third imaging optical system that forms the image of the first object onto the second object, and includes a lens, wherein the first, second and third imaging optical systems are arranged in this order from the side of the first object along an optical path, wherein the concave mirror is arranged opposite to the first object, and wherein the deflective reflector is arranged to form a predetermined angle with the optical axis of the second imaging optical system so that light from the first imaging optical system to the concave mirror and light reflected at the deflective reflector intersect each other.

A projection optical system of another aspect according to the present invention is a catadioptric projection optical system which includes, along an optical path from a first object side, a first imaging optical system that includes at least one lens, and forms a first intermediate image of the first object, a second imaging optical system that includes at least one lens and at least one concave mirror, and forms a second intermediate image of the first object, and a third imaging optical system that includes at least one lens, and forms an image of the first object onto a second object, thus, forming an image of the first object onto the second object, wherein $0.70<|\beta 1|<2.0$ is met where $\beta 1$ is a paraxial magnification of the first imaging optical system.

A projection optical system for projecting an image on a first object onto a second object includes a first imaging optical system that includes a lens and forms a first intermediate image of the first object, a second imaging optical system that includes a lens and a concave mirror, and forms a second intermediate of the first object, and a third imaging optical system that includes a lens and forms the image of the first object onto the second object, wherein said first, second and third imaging optical systems are arranged along an optical path from the first object in order of said first imaging optical system, said second imaging optical system and said third imaging optical system, and wherein $3.5<|\beta 1 \cdot \beta 2|/NAo<20$ is met, where $\beta 1$ is a paraxial magnification of said first imaging optical system, $\beta 2$ is a paraxial magnification of said second imaging optical system, and NAo is a numerical aperture of said projection optical system at a side of the first object.

An exposure apparatus of one aspect according to the present invention includes an illumination optical system for illuminating a first object using light from a light source, and the above projection optical system for projecting an image on the first object onto a second object.

A device fabrication method of another aspect according to the present invention includes the steps of exposing the second object using the above exposure apparatus, and developing the exposed second object.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Figure 1:
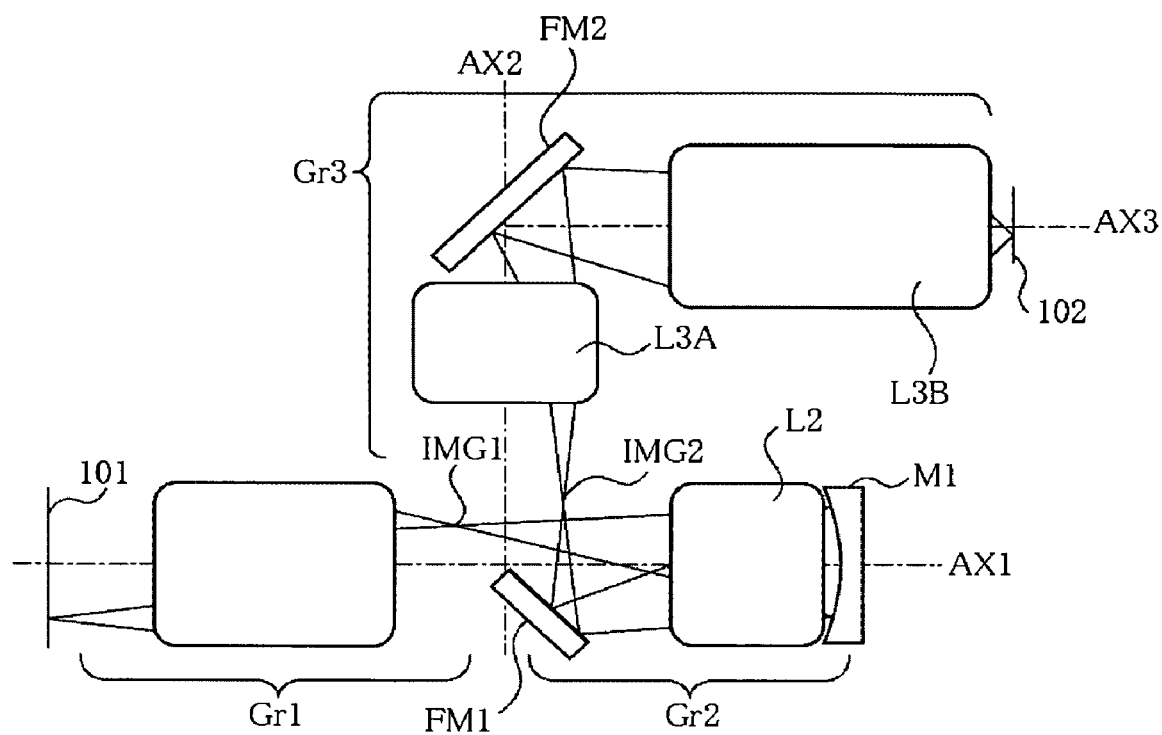
FIG. 1 is a schematic structure of a catadioptric projection optical system according to the present invention.

A description will now be given of a catadioptric projection optical system of one aspect according to the present invention, with reference to the accompanying drawings. However, the present invention is not limited to these preferred embodiments, and each element may be replaced within sprit and objects of the present invention. Although laser is applied as a light source, the light source is not limited to a laser but may use lamps such as a mercury lamp and a xenon lamp. In each figure, the same reference numerals are designated by the same elements and a duplicate description thereof will be omitted. FIG. 1 is a schematic view of a catadioptric projection optical system according to an aspect of the present invention. 101 denotes a first object (e.g., a reticle) and 102 a second object (e.g., a wafer). AX1 to AX3 are optical axes of optical systems, which include, in order of light traveling from the object side, a first imaging optical system Gr1, a second imaging optical system Gr2, and a third imaging optical system Gr3. The first imaging optical system Gr1 forms an image of the first object 101 (a first intermediate image IMG1). The light from the first intermediate image then forms a second intermediate image IMG2 with the second imaging optical system, which includes a concave mirror M1 and a reciprocating optical system part L2. A first deflective reflector FM1 is used to deflect the optical axis AX1 and the light reflected towards the first object 101 by the reciprocating optical system part L2 in the second imaging optical system Gr2. The third imaging optical system Gr3 forms an image of the intermediate image IMG2 onto the second object 102 at a predetermined magnification. A second deflective reflector FM2 included in the third imaging optical system deflects the light reflected by the first deflective reflector FM1. The optical axis AX2 is also deflected to the optical axis AX3 as illustrated.

Thus, a combination between a three-time imaging optical system, and a concave mirror M1 and deflective reflectors FM1 and FM2 in the second imaging optical system Gr2 can deflect light, and avoid interference among the first object 101, a lens, deflective reflectors, etc. In addition, the three-time imaging optical system can provide a projection optical system which reduces an object-image distance, lessens an effective diameter, and images off-axial light without light blockage at the center on the pupil.

The second imaging optical system Gr2 includes a concave mirror M1, and a reciprocating optical system part (L2 in the figure) for reciprocating the light. The concave mirror M1 and the first imaging optical system Gr1 are aligned with the same straight optical axis AX1, and its concave surface is arranged opposite to a reticle surface. The light reflected on the concave mirror M1 in this second imaging optical system Gr2 passes through the reciprocating optical system part L2 in the second imaging optical system Gr2, and then the first deflective reflector deflects the optical axis AX1 by 90° to AX2. The deflective reflector is arranged at a predetermined angle with the optical axis so that the light from the first imaging optical system to the concave mirror intersects with the light reflected from the concave mirror and then the deflective reflector. The light reflected on the first deflective reflector FM1 is deflected by 90° from the optical axis AX2 to AX3 by a second deflective reflector FM2 in the third imaging optical system Gr3. Thus, the two deflective reflectors deflect the optical axis twice and the first and second objects 101 and 102 are arranged parallel. Thus, the first and second deflective reflectors in FIG. 1 are arranged to form a relative angle difference of 90° between their reflective surfaces. While FIG. 1 shows how light from an off-axial object point of the first object 101 is imaged on the second object 102, the present invention uses light in a certain range of off-axial object points apart from the first object's optical axis AX1. A pattern of a rectangular or arc slit area that does not include an optical axis (an exposure area) on the first object's surface is exposed onto the second object 102.

The first imaging optical system Gr1 has a negative focal length and at least one lens. The second imaging optical system Gr2 has a positive focal length, at least one lens and a concave mirror M1. The third imaging optical system Gr3 has a negative focal length and at least one lens. The second imaging optical system's concave mirror M1 and lens correct chromatic aberrations and a positive Petzval sum generated by the first and third imaging optical system Gr1 and Gr3.

The instant embodiment of the present invention sets, but does not limit, the focal lengths of the first, second and third imaging optical systems Gr1, Gr2 and Gr3 to be negative, positive and negative, respectively. The first to third imaging optical systems may have negative, positive, or infinite focal lengths. In other words, all three combinations of (negative, positive, and infinite) focal lengths are applicable to the first to third imaging optical systems.

Preferably, the following conditional expression is met:

$$0.70 < |\beta 1 \cdot \beta 2| < 3.0 \tag{1}$$

where $\beta 1$ is a paraxial imaging magnification of the first imaging optical system Gr1, and $\beta 2$ is that of the second imaging optical system Gr2.

If a value is lower than the lower limit in the conditional expression (1), a combined magnification of the first and second imaging optical system Gr1 and Gr2 becomes too small, undesirably resulting in the following states: (A) When light reflected at the deflective reflector FM1 and travels towards the third imaging optical system Gr3, and light that enters the second imaging optical system Gr2 from the first imaging optical system Gr1 becomes inseparable, an optical system cannot be configured. (B) The paraxial magnification β2 of the second imaging optical system is an excessively small reduction magnification. The reciprocating optical system part particularly includes large asymmetrical aberrations, which deteriorates the imaging performance. (C) An optical system having an especially high NA excessively enlarges an incident angle range of light that enters a deflective reflector used for the purpose of deflection. This is because the first and second imaging optical systems bear a substantial part of the reduction magnification, the spreading of the light from the first object, i.e., the object-side NA becomes higher by the reduction magnifications of the first and second imaging optical systems. This leads to a large incident angle range of the light entering the first deflective reflector, and a reflective coating of the deflective reflector causes a large difference in reflected light intensity between p-polarized light and s-polarized light. This is remarkable in a catadioptric projection optical system that images multiple times with an NA of 0.8 or higher, particularly, 0.85 or higher.

On the other hand, if a value exceeds the upper limit in the conditional expression (1), a combined magnification of the first and second imaging optical systems becomes too large. When the first object 101 is reduced and projected onto the second object, an absolute value of a paraxial imaging magnification β3 of the third imaging optical system Gr3 becomes too small, and it becomes difficult to correct aberrations. Moreover, a lens near the second intermediate image IMG2 has an excessively large effective diameter.

More preferably, the following conditional expression is met:

$$0.8<|\beta 1 \cdot \beta 2|<2.0 \tag{2}$$

Preferably, the following conditional expressions are met:

$$0.70<|\beta 1|<2.0 \tag{3}$$

$$0.70<|\beta 2|<2.0 \tag{4}$$

If a value is below the lower limit of the conditional expression (3), the first imaging optical system Gr1 has an excessively large imaging (or reduced) magnification β1. The light near the first intermediate image IMG1 as an image of the first object 101 interferes with the deflective reflector FM1, and the light is shielded consequently. If a value exceeds the upper limit, the first intermediate image IMG1 becomes too large, a lens near the first intermediate image IMG1 has an excessively large effective diameter, and other imaging optical systems Gr2 and Gr3 undesirably have difficulties in magnification control. When the conditional expression (4) is not met, a magnification greatly differs from the actual size, and significant asymmetry caused by a strong power of the reciprocating optical system in the second imaging optical system Gr2 complicates corrections to asymmetrical aberrations.

More preferably, the following conditional expressions are met:

$$0.80<|\beta 1|<1.5 \tag{5}$$

$$0.80<|\beta 2|<1.5 \tag{6}$$

The conditional expressions (5) and (6) are to properly assign magnification burdens to the first to third imaging optical systems, and to provide an optical system with a smaller effective diameter and better performance. If a magnification β1 of the first imaging optical system is more than actual size, it becomes easier to separate the light from the first deflective reflector FM1 and the light from the first imaging optical system Gr1 with a minimum view angle. As a result, there is an advantage that the maximum view angle can be lowered.

A negative Petzval sum generated by a lens group L2 that has a negative refractive power of the reciprocating optical system part in the second imaging optical system Gr2 and the concave mirror M1 can cancel out a positive Petzval sum generated by the refractive optical system parts of the first and third imaging optical systems Gr1 and Gr3. Preferably, the following conditions are met:

$$P1>0, P2<0 \text{ and } P3>0 \tag{7}$$

where P1, P2 and P3 are Petzval sums of the first, second and third imaging optical systems.

The above conditions enable an imaging optical system with a concave mirror M1 and a reciprocating optical system part L2 to be arranged as a second imaging optical system to achieve an imaging optical system with a small curvature field. If the conditional expressions (7) are not met, the concave mirror M1 and reciprocating optical system part L2 will be arranged as a first or third imaging optical system. The former causes the light reflected from the concave mirror M1 to return around the first object 101, and result in physical interference among the first object (e.g., a reticle), returning light, and a nearby lens, thus complicating a mechanical structure. The latter will use a concave mirror M1 for the final imaging system (or the third imaging optical system), complicating light separation with a high NA.

The configuration shown in FIG. 1 preferably meets the following conditional expression:

$$0.2<(\phi Gr2\_max+\phi L3B\_max)/(2Y)<0.9 \tag{8}$$

where Y is a distance between the optical axes AX1 and AX3, φGr2__max is the maximum effective diameter in a second imaging optical system Gr2, and φL3B__max is the maximum effective diameter in a lens group L3B located between a second deflective reflector FM2 in the third imaging optical system Gr3 and the second object 102. A value below the lower limit of the conditional expression (8) excessively separates the optical axes AX1 and AX3 from each other, and excessively enlarges an effective diameter of the third imaging optical system Gr3. A value exceeding the upper limit arranges the optical axes AX1 and AX3 too closely and causes interference among a lens or a concave mirror M1 of the second imaging optical system Gr2 and a lens group L3B in the third imaging optical system Gr3, complicating a structure of a lens barrel.

Preferably, the following conditional expression is met:

$$-0.10<hM1/\phi M1<0.10 \tag{9}$$

where φM1 is an effective diameter of the concave mirror M1, and hM1 is a height of the most off-axial principal ray from the optical axis AX1 in the concave mirror M1.

Thus, an arrangement of the concave mirror M1 of the second imaging optical system near the pupil can avoid astigmatism, etc.

The inventive catadioptric optical system includes at least one deflective reflector. When it includes two deflective reflectors, it is preferable that one is included in the second imaging optical system Gr2 and one in the third imaging optical system Gr3. It is preferable that they are arranged such that the light from the first imaging optical system Gr1 is reflected at a concave mirror M1 after entering the second imaging optical system Gr2, and then reflected at the first deflective reflector. In other words, the light from the first object 101 forms a first intermediate IMG1 by the first imaging optical system Gr1, and then enters the reciprocating optical system part L2 in the second imaging optical system Gr2. Then, the light is reflected on the concave mirror M1, reenters L2, and is reflected by the first deflective reflector after exited from L2.

If a deflective reflector is arranged near a first intermediate image IMG1 which the light from the first imaging optical system Gr1 forms before entering the second imaging optical system Gr2, a concave mirror M1 cannot be arranged in parallel to the first object 101. Then, if a gravity direction is aligned with an optical axis AX1, self-weight deformations occur in the reciprocating optical system L2 and the concave mirror M1 that has a strong refractive power, or forces from a lens-barrel and the like deteriorate imaging performance. Two deflective reflectors may be included in the third imaging optical system Gr3, and the first deflective reflector FM1 will be arranged right after the second imaging optical system Gr2 forms an intermediate image IM2, or via an intervening lens.

A second deflective reflector FM2 is arranged somewhere in the space where the light reflected by the first deflective reflector FM1 reaches the second object. In such a case, it is preferable, but not mandatory, to provide at least one lens (desirably one having a positive refractive power) between the first and second deflective reflectors FM1 and FM2 for a reduced size of the deflective reflector.

As shown in FIG. 1, for the light that forms the first intermediate image IMG1 and then enters the reciprocating optical system part L2 of the second imaging optical system Gr2, no lens is preferably provided between them, i.e., IMG1 and L2. Any lens provided other than the reciprocating optical system part L2 after the first intermediate image will possibly interfere with the deflective reflector FM1 and complicate their configuration, unless there is a feasible mechanical structure.

The second imaging optical system Gr2 includes a reciprocating optical system part L2. L2 has a negative refractive power and includes at least one dioptric lens having a negative refractive power. Preferably, this second imaging optical system Gr2 is equipped with at least one lens (preferably two) that have a concave surface directed to the first object 101 and a negative refractive power. The reciprocating optical system part L2 preferably includes at least one aspheric lens. Unless the aspheric surface is used, more than one lens are preferably used for the reciprocating optical system part L1 to share the power. Even if an aspheric surface is used, it is naturally possible to better control aberrations in the reciprocating optical system part using more than one lens. The concave mirror may have an aspheric surface.

The second imaging optical system may include at least one lens on top of the reciprocating optical system part L2 and the concave mirror M1. More specifically, a second intermediate image IMG2 exists between the first and second deflective reflectors FM1 and FM2, and a lens exists between the first deflective reflector FM1 and the second intermediate image IMG2. This configuration can reduce an effective diameter of a lens near the second intermediate image IMG2.

The third imaging optical system Gr3 includes a lens group L3A with at least one refractor and a positive refractive power and a lens group L3B with at least one refractor and a positive refractive power, and forms a second intermediate IMG2 on the second object 102. The lens group L3B may have a lens group with negative refractive power. By arranging a second deflective reflector between the lens groups L3A and L3B, the first and second objects 101 and 102 can be arranged parallel to each other. Naturally the second deflective reflector may be arranged between the second intermediate image IMG2 and the lens group L3A.

The deflective reflector includes a deflective mirror. It does not matter whether the shape of the mirror is a flat shape or part of a cubic shape. It may be a mirror using reflections on a rear surface of the glass. It may use the light splitter to use light from the on-axis to the off-axis.

As arranged in FIG. 1, the first deflective reflector is preferably arranged at a predetermined angle with the optical axis so that the light from the first imaging optical system Gr1 to the concave mirror M1 and the light that is reflected from the concave mirror M1 at the first deflective reflector may intersect each other. Such an arrangement reduces an incident angle of the principal ray entering the first deflective reflector FM1, and a maximum angle incident upon the first deflective reflector FM1. Preferably the following conditional expression is met:

$$20°<\theta p<45 \quad (10)$$

where θp is an angle between the principal ray from the off-axis of the first object and a normal of the first deflective reflector FM1's reflecting surface. The value below the lower limit of the conditional expression (10) excessively reduces an angle made by the normal of the deflective reflector's reflecting surface and the principal ray, and excessively enlarges the deflective reflector or results in too strong refractive power of a nearby lens to maintain the performance. The value exceeding the upper limit excessively enlarges an angle of a ray incident upon the deflective reflector, and deteriorates coating properties, as discussed. More preferably, the following expression is met:

$$30°<\theta p<44° \quad (11)$$

Figure 7:
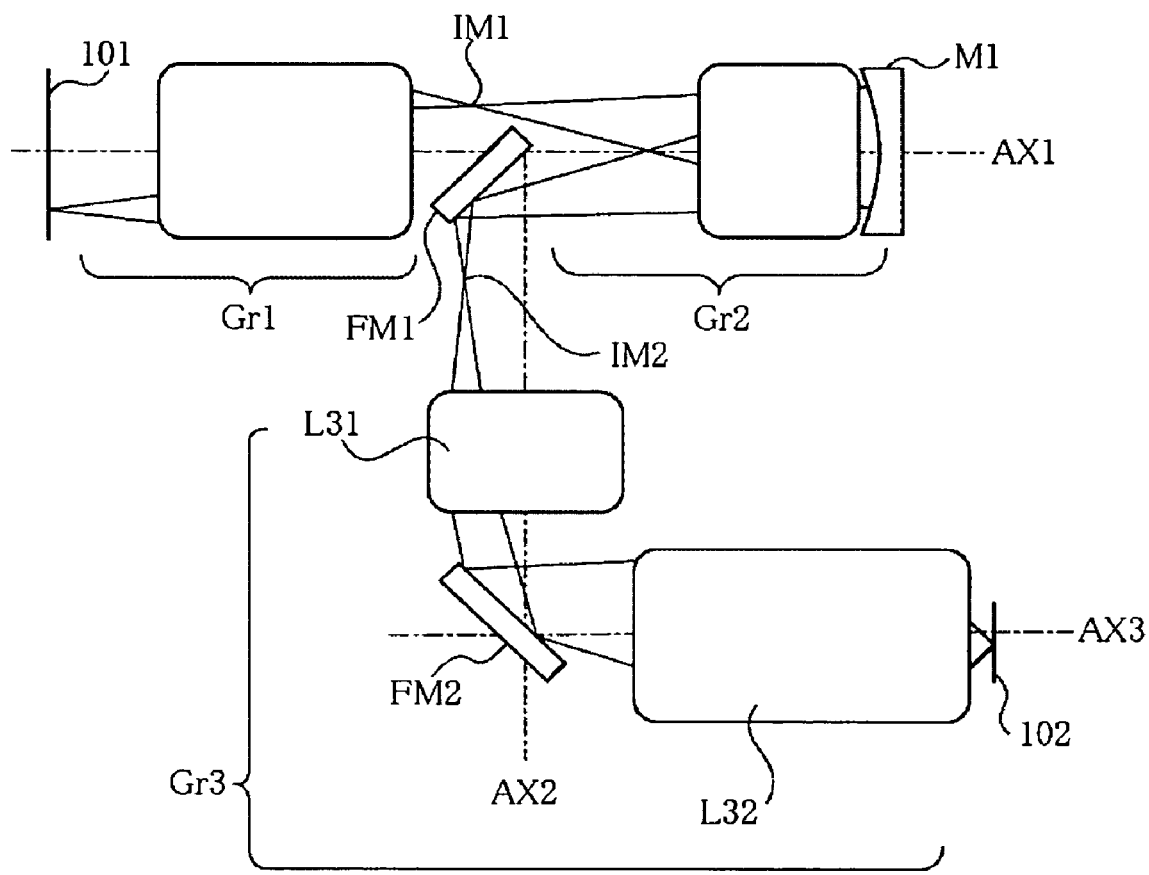
FIG. 7 is a schematic structure of a catadioptric projection optical system of another embodiment according to the present invention.

The first deflective reflector is arranged without an intersection between an optical path exiting from the first imaging optical system Gr1 and going to the concave mirror M1 and an optical path that reflects at the first deflective reflector and goes to the second deflective reflector, e.g., as shown in FIG. 7.

Figure 8:
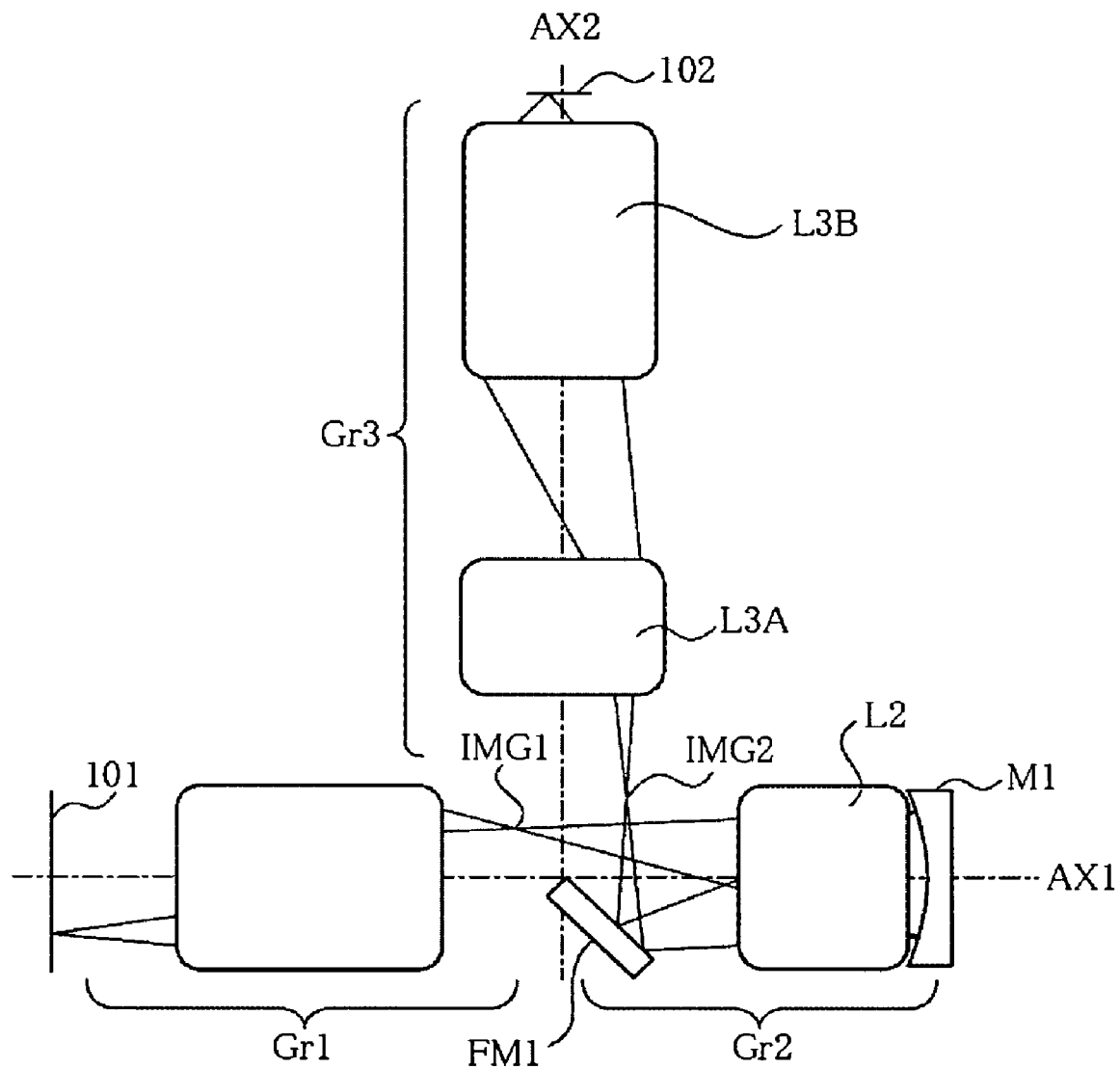
FIG. 8 is a schematic structure of a catadioptric projection optical system of another embodiment according to the present invention.

Preferably, the first and second objects 101 and 102 are arranged, but not limited to, parallel. As shown in FIG. 8, an optical system may be constructed without a deflective reflector FM2.

An aperture stop 103 may be arranged in the lens group L3B in the third imaging optical system Gr3. It may also be arranged in combination or singly near the place where a principal ray of the first imaging optical system Gr1 intersects optical axis AX1.

Figure 2:
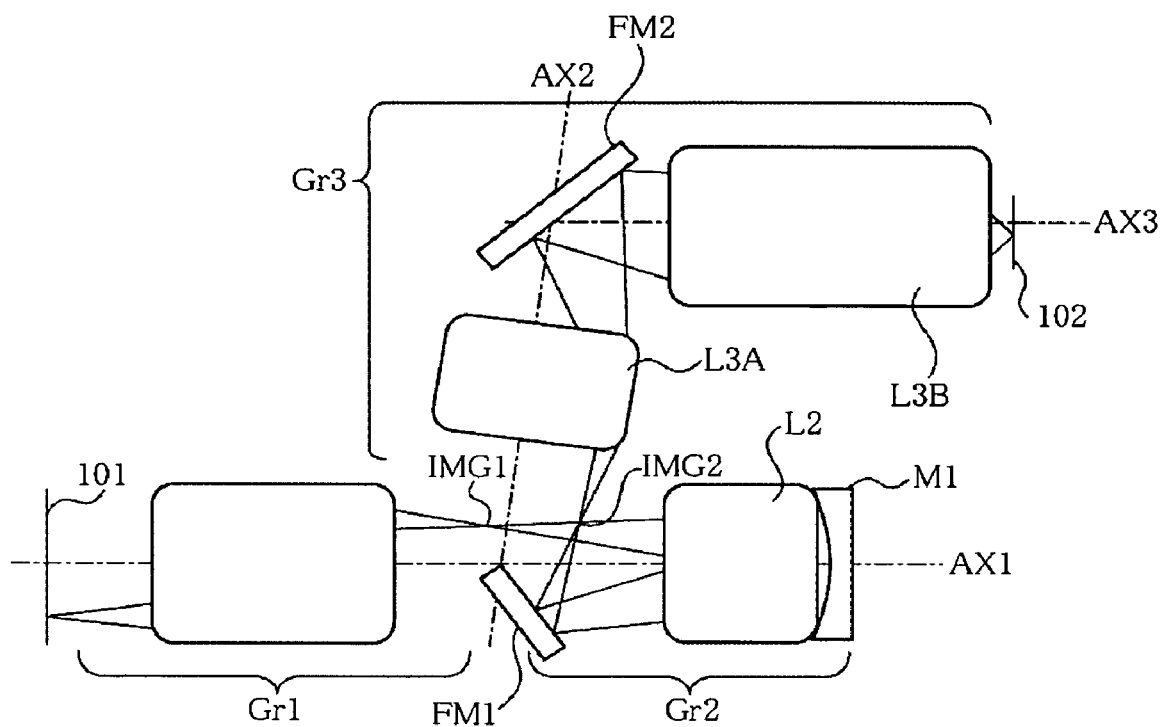
FIG. 2 is a schematic structure of a catadioptric projection optical system of another embodiment according to the present invention.

In FIG. 1, the optical axes AX1 and AX2, and the optical axes AX2 and AX3 are arranged orthogonally. However, as shown in FIG. 2, it is not necessary for the optical axes AX1 through AX3 to be arranged orthogonally. Preferably, the deflective reflectors FM1 and FM2 are arranged such that their reflective surfaces have an angular difference of 90°. This is because if they are relatively arranged with an angular difference of 90°, the first and second objects 101 and 102 can be arranged in parallel. However, if the first and second objects 101 and 102 need not be arranged in parallel, an arbitrary angle may be used in addition to 90°.

Preferably, at least an image-surface side is made telecentric for reduced changes in magnification when the surface of the second object fluctuates in the optical-axis direction. The inventive imaging optical system is especially effective with a high NA of 0.8 or higher, particularly, 0.85 or higher.

The inventive optical system may include an aberration correction mechanism. For example, it may have a (lens decentering) mechanism in the first imaging optical system that moves a lens in the optical-axis direction and/or in a direction perpendicular to the optical axis or in other directions. A similar mechanism is also applicable to the second and third imaging optical systems. A mechanism that transforms the concave mirror M1 may be provided to correct aberrations.

Liquid can fill a gap between a surface of the second object 102 and a final glass surface of the optical system (between the surface of the second object 102 and the lens L326 in FIG. 3 below) for a so-called immersion structure.

A field stop may be provided near the intermediate images IMG1 and IMG2. A field stop may also be provided near the surface of the second object 102. When a diffraction optical element is used for the optical system, and the second object surface and its neighborhood use the above immersion structure, a view-field limiting stop provided to a final glass surface on the optical system and a neighboring field stop (e.g., between the final glass surface and the surface of the second object 102) will prevent flare light etc., which are and are not generated from the diffraction optical element, from arriving at the second object surface.

The second object surface may have an immersion structure without employing a diffraction optical element in the optical system. In building an immersion optical system, whether or not a diffraction optical element is present, an axial interval between the final surface of the optical system and the surface of the second object 102 is preferably 5 mm or less, more preferably 1 mm or less, to minimize influences by liquid properties etc. on the imaging performance of the optical system.

A description will now be given of various embodiments according to the present invention.

First Embodiment

Figure 3:
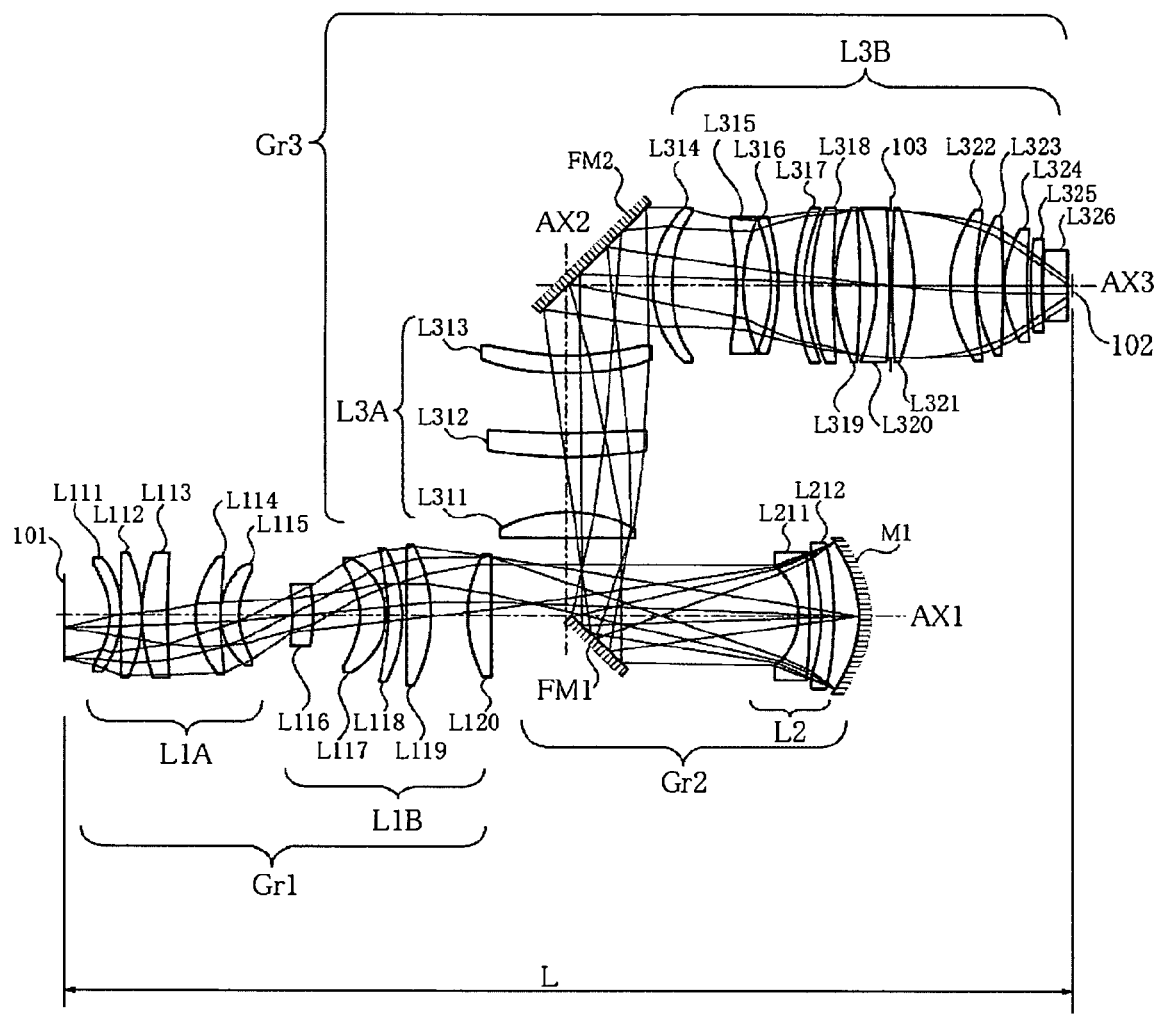
FIG. 3 is an optical-path diagram showing a catadioptric projection optical system of a first embodiment according to the present invention.

FIG. 3 shows a specific structure of a projection optical system of a first embodiment according to the present invention. This projection optical system projects a pattern on a first object (original picture having a pattern drawn on a reticle, mask, etc.) onto a second object surface, and includes first, second and third imaging optical systems. Although the first embodiment relates to a projection optical system, the present invention is not limited to this application but is applicable to optical equipments having the instant projection optical system, and an exposure apparatus. It also applies to a device fabrication method that uses an exposure apparatus which includes a projection optical system according to the instant embodiment.

The first imaging optical system shown in FIG. 3 includes, in order from the first object side, a dioptric lens group L1A having a positive refractive power and a dioptric lens group L1B having a positive refractive power. The lens group L1A having a positive refractive power includes, along the light traveling direction from the side of the first object 101, a meniscus negative lens L111 with its concave surface oriented toward the first object side, an approximately planoconvex aspheric positive lens L112 with its approximately flat surface oriented toward the first object side, an approximately planoconvex positive lens L113 with its approximately convex surface oriented toward the first object side, and two meniscus positive lenses L114 and L115 with their concave surfaces oriented toward the first object side. The dioptric lens group L1B having a positive refractive power includes a meniscus aspheric negative lens L116 with its concave surface oriented toward the first object side, two meniscus positive lenses L117 and L118 with their concave surfaces oriented toward the first object side, an approximately planoconvex positive lens L119 with its approximately flat surface oriented toward the first object side, and an approximately planoconvex aspheric positive lens L120 with its convex surface oriented toward the first object side.

The second imaging optical system Gr2 includes, along the light traveling direction from the first imaging optical system, a reciprocating optical system part L2 having a negative refractive power and a concave mirror M1. It includes, in order from the first object side, an approximately planoconcave lens L211 with its concave surface oriented toward the first object side, a meniscus aspheric lens L212 with its concave surface oriented toward the first object side, and a concave mirror M1 with its concave surface oriented toward the first object side.

The light from the first imaging optical system Gr1 enters the reciprocating optical system part L2 is reflected at the concave mirror M1, and reenters the reciprocating optical system. Then, a deflective reflector FM1 deflects the optical axis AX1 to the optical axis AX2 by 90°. The light is also reflected, and the second intermediate image IMG2 is formed. The deflective reflector FM1 is arranged between the second and third imaging optical systems. Preferably, as in the instant embodiment, it is arranged between the second intermediate image IMG2 and the reciprocating optical system part L2. In the instant embodiment, the deflective reflector uses a flat mirror.

The third imaging optical system Gr3 includes a dioptric lens group L3A having a positive refractive power and a dioptric lens group L3B having a positive refractive power. The dioptric lens group L3A having a positive refractive power includes, along a direction of light traveling from the second imaging optical system Gr2, an approximately planoconvex aspheric positive lens L311 with its approximately flat surface oriented toward the second intermediate image IMG2, and two meniscus positive lenses L312 and L313 with their convex surfaces oriented toward the second intermediate image IMG2. The dioptric lens group L3B having a positive refractive power includes a meniscus positive lens L314 with its concave surface oriented toward the side of the second object 102, a biconvex aspheric negative lens L315, a meniscus negative lens L316 with its convex surface oriented toward the second object side, a meniscus aspheric negative lens L317 with its concave surface oriented toward the second object side, a meniscus positive lens L318 with its convex surface oriented toward a side opposite to the second object side, an approximately planoconvex aspheric positive lens L319 with its approximately flat surface oriented toward the second object side, a meniscus negative lens L320 with its concave surface oriented toward a side opposite to the second object side, an aperture stop 103, a biconvex aspheric positive lens L321, a meniscus positive lens L322 with its concave surface oriented toward the second object side, an approximately planoconvex aspheric positive lens L323 with its approximately flat surface oriented toward the second object side, a meniscus aspheric positive lens L324 with its concave surface oriented toward the second object side, a meniscus negative lens L325 with its concave surface oriented toward the second object side, and a planoconvex positive lens L326 with its flat surface oriented toward the second object surface.

A second deflective reflector FM2 is arranged between the dioptric lens groups L3A and L3B in the third imaging optical system Gr3. The present embodiment makes the deflective reflector FM2 of a plane mirror for deflecting the light reflected from the first deflective reflector in a predetermined direction. The first imaging optical system Gr1 of the instant embodiment includes, but is not limited to, groups L1A and L1B having positive refractive powers. For example, it may include three groups of positive, negative, and positive, four groups of negative, positive, negative, and positive, or another structures. The third imaging optical system Gr3 includes, but is not limited to, an optical arrangement with L3A having a positive refractive power and L3B having a positive refractive power. For example, the group L3B can have a lens group with a negative refractive index or another structure.

The instant embodiment uses a projection magnification of ¼, a reference wavelength of 157 nm, and calcium fluoride as a glass material.

An image-side numerical aperture is NA=0.87. An object-image distance (the first object surface to the second object surface) is L=1483 mm. An aberration-corrected object point in a range of about 4.25 to 16.63 mm secures a rectangular exposure area of at least 26 mm long and 6 mm wide. The aperture stop 103 is located between L320 and L321.

Figure 5:
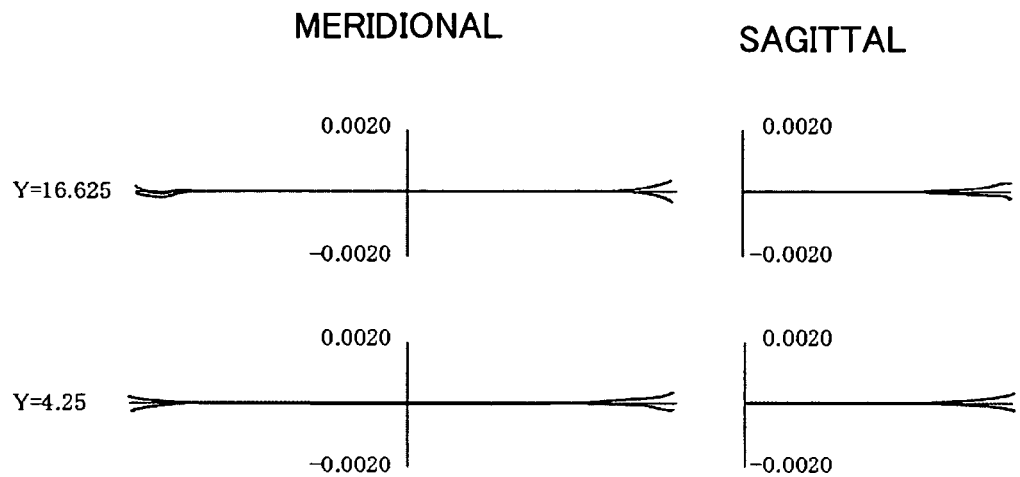
FIG. 5 is an aberrational diagram of the first embodiment according to the present invention.

FIG. 5 shows a lateral aberration diagram of the instant embodiment. The part with Y=4.25 in FIG. 5 shows a lateral aberration diagram for light from an off-axis area that has an image point of 4.25 mm in the second object. On the other hand, the part with Y=16.625 shows a lateral aberration diagram for light from an off-axis area that has an image point of 16.625 mm in the first object. FIG. 5 shows a wavelength with a reference wavelength of 157.6 nm±0.6 pm. Understandably, monochrome and chromatic aberrations are satisfactorily corrected.

While the instant embodiment uses only calcium fluoride as a glass material, other glass materials such as barium calcium fluoride, magnesium calcium fluoride, and the like may be used in combination or singularly. When used for a 193 nm wavelength (ArF), quartz and calcium fluoride may be used together, or just quartz may be used to structure a lens group. Other glass materials may also be used.

The following Tables 1 and 2 show the specification of the numerical example of the first embodiment. "i" in the table is a surface number along a direction of light traveling from the first object 101. "ri" is a radius of curvature for each surface corresponding to a surface number. "di" is a surface spacing of each surface. A lens glass material $CaF_2$ has a refractive index to a reference wavelength $\lambda$=157.6 nm is 1.56. The refractive indexes of the wavelengths of +0.6 pm and −0.6 pm for the reference wavelength are, 1.55999853 and 1.560000147, respectively. A shape of an aspheric surface is given by the following equation:

$$X=(H^2/4)/(1+((1-(1+k)\cdot(H/ri)^2))^{1/2})+AH^4+BH^6+CH^8+DH^{10}+EH^{12}+FH^{14}+GH^{16}$$

where X is a displacement in a direction of an optical axis from the lens top, H is a distance from the optical axis, ri is a radius of curvature, k is a conical constant; and A, B, C, D, E, F, and G are aspheric coefficients.

TABLE 1

L = 1483 mm
$\beta$ = ¼
NA = 0.87
| $\beta$1 · $\beta$2 | = 0.9865
| $\beta$1 | = 1.07617
| $\beta$2 | = 0.91667
P1 = 0.00863
P2 = −0.01853
P3 = 0.009090
($\phi$Gr2__max + $\phi$L3B__max)/(2Y) = 0.455
hM1/$\phi$M1 = 0.0054
$\theta$p = 34.88~42.49
| ($\beta$1 · $\beta$2) |/NAo = 4.5356
DISTANCE FROM FIRST OBJECT~FIRST
SURFACE: 66.66724 mm

| i | ri | di | GLASS MATERIAL | |
|---|---|---|---|---|
| 1 | −133.68441 | 16.49220 | CaF2 | |
| 2 | −176.86097 | 1.00000 | | |
| 3 | 40152.36742 | 28.38830 | CaF2 | |
| 4 | −262.56998 | 1.00000 | | |
| 5 | 304.18133 | 38.71080 | CaF2 | |
| 6 | 2595.91853 | 43.36240 | | |
| 7 | 149.86892 | 35.35540 | CaF2 | |
| 8 | 725.36362 | 1.00000 | | |
| 9 | 111.60486 | 30.55120 | CaF2 | |
| 10 | 225.57909 | 75.77320 | | |
| 11 | −145.37235 | 26.78880 | CaF2 | |
| 12 | −347.84702 | 72.33700 | | |
| 13 | −155.23428 | 37.05130 | CaF2 | |
| 14 | −104.28935 | 3.57190 | | |
| 15 | −384.20581 | 20.14790 | CaF2 | |
| 16 | −226.11861 | 9.26860 | | |
| 17 | −6486.16517 | 34.92780 | CaF2 | |
| 18 | −233.44088 | 54.94260 | | |
| 19 | 221.14856 | 28.55640 | CaF2 | |
| 20 | 3567.56703 | 453.80150 | | |
| 21 | −107.26122 | 16.10000 | CaF2 | |
| 22 | −1408.82289 | 21.22160 | | |
| 23 | −245.17249 | 17.50000 | CaF2 | |
| 24 | −560.51161 | 37.94820 | | |
| 25 | −186.91693 | −37.94820 | | M1 |
| 26 | −560.51161 | −17.50000 | CaF2 | |
| 27 | −245.17249 | −21.22160 | | |
| 28 | −1408.82289 | −16.10000 | CaF2 | |
| 29 | −107.26122 | −341.56400 | | |
| 30 | 0.00000 | 118.87660 | | FM1 |
| 31 | 28269.67935 | 37.29510 | CaF2 | |
| 32 | −260.69754 | 85.64520 | | |
| 33 | 603.70825 | 38.72560 | CaF2 | |
| 34 | 1550.78416 | 88.22850 | | |
| 35 | 323.96085 | 28.40410 | CaF2 | |
| 36 | 467.10275 | 107.50000 | | |
| 37 | 0.00000 | −127.50000 | | FM2 |
| 38 | −166.20000 | −27.88780 | CaF2 | |
| 39 | −222.01681 | −94.89530 | | |
| 40 | 671.87167 | −12.00000 | CaF2 | |

TABLE 2

| i | ri | di | GLASS MATERIAL |
|---|---|---|---|
| 41 | −327.37247 | −38.89890 | |
| 42 | 292.12997 | −12.00000 | CaF2 |
| 43 | 332.22311 | −23.57750 | |
| 44 | −288.75199 | −15.00000 | CaF2 |
| 45 | −283.66214 | −10.39550 | |
| 46 | −328.80134 | −31.77170 | CaF2 |
| 47 | −911.33723 | −1.11640 | |
| 48 | −280.71048 | −36.65500 | CaF2 |
| 49 | 10234.62621 | −25.47160 | |
| 50 | 312.01876 | −20.00000 | CaF2 |
| 51 | 1519.79239 | −1.00000 | |
| 52 | 0.00000 | −0.50000 | APERTURE STOP |
| 53 | −883.83306 | −34.16110 | CaF2 |
| 54 | 294.26570 | −51.76030 | |
| 55 | −185.02976 | −37.03720 | CaF2 |
| 56 | −456.62551 | −2.12680 | |
| 57 | −169.81101 | −40.00000 | CaF2 |
| 58 | 3315.28275 | −1.64120 | |
| 59 | −150.38112 | −31.00690 | CaF2 |
| 60 | −573.81669 | −7.72630 | |
| 61 | −485.70987 | −15.04150 | CaF2 |
| 62 | −451.90906 | −1.27210 | |
| 63 | −285.56465 | −35.98810 | CaF2 |
| 64 | 0.00000 | −8.65340 | | aspherical surfaces

| i | K | A | B | C |
|---|---|---|---|---|
| 4 | 1.961540E+00 | 1.404161E−08 | 8.030221E−13 | 3.806993E−17 |
| 11 | 2.103299E−01 | 5.048392E−08 | 6.467869E−11 | 8.462532E−15 |
| 19 | 8.005109E−01 | −1.715298E−08 | −3.758478E−13 | −8.165751E−18 |
| 23 | −4.415435E−02 | 3.999345E−08 | 5.826131E−13 | −6.218149E−17 |
| 27 | −4.415435E−02 | 3.999345E−08 | 5.826131E−13 | −6.218149E−17 |
| 32 | −4.487673E−01 | 8.587036E−10 | 1.706931E−14 | −2.068700E−18 |
| 41 | 1.622021E+00 | −2.827005E−08 | 3.130594E−13 | −1.951319E−17 |
| 45 | 8.322689E−01 | −1.346285E−08 | −1.417753E−12 | 7.110990E−17 |
| 48 | 8.868436E−01 | −4.598919E−09 | −1.235447E−12 | 2.868212E−17 |
| 54 | −1.193684E+00 | −2.750081E−08 | −1.844248E−13 | 8.570097E−18 |
| 57 | −2.577368E−01 | 1.000440E−08 | 1.927015E−12 | −9.095342E−18 |
| 60 | 8.979579E−01 | −7.499728E−09 | −3.707694E−12 | 7.810330E−16 |

| i | D | E | F | G |
|---|---|---|---|---|
| 4 | −4.176179E−21 | 6.584084E−25 | −4.401956E−29 | 1.324219E−33 |
| 11 | −2.133698E−17 | 1.769683E−20 | −7.986914E−24 | 1.416960E−27 |
| 19 | −4.811791E−22 | 2.941307E−26 | −2.562396E−30 | 5.352903E−35 |
| 23 | −3.118791E−22 | 4.394162E−25 | −5.781790E−29 | 2.265698E−33 |
| 27 | −3.118791E−22 | 4.394162E−25 | −5.781790E−29 | 2.265698E−33 |
| 32 | 3.167229E−22 | −2.830102E−26 | 1.343394E−30 | −2.715699E−35 |
| 41 | −1.706913E−23 | 1.167358E−25 | 1.010568E−30 | 3.276339E−35 |
| 45 | 2.559912E−21 | −2.119161E−25 | 8.637876E−30 | −3.958428E−34 |
| 48 | 4.806642E−21 | −3.256858E−25 | 1.227283E−29 | −9.230396E−35 |
| 54 | 4.340422E−22 | −5.867972E−26 | 1.136109E−29 | −4.445214E−34 |
| 57 | 6.646700E−21 | −3.779579E−25 | 1.485480E−29 | −6.678406E−34 |
| 60 | −7.166197E−20 | 2.255733E−24 | 8.825106E−29 | −1.488612E−32 |

Second Embodiment

Figure 4:
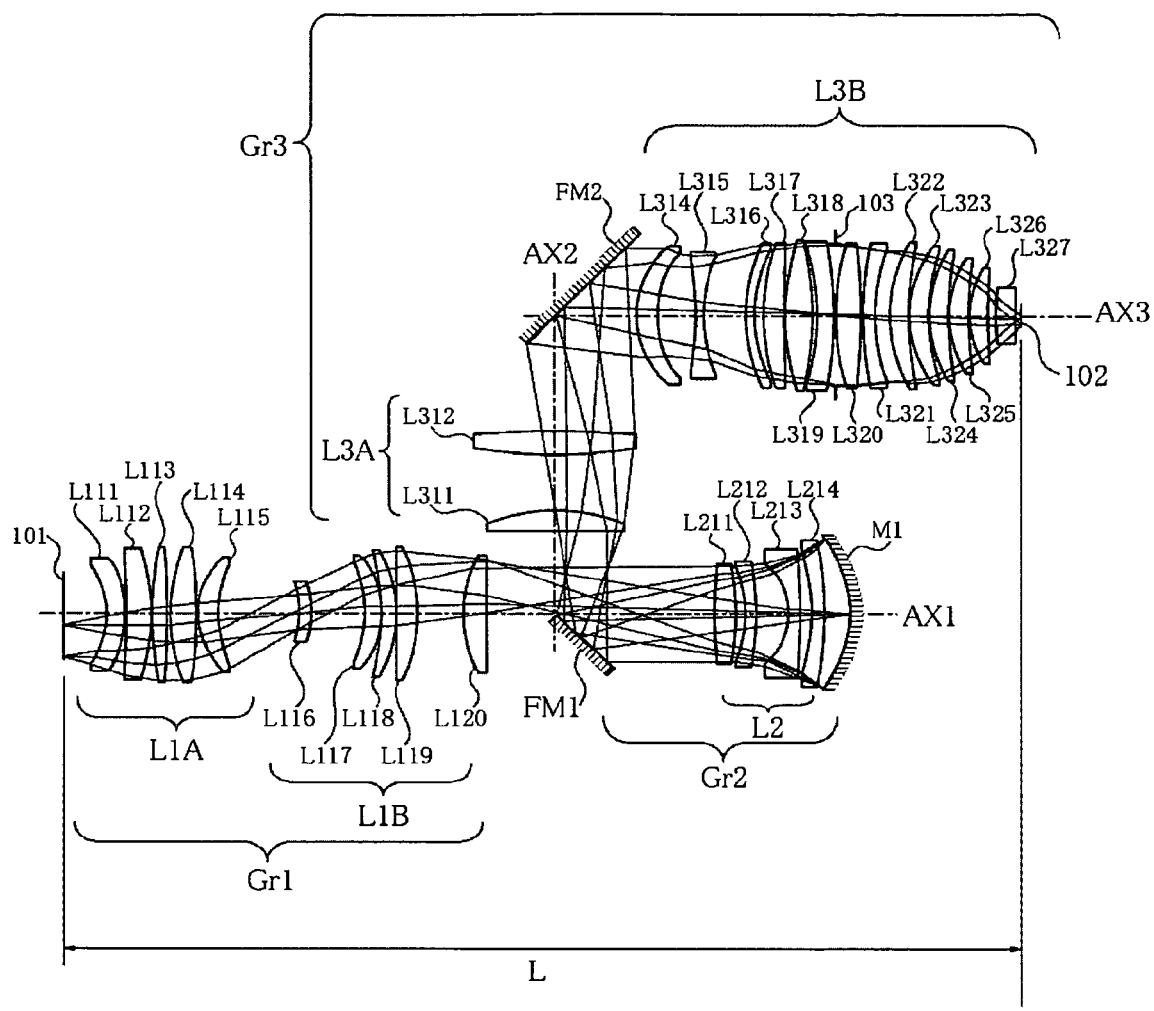
FIG. 4 is an optical-path diagram showing a catadioptric projection optical system of a second embodiment according to the present invention.

FIG. 4 shows a specific lens configuration. The first imaging optical system includes, in order from the first object side, a dioptric lens group L1A having a positive refractive power and a dioptric lens group L1B having a positive refractive power. The dioptric lens group L1A having a positive refractive power includes, along a direction of light traveling from the side of the first object 101, a meniscus negative lens L111 with its concave surface oriented toward the first object, an approximately planoconvex aspheric positive lens L112 with its approximately flat surface oriented toward the first object, an approximately planoconvex positive lens L113 with its convex surface oriented toward the first object, a biconvex positive lens L114, and a meniscus positive lens L115 with its convex surface oriented toward the first object. The lens group L1B having a positive power includes a meniscus aspheric negative lens L116 with its concave surface oriented toward the first object side; three meniscus aspheric positive lens L117, L118, and L119 with their concave surfaces oriented toward the first object side; and an approximately planoconvex aspheric positive lens L120 with its convex surface oriented toward the first object side.

The second imaging optical system Gr2 includes a reciprocating optical system part L2 having a negative refractive power and a concave mirror M1. It includes, along a direction of light traveling from the first imaging optical system Gr1, an approximately planoconvex positive lens L211 with its convex surface oriented toward the concave mirror M1, a meniscus negative lens L212 with its concave surface oriented toward the first object side, an approximately planoconcave lens L213 with its concave surface oriented toward the first object side, a meniscus aspheric lens L214 with its concave surface oriented toward the first object side, and a concave mirror M1 with its concave surface oriented toward the first object side. The light from the first imaging optical system Gr1 enters the reciprocating optical system part L2, then is reflected at the concave mirror M1, and reenters the reciprocating optical system part L2. Then the reflective element FM1 deflects the optical axis AX1 to the optical axis AX2. The light is deflected accordingly and the second intermediate image IMG2 is formed. The deflective reflector FM1 is arranged between the second and third imaging optical systems, but preferably it is arranged between the second intermediate image IMG2 and the reciprocating optical system part L2 as shown in the instant embodiment. The second intermediate image IMG2 may be located between the reciprocating optical system L2 and the deflective reflector FM1. The instant embodiment makes the deflective reflector of a plane mirror.

The third imaging optical system Gr3 includes a dioptric lens group L3A having a positive refractive power and a dioptric lens group L3B having a positive refractive power. The dioptric lens group L3A having a positive refractive power includes, along a direction of light traveling from the second imaging optical system Gr2, an approximately planoconvex aspheric positive lens L311 with its approximately flat surface oriented toward the side of the second intermediate image IMG2, and two meniscus positive lenses, L312 and L313, with their convex surfaces oriented toward the side of the second intermediate image IMG2. The dioptric lens group L3B having a positive refractive power includes a meniscus positive lens L314 with its concave surface oriented toward a side of the second object 102, a biconcave aspheric negative lens L315, a meniscus negative lens L316 with its concave surface oriented toward the second object side, an approximately planoconvex positive lens L317 with its convex surface oriented toward a side opposite to the second object side, a biconvex aspheric positive lens L318, a meniscus negative lens L319 with its concave surface oriented toward a side opposite to the second object side, an aperture stop 103, a biconvex aspheric positive lens L320, a meniscus negative lens L321 with its concave surface oriented toward the second object side, two meniscus aspheric positive lenses L322 and L323 with their concave surfaces oriented toward the second object side, two meniscus aspheric positive lens L324 and L325 with their concave surfaces oriented toward the second object side, a meniscus negative lens L326 with its concave surface oriented toward the second object side, and a planoconvex positive lens L327 with its flat surface oriented toward the second object side. A second deflective reflector FM2 is arranged between the dioptric lens groups L3A and L3B in the third imaging optical system Gr3. The deflective reflector FM2 is a plane mirror in the instant embodiment, and deflects light reflected from the first deflective reflector in a predetermined direction.

While the instant embodiment provides the first imaging optical system Gr1 with lens groups L3A and L3B, it is not limited to that structure. For example, it may have a three-group structure of plus minus and plus, or it may have other structures.

The instant embodiment uses a projection magnification of ¼, a reference wavelength of 157 nm, and calcium fluoride as a glass material. An image-side numerical aperture is NA=0.86. An object-image distance (from the first object surface to the a second object surface) is L=1425 mm. An aberration-corrected object point in a range of about 3.25 to 16.5 mm secures a rectangular exposure area of at least 26 mm long and 6 mm wide. The aperture stop 103 is located between L320 and L321.

Figure 6:
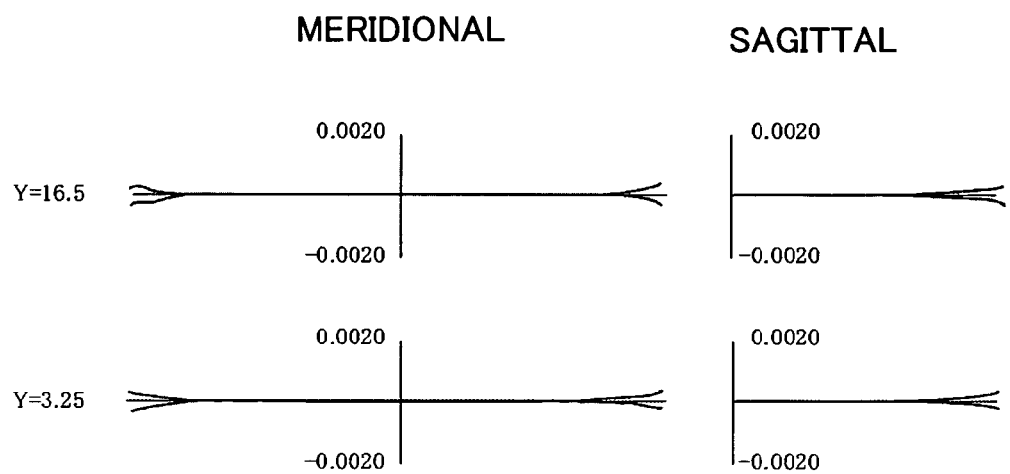
FIG. 6 is an aberrational diagram of the second embodiment according to the present invention.

FIG. 6 shows a view of the lateral aberration of the instant embodiment. The part with Y=3.25 in FIG. 6 shows a lateral aberration diagram for light from an off-axis area that has an image point of 3.25 mm in the second object. On the other hand, the part with Y=16.5 shows a lateral aberration diagram for light from an off-axis area that has an image point of 16.5 mm in the first object. FIG. 6 indicates a reference wavelength of 157.6 nm and a wavelength of ±0.6 pm. Understandably, monochrome and chromatic aberrations are satisfactorily corrected.

The following Tables 3 and 4 show the specification of numerical example of the second embodiment. Symbols in the table are the same as in table 1, and thus a description thereof will be omitted.

TABLE 3

L = 1425 mm
$\beta = ¼$
NA = 0.86
$|\beta 1 \cdot \beta 2| = 0.972$
$|\beta 1| = 1.002$
$|\beta 2| = 0.97$
P1 = 0.00854
P2 = −0.01881
P3 = 0.01027
$(\phi Gr2\_max + \phi L3B\_max)/(2Y) = 0.485$
$hM1/\phi M1 = 0.0009$
$\theta p = 35.43 \sim 43.19$
$|(\beta 1 \cdot \beta 2)|/NAo = 4.5209$
DISTANCE FROM FIRST OBJECT~FIRST SURFACE: 66.47419 mm

| i | ri | di | GLASS MATERIAL |
|---|---|---|---|
| 1 | −129.17614 | 24.3969 | CaF2 |
| 2 | −213.72493 | 1.0000 | |
| 3 | 17365.08332 | 39.9991 | CaF2 |
| 4 | −282.45825 | 1.0000 | |
| 5 | 616.79913 | 21.0500 | CaF2 |
| 6 | −2051.41465 | 7.3520 | |
| 7 | 289.03662 | 38.6851 | CaF2 |
| 8 | −605.30585 | 1.0000 | |
| 9 | 114.03499 | 32.1762 | CaF2 |
| 10 | 194.16463 | 122.3254 | |
| 11 | −130.03729 | 16.9217 | CaF2 |
| 12 | −171.79452 | 77.2284 | |
| 13 | −201.88977 | 27.2402 | CaF2 |
| 14 | −125.00721 | 1.0062 | |
| 15 | −417.78802 | 24.8673 | CaF2 |
| 16 | −189.96485 | 1.0000 | |
| 17 | −1050.78678 | 26.9836 | CaF2 |
| 18 | −233.56610 | 66.8855 | |
| 19 | 230.70172 | 36.3330 | CaF2 |
| 20 | −1406.08059 | 336.9103 | |
| 21 | 1507.82954 | 30.0000 | CaF2 |
| 22 | −439.13700 | 14.6178 | |
| 23 | −190.85280 | 15.0000 | CaF2 |
| 24 | −576.04971 | 49.8868 | |
| 25 | −113.37985 | 16.1000 | CaF2 |
| 26 | −2506.00202 | 19.8946 | |
| 27 | −278.23408 | 17.5000 | CaF2 |
| 28 | −650.19849 | 36.5600 | |
| 29 | −183.80040 | −36.5600 | M1 |
| 30 | −650.19849 | −17.5000 | CaF2 |
| 31 | −278.23408 | −19.8946 | |
| 32 | −2506.00202 | −16.1000 | CaF2 |
| 33 | −113.37985 | −49.8868 | |
| 34 | −576.04971 | −15.0000 | CaF2 |
| 35 | −190.85280 | −14.6178 | |
| 36 | −439.13700 | −30.0000 | CaF2 |
| 37 | 1507.82954 | −237.3715 | |
| 38 | 0.00000 | 131.4229 | FM1 |

TABLE 3-continued

L = 1425 mm
β = ¼
NA = 0.86
| β1 · β2 | = 0.972
| β1 | = 1.002
| β2 | = 0.97
P1 = 0.00854
P2 = −0.01881
P3 = 0.01027
(φGr2_max + φL3B_max)/(2Y) = 0.485
hM1/φM1 = 0.0009
θp = 35.43~43.19
| (β1 · β2) |/NAo = 4.5209
DISTANCE FROM FIRST OBJECT~FIRST
SURFACE: 66.47419 mm

| i | ri | di | GLASS MATERIAL |
|---|---|---|---|
| 39 | 3074.12074 | 29.6707 | CaF2 |
| 40 | −276.47467 | 88.7346 | |
| 41 | 437.72169 | 37.7062 | CaF2 |
| 42 | −9146.00679 | 181.5882 | |
| 43 | 0.00000 | −119.6500 | FM2 |
| 44 | −151.47795 | −32.6687 | CaF2 |
| 45 | −163.39654 | −57.2588 | |
| 46 | 389.07431 | −12.0000 | CaF2 |
| 47 | −405.49505 | −60.1470 | |

TABLE 4

| i | ri | di | GLASS MATERIAL |
|---|---|---|---|
| 48 | −231.69736 | −15.0000 | CaF2 |
| 49 | −259.39566 | −14.5276 | |
| 50 | −368.66999 | −27.9408 | CaF2 |
| 51 | −1547.15886 | −4.4580 | |
| 52 | −502.71539 | −37.7910 | CaF2 |
| 53 | 543.49967 | −12.0264 | |
| 54 | 314.64941 | −20.0000 | CaF2 |
| 55 | 581.64819 | −2.2522 | |
| 56 | 0.00000 | −2.0078 | APERTURE STOP |
| 57 | −530.80806 | −37.3755 | CaF2 |
| 58 | 531.27927 | −1.8289 | |
| 59 | −567.39397 | −20.0000 | CaF2 |
| 60 | −274.01057 | −20.5516 | |
| 61 | −228.67774 | −26.9691 | CaF2 |
| 62 | −608.77802 | −1.0520 | |
| 63 | −189.94931 | −29.6096 | CaF2 |
| 64 | −391.16728 | −1.0000 | |
| 65 | −192.42317 | −29.1009 | CaF2 |
| 66 | −740.67335 | −1.3507 | |
| 67 | −176.78886 | −29.0854 | CaF2 |
| 68 | −625.81900 | −1.8665 | |
| 69 | −197.56994 | −23.2371 | CaF2 |
| 70 | −811.53509 | −14.8718 | |
| 71 | −348.55221 | −29.5588 | CaF2 |
| 72 | 0.00000 | −6.3487 | | aspherical surfaces

| i | K | A | B | C |
|---|---|---|---|---|
| 4 | 1.654370E+00 | 1.359932E−08 | 7.013095E−13 | 9.683493E−18 |
| 11 | 5.347470E−01 | 1.614393E−07 | 4.214306E−11 | 6.602445E−15 |
| 19 | 6.870009E−01 | −1.618277E−08 | −2.710472E−13 | −1.343896E−17 |
| 27 | −1.816739E−01 | 4.375983E−08 | 2.587750E−13 | −5.443843E−17 |
| 31 | −1.816739E−01 | 4.375983E−08 | 2.587750E−13 | −5.443843E−17 |
| 40 | 4.090856E−01 | 5.735444E−09 | 8.018404E−14 | 3.987878E−18 |
| 47 | −1.000254E+00 | −4.201947E−08 | 1.380004E−12 | −3.877263E−17 |
| 49 | 6.878693E−01 | −8.397553E−09 | −2.040356E−12 | 7.957418E−17 |
| 52 | 1.226930E+00 | −4.513526E−09 | −1.194060E−12 | 1.815938E−17 |
| 58 | −1.444022E+00 | −2.798501E−08 | −1.409895E−13 | 1.861974E−17 |
| 65 | −9.742292E−02 | 9.978599E−09 | 1.595418E−12 | −2.232830E−17 |
| 68 | −5.727425E−01 | 2.814570E−09 | −2.925075E−12 | 2.741896E−16 |

TABLE 4-continued

| i | D | E | F | G |
|---|---|---|---|---|
| 4 | 5.396764E−22 | −2.961815E−26 | 3.025455E−30 | −8.053385E−35 |
| 11 | −9.101695E−18 | 6.880629E−21 | −2.948824E−24 | 4.790076E−28 |
| 19 | 1.690052E−21 | −2.514793E−25 | 1.811661E−29 | −5.538095E−34 |
| 27 | 7.624010E−22 | 2.791480E−25 | −2.762620E−29 | 8.897952E−34 |
| 31 | 7.624010E−22 | 2.791480E−25 | −2.762620E−29 | 8.897952E−34 |
| 40 | −6.356746E−22 | 7.145321E−26 | −4.073153E−30 | 9.394356E−35 |
| 47 | −6.026798E−22 | 2.140551E−25 | −9.143022E−30 | 1.212017E−34 |
| 49 | 8.849393E−22 | −8.816850E−26 | −4.192565E−31 | 6.173355E−35 |
| 52 | 5.246390E−21 | −3.191596E−25 | 9.737457E−30 | −4.147263E−35 |
| 58 | 6.572195E−22 | −1.250157E−25 | 1.061690E−29 | −3.152767E−34 |
| 65 | 5.400446E−21 | −3.450916E−25 | 1.054103E−30 | 1.089722E−33 |
| 68 | −2.871661E−20 | 2.190636E−24 | −1.947916E−29 | 4.956907E−34 |

Figure 9:
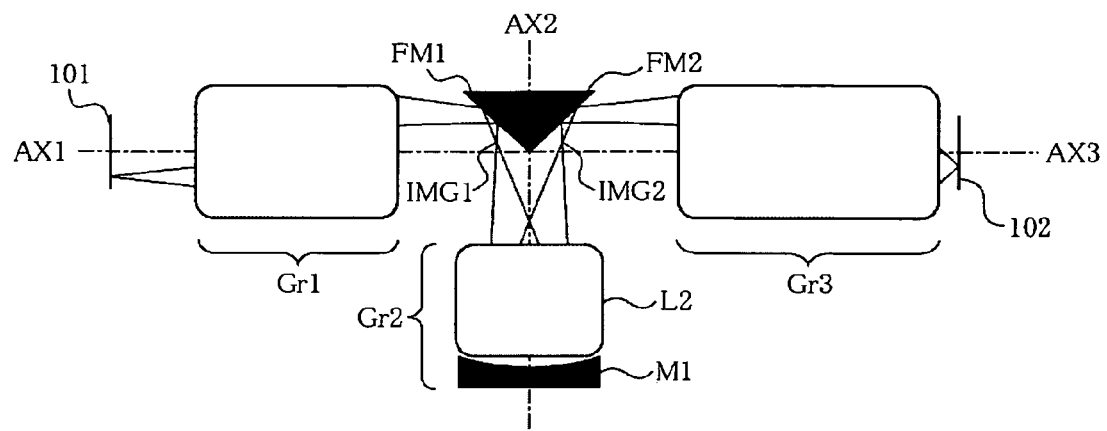
FIG. 9 is a schematic structure of a catadioptric projection optical system of another embodiment according to the present invention.

Referring now to the accompanying drawings, a description will be given of a catadioptric projection optical system of another aspect according to the present invention. As discussed, the same reference numerals are assigned here to members similar to those in FIG. 1 to avoid duplicate explanations. In FIG. 9, the light from a first imaging optical system Gr1 is deflected by a first deflective reflector FM1 and led to a second imaging optical system Gr2. The light from the second imaging optical system Gr2 is deflected by the second deflective reflector FM2 and led to a third imaging optical system Gr3. In FIG. 9, the deflective reflectors FM1 and FM2 are formed on the same element at different reflecting surfaces. Optical axis AX1 and AX3 are formed identically. AX2 is an optical axis of the second imaging optical system Gr2. AX1 and AX2 are orthogonal to each other. The third imaging optical system Gr3 forms an image of the intermediate image IMG2 onto the second object 102 with a predetermined magnification.

Chromatic aberrations, generated by the first and third imaging optical system Gr1 and Gr3, and a positive Petzval sum are corrected by a concave mirror M1 and lenses of the second imaging optical system Gr2.

Preferably, the following conditional expression is met:

$$0.7 < |\beta 1| < 2.0 \quad (12)$$

where β1 is a paraxial imaging magnification of the first imaging optical system Gr1.

If the value is below the lower limit of the conditional expression (12), the imaging magnification β1 of the first imaging optical system Gr1 becomes an excessively small reduction magnification and an incident angle range of the light entering the first deflective reflector FM1 becomes excessively large. The excessively large incident angle range undesirably complicates control over the coating properties of a plane mirror. On the other hand, a value exceeding the upper limit excessively enlarges the first intermediate image IMG1 and an effective diameter of a lens near the first intermediate image IMG1, and other imaging optical systems Gr2 and Gr3 undesirably have difficulties in magnification controls.

More preferably, the following conditional expression is met:

$$0.8 < |\beta 1| < 1.5 \quad (13)$$

The conditional expression (13) is to properly control magnification among the first to third imaging optical systems, and to reduce a diameter of an effective optical system. The magnification β1 of 1 or more of the first imaging optical system easily separates rays between the first deflective reflector FM1 and the first imaging optical system Gr1's minimum angle of view, advantageously lowering the maximum angle of view.

A negative Petzval sum generated by the lens group L2 having a negative refractive power of the reciprocating optical system part and the concave mirror M1 in the second imaging optical system Gr2 can correct a positive Petzval sum generated by refractive optical system parts of the first and third imaging optical systems Gr1 and Gr3. Preferably, the following conditions are met:

$$P1>0, P2<0 \text{ and } P3>0 \quad (14)$$

where P1, P2 and P3 are Petzval sums of the first, second and third imaging optical systems Gr1, Gr2 and Gr3.

The above conditions can arrange a concave mirror M1 and a reciprocating optical system part L2 as a second imaging optical system, and reduce a curvature of field in an imaging optical system. If the conditional expression (14) is not met, a concave mirror M1 and a reciprocating optical system part L2 are arranged as a first or third imaging optical system. The former causes the light reflected from the concave mirror M1 to return near the first object, and results in physical interference among the first object 101 (e.g., a reticle), the returned light and nearby lens, complicating a mechanical structure. The latter uses the concave-mirror M1 for the final imaging system (the third imaging optical system), and complicates light separation, as the optical system needs a higher NA.

Preferably, the following condition is met:

$$-0.10 \leq hM1/\phi M1 < 0.10 \quad (15)$$

where φM1 is an effective diameter of the concave mirror M1, and hM1 is a height of a most off-axial principal light from an optical axis AX2 in the concave mirror M1.

Thus, the concave mirror M1 in the second imaging optical system Gr1 near the pupil reduces astigmatism, etc. Preferably, the following conditional expression is met:

$$-0.05 \leq hM1/\phi M1 < 0.05 \quad (16)$$

In FIG. 9, the deflective reflection parts FM1 and FM2 do not necessarily require the same element, and may use different elements. The optical axis of the first imaging optical system Gr1 and that of the third imaging optical system Gr3 need not be the same. They need not be on a straight line. In particular, if both optical axes are arranged in parallel if not on a straight line, the first and second objects 101 and 102 can be arranged in parallel. The optical axis AX2 of the second imaging optical system Gr2 and the optical axis AX1 of the first imaging optical system Gr1 need not necessarily be orthogonal to each other. For example, if the first and second objects 101 and 102 are arranged in parallel, the optical axes AX1 and AX2 may have an arbitrary angle with each other unless interfered with a lens, reflection member, etc.

Figure 10:
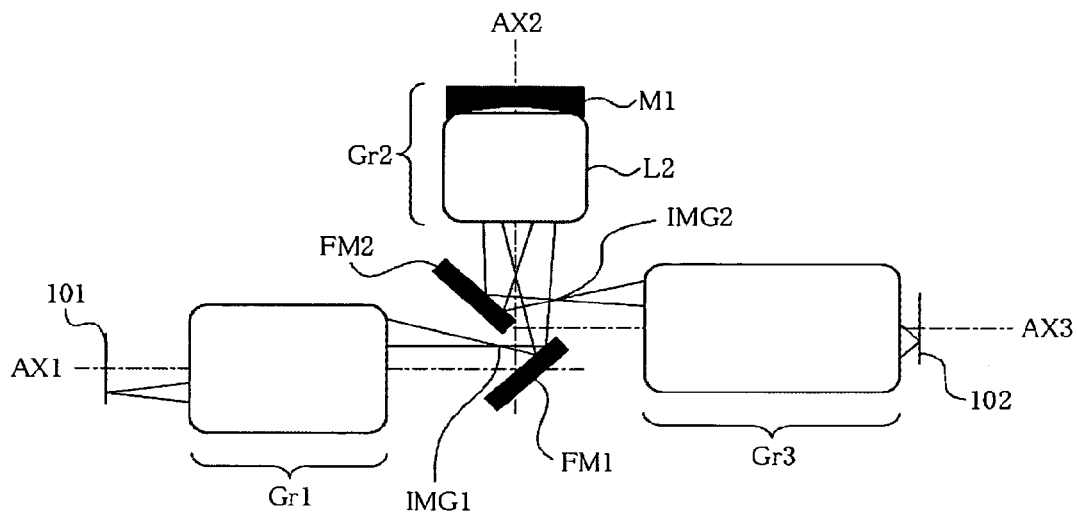
FIG. 10 is a schematic structure of a catadioptric projection optical system of another embodiment according to the present invention.
Figure 11:
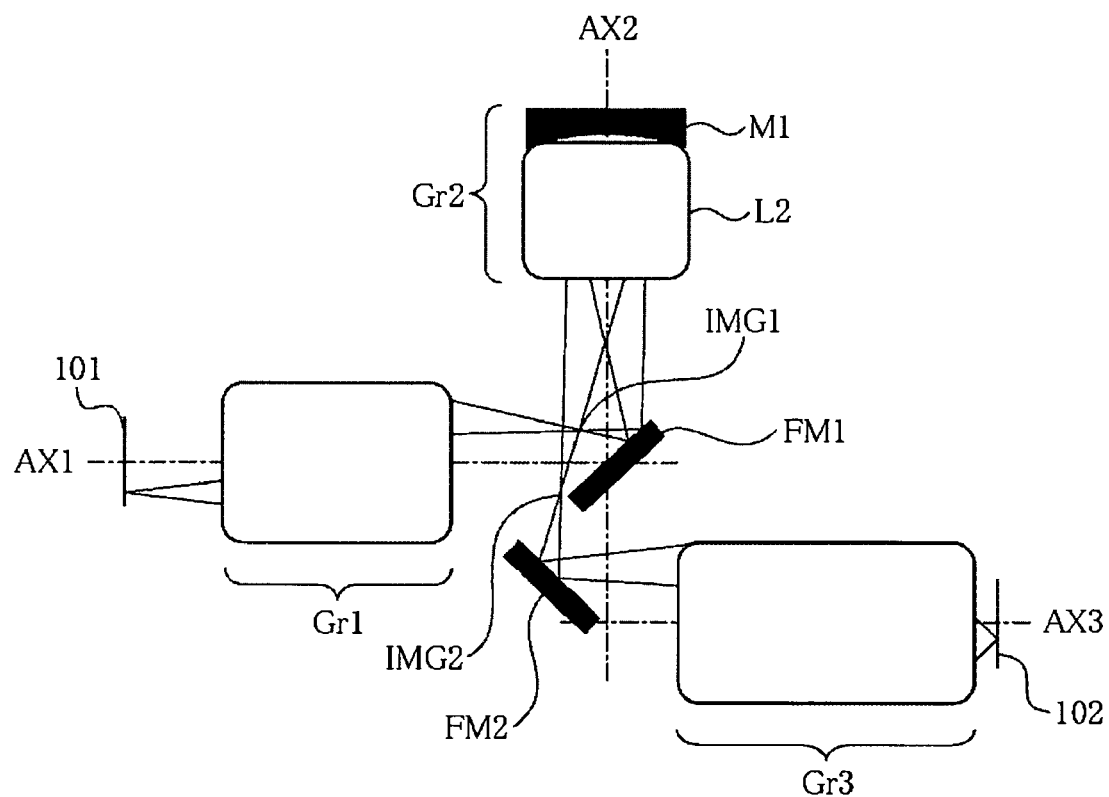
FIG. 11 is a schematic structure of a catadioptric projection optical system of another embodiment according to the present invention.

As shown in FIGS. 10 and 11, the second imaging optical system Gr2 may be arranged such that the light going to the concave mirror M1 and the light reflected from the concave mirror M1 intersect each other. In this case, according to an arrangement shown in FIG. 10, the deflective reflectors are arranged to intersect a ray from the first object 101 that is deflected by the first deflective reflector FM1, with a ray that is made of the above ray reflected by the first deflective reflector FM1 and the concave mirror M1 and directs to the second deflective reflector FM2. The arrangements shown in FIGS. 10 and 11 can reduce an incident angle of light entering two deflective reflectors FM1 and FM2. In the illustrative optical configurations shown in FIGS. 9, 10 and 11 of the instant embodiment according to the present invention, a deflective reflector for deflecting the light is arranged between the first and second imaging optical systems Gr1 and Gr2, and between the second and third imaging optical systems Gr2 and Gr3. In order to arrange the first object 101 and the second one 102 in approximate parallel, the reflecting surfaces of two deflective reflectors need to be arranged with a relative angular difference of 90°. If the first object 101 and the second object 102 need not be arranged in approximate parallel, the second deflective reflector FM2 may be omitted. The second object 102 and the concave mirror M1 are arranged such that they are opposed to each other.

Structures shown in FIGS. 10 and 11 would control an angle of a principal ray incident on the deflective reflectors FM1 and FM2 to be smaller than 45°. In choosing such a structure, the following conditional expression is preferably met:

$$20° < \theta p < 45° \quad (17)$$

where θp is an angle made by the principal ray from the off-axis of the first object and a normal of the reflecting surface of the first deflective reflector FM1. If the lower limit of the conditional expression (17) is not met, the angle that the normal of the first deflective reflector's reflecting surface and the principal ray make becomes too small, and thus, the deflective reflector becomes too big and a refractive power of a nearby lens needs to be made extraordinarily strong. As a result, performance will be degraded. On the other hand, if the upper limit is exceeded, a lens having a strong refractive power is needed for the reciprocating optical system part L2. Accordingly, chromatic aberrations become difficult to correct, or a distance between the concave mirror M1 and the deflective reflector FM1 is made very long, thus, making the apparatus big.

Preferably, the following expression is met:

$$30° < \theta p < 44° \quad (18)$$

The expression (18) will help obtain a better imaging performance as well as make each element and optical system small.

For the optical system of the present invention, the second imaging optical system Gr2 includes a reciprocating optical system part L2. However, this L2 has a negative refractive power and includes at least one lens having a negative refractive power. At least one of those lenses having a negative refractive power preferably have its concave surface oriented toward the first object 101. This reciprocating optical system part L2 preferably has at least one lens having an aspheric surface. If it does not have an aspheric surface, a plurality of lenses are used for the reciprocating optical system part L1 to share the power. Of course, even when an aspheric surface is used, constructing the reciprocating optical system part L1 with a plurality of lenses can better control introduction of aberrations at the reciprocating optical system part. A concave mirror may have an aspheric surface.

The deflective reflector includes deflective mirrors. The shape of the mirror may be a shape of a flat plate or part of a cubic shape. It may also be a mirror that utilizes backside reflection of glass. The light splitter may also be used, in which case, an off-axial beam can be used from the on-axis.

An aperture stop 103 is preferably arranged in the third imaging optical system Gr3. It may also be arranged in combination or singly around where a principal ray of the first imaging optical system Gr1 intersects the optical axis AX1.

In FIGS. 9 through 11, the optical axis AX1 and AX2, and the optical axis AX2 and AX3 are arranged orthogonal to each other, but they need not necessarily be orthogonal. As mentioned above, the deflective reflectors FM1 and FM2 preferably are arranged such that their mutual reflecting surfaces have an angular difference of 90°. This is because if they are arranged such that they have a relative angular difference of 90°, a first object 101 and a second object 102 can be arranged in parallel. However, if there is no need to arrange the first and second objects 101 and 102 in parallel, they need not have relative angular difference of 90°, and thus, may have an arbitrary angle.

Preferably, at least the image-surface side is made telecentric to reduce fluctuations of the magnification when a surface of the second object 102 varies in the optical-axis direction. The imaging optical system of the present invention is especially effective with a high NA of 0.8 or higher, particularly, 0.85 or higher.

Preferably, the inventive optical system provides the first imaging optical system Gr1 with a refractor, the second imaging optical system Gr2 with a concave mirror M1 and a refractor, and the third imaging optical system Gr3 with a refractor. The first imaging optical system Gr1 that includes a reflective system or catadioptric system complicates an arrangement of lenses and deflective reflectors near the first object, because the light often returns to the first object 101. The catadioptric system when used for the final imaging optical system causes interfere between a concave mirror and the light, and complicates a configuration of an optical system with a high NA. If a catadioptric system is not adopted as a subsystem in the total optical system or only a reflective system is used for the second imaging optical system Gr2, chromatic aberrations are hard to be corrected.

The optical system of the present invention may include an aberration correction mechanism. For example, it is possible to include a mechanism in the first imaging optical system Gr1 that moves a lens in an optical axis direction and/or in a direction vertical to an optical axis, or in other directions (to decenter a lens). A similar aberration correction mechanism may be included in the second and third imaging optical systems Gr2 and Gr3. In addition, a mechanism for deforming a concave mirror M1 may be included to correct aberrations.

Figure 12:
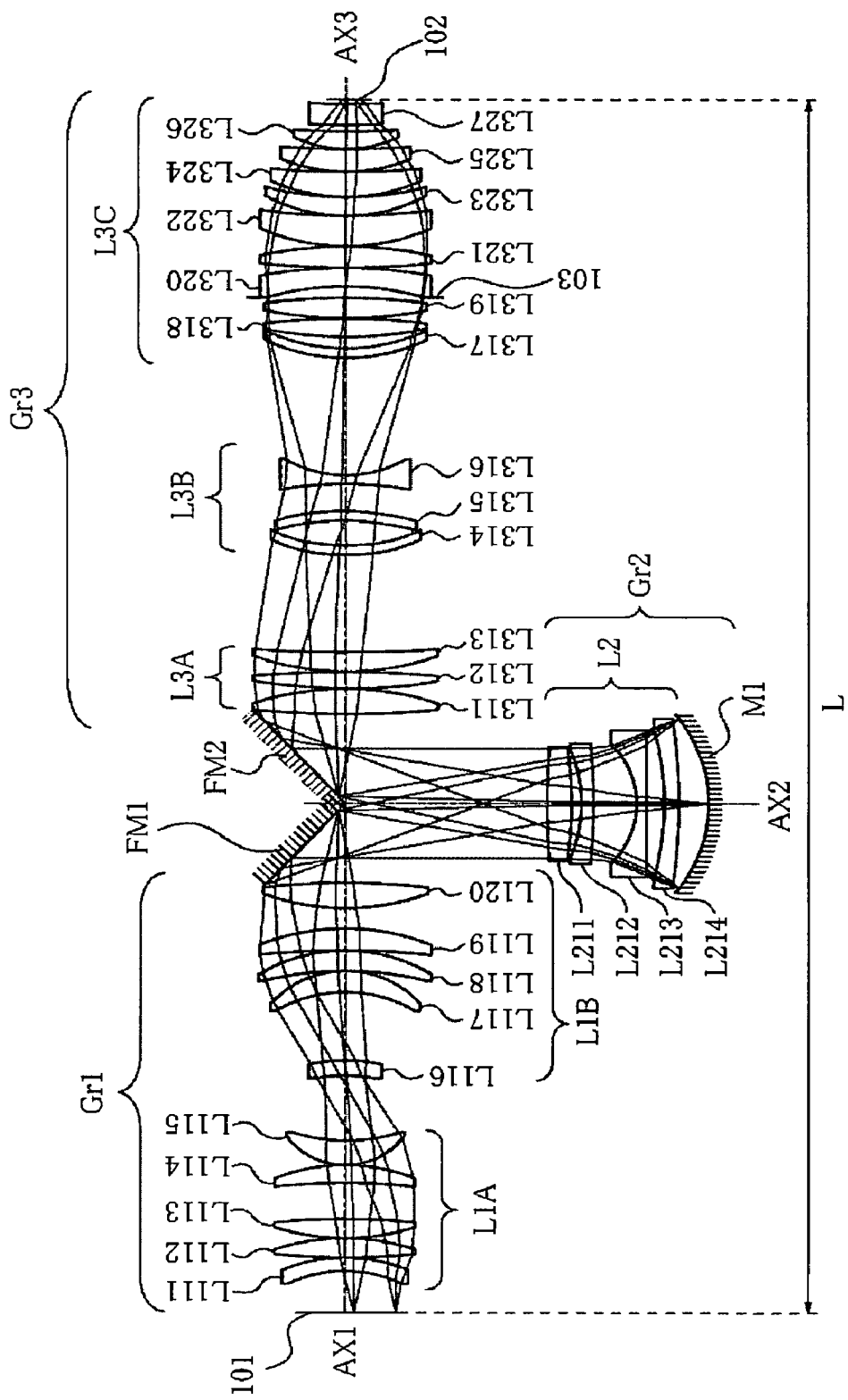
FIG. 12 is an optical-path diagram showing a catadioptric projection optical system of a third embodiment according to the present invention.
Figure 13:
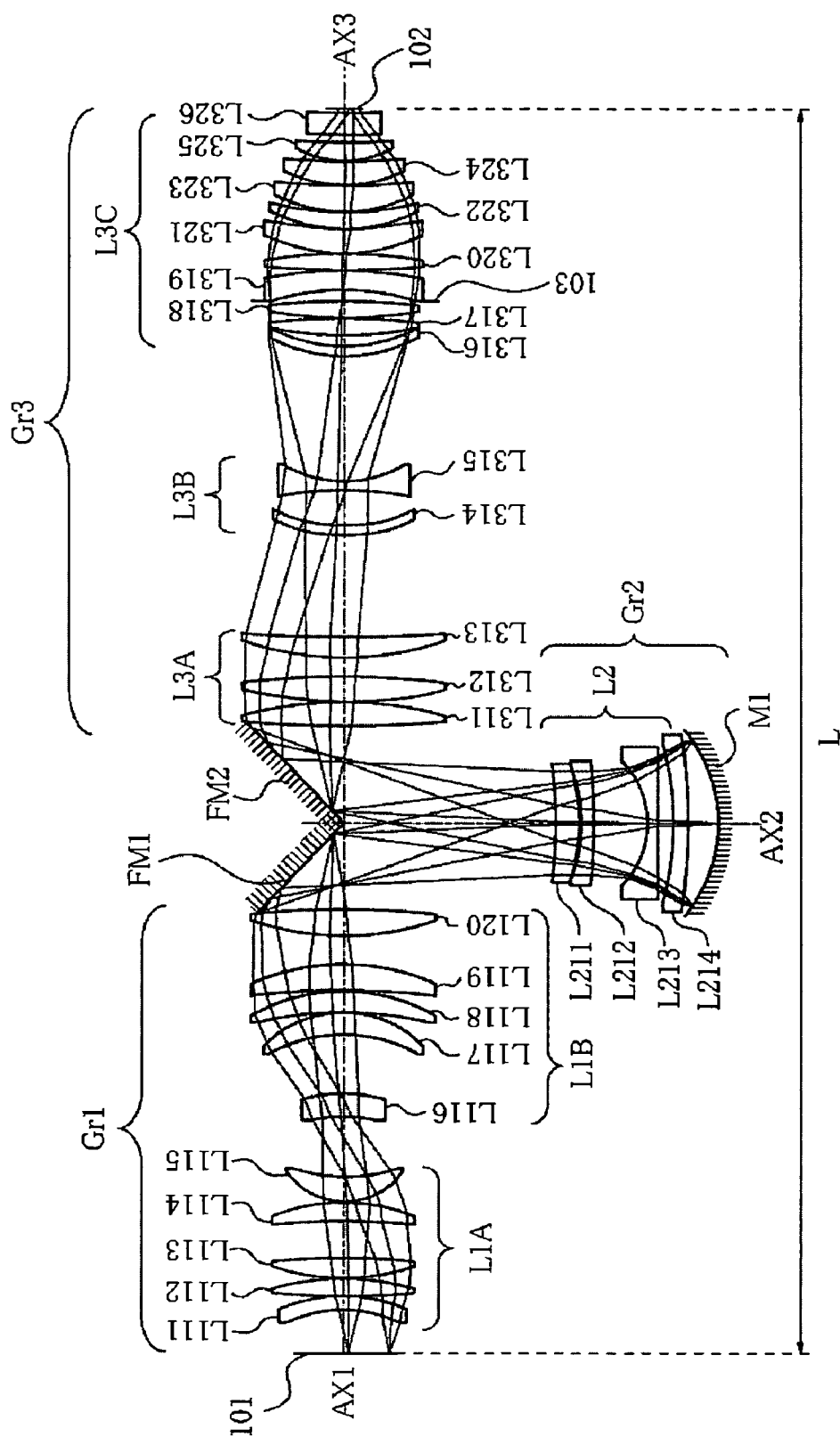
FIG. 13 is an optical-path diagram showing a catadioptric projection optical system of a fourth embodiment according to the present invention.
Figure 14:
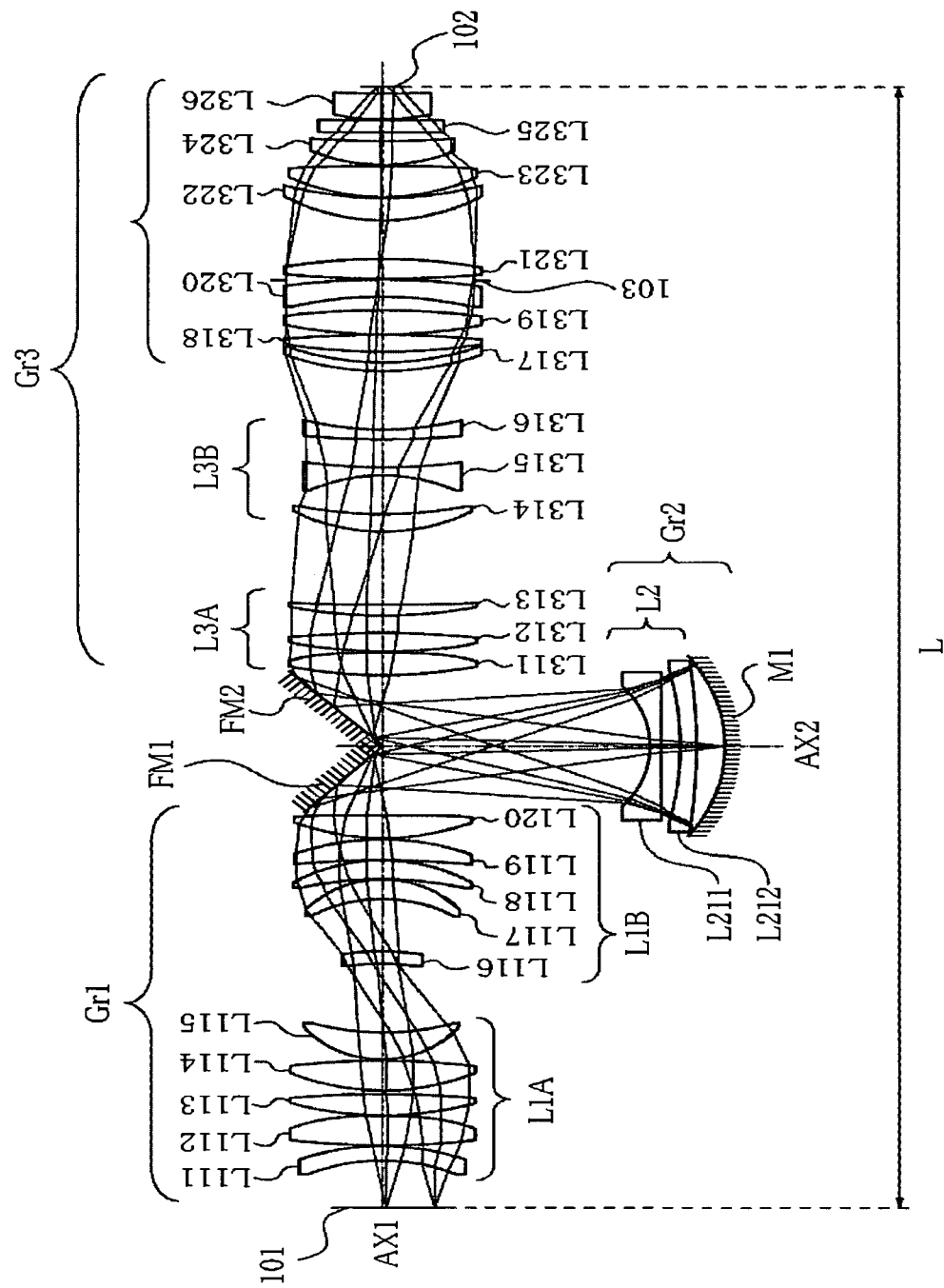
FIG. 14 is an optical-path diagram showing a catadioptric projection optical system of a fifth embodiment according to the present invention.

A so-called immersion structure can be adopted which fills liquid in a space between the surface of the second object 102 and the final glass surface of the optical system (for example, a space between the surface of the second object 102 and a lens L327 in FIG. 12, or between the surface of the second object 102 and a lens L326 in FIGS. 13 and 14).

A field stop may be provided near the intermediate image IMG1 or IMG2. A field stop may also be provided near a surface of the second object 102. Especially where a diffraction optical element is used in the optical system and the above immersion system is used for the second object's surface, if a stop is provided on the final glass surface of the optical system for restricting a field of view or provided near its neighborhood (e.g., between the final glass surface and the surface of the second object 102), it is possible to prevent flare and the like from occurring at the diffraction optical element (which may be flare occurring from other than the diffraction optical element) from arriving at the surface of the second object. It is also possible to have an immersion structure for the surface of the second object without using a diffraction optical element in the optical system. In structuring an immersion optical system, regardless of whether the diffraction optical element is present, an axial space between the final surface of the optical system and the surface of the second object 102 is preferably 5 mm or less, more preferably 1 mm or less, to minimize the effect caused by the properties of liquid, etc. on the imaging performance of the optical system.

A magnification for the optical system of the present invention is not limited to ¼, and may be ⅕ or ⅙.

The optical system of the present invention uses an off-axial image point of the first object, in a certain range off the optical axis. At that time, a rectangular or arc slit area on the first object surface, not inclusive of the optical axis, becomes an exposure area.

Although the aperture stop is arranged in the third imaging optical system Gr3, it may also be arranged in the first imaging optical system Gr1.

Although schematic views shown in FIGS. 9 through 11 are used as examples of embodiments of the present invention, they are not limited to these structures. As described above, including a first imaging optical system Gr1 having at least one lens, a second imaging optical system having at least one lens and one concave mirror, and a third imaging optical system having at least one lens, and providing values in a predetermined range, as mentioned above, for a paraxial magnification β1 of the first imaging optical system makes it possible to secure a space near the first object, which has been a problem for a conventional optical system, as well as preventing the properties of a reflective coating on a deflective reflector from becoming deteriorated due to an angular range incident on the deflective reflector, which presents a problem in pursuing a shorter wavelength and a higher NA.

A description follows on further embodiments of the present invention.

Third Embodiment

FIG. 12 shows a specific lens configuration of a third embodiment. A first imaging optical system in the figure includes, in order from the first object side, a dioptric lens group L1A having a positive refractive power and a dioptric lens group L1B having a positive refractive power. The dioptric lens group L1A having a positive refractive power includes, along a direction of light traveling from the side of the first object 101, a meniscus negative lens L111 with its concave surface oriented toward the first object side, an approximately planoconvex aspheric positive lens L112 with its convex surface oriented toward the first object side, an approximately planoconvex positive lens L113 with its convex surface oriented toward the first object side, a meniscus positive lens L114 with its convex surface oriented toward the second object side, and a meniscus positive lens L115 with its convex surface oriented toward the first object side. The dioptric lens group L1B having a positive refractive power includes a meniscus aspheric negative lens L116 with its concave surface oriented toward the first object side, two meniscus positive lenses L117 and L118 with their concave surfaces oriented toward the first object side, an approximately planoconvex positive lens L119 with its approximately flat surface oriented toward the first object side, and an approximately planoconvex aspheric positive lens L120 with its convex surface oriented toward the first object side. The first imaging optical system Gr1 forms a first intermediate image of the first object 101.

The second imaging optical system Gr2 includes, along a direction of light traveling from the first imaging optical system, a reciprocating optical system part L2 having a negative refractive power and a concave mirror M1, forming an image of the first intermediate image, i.e., a second intermediate image. Concretely, it includes an approximately planoconvex positive lens L211 with its concave surface oriented toward the side of the concave mirror M1, a meniscus negative lens L212 with its concave surface oriented toward a side opposite to the concave mirror M1, an approximately planoconcave lens L213 with its concave surface oriented toward a side opposite to the concave mirror M1, a meniscus aspheric lens L214 with its concave surface oriented toward a side opposite to the concave mirror M1, and a concave mirror M1 with its concave surface oriented toward the reciprocating optical system part L2 of the second imaging optical system Gr2. In addition, a deflective reflector FM1 is arranged between the first imaging optical system Gr1 and the second imaging optical system Gr2. The light and optical axis AX1 from the first imaging optical system Gr1, deflected by the deflective reflector FM1, enters a deflective reflector FM2. They are then reflected by the concave mirror M1 and reenter the reciprocating optical system part L2. As the optical axis is deflected from AX1 to AX3, the light is also deflected. While the present embodiment integrates deflective reflectors FM1 and FM2 into the deflective reflector, different members may also be used.

The third imaging optical system Gr3 includes a dioptric lens group L3A having a positive refractive power, a dioptric lens group L3B having a negative refractive power, and a dioptric lens group L3C having a positive refractive power. The dioptric lens group L3A having a positive refractive power includes a biconvex aspheric positive lens L311, an approximately planoconvex positive lens L312 with its approximately flat surface oriented toward the second object side, and an approximately planoconvex positive lens L313 with its convex surface oriented toward the first object side. The dioptric lens group L3B having a negative refractive power includes a meniscus positive lens L314 with its concave surface oriented toward the second object side, a meniscus aspheric positive lens L315 with its convex surface oriented toward the second object side, and a biconcave negative lens L316. The dioptric lens group L3C having a positive refractive power includes a meniscus aspheric positive lens L317 with its concave surface oriented toward a side of the second object, an approximately planoconvex positive lens L318 with its approximately flat surface oriented toward the second object side, a biconvex aspheric positive lens L319, an aperture stop 103, a meniscus negative lens L320 with its concave surface oriented toward the first object side, an approximately planoconvex aspheric positive lens L321 with its convex surface oriented toward the second object side, two meniscus positive lenses L322 and L323 with their convex surfaces oriented toward the first object side, two approximately planoconvex aspheric positive lenses L324 and L325 with their approximately flat surfaces oriented toward the second object side, a meniscus positive lens L326 with its concave surface oriented toward the second object side, and a planoconvex positive lens L327 with its flat surface oriented toward the second object side. This third imaging optical system Gr3 forms an image of the second intermediate image onto the second object 102.

The present embodiment provides the third imaging optical system Gr3 with such an optics arrangement that L3A has a positive refractive power, L3B has a negative refractive power, and L3C has a positive refractive power. However, it is not limited to this. For example, it may have a five-group structure of a positive-minus-positive-minus-positive combination, a two-group structure of a positive-positive combination, or a structure starting with a negative power from a side of FM2.

The first imaging optical system includes the groups L1A and L1B having a positive refractive power. However, it is not limited to this optics arrangement. For example, it may have a three-group structure of positive-negative-positive, a four-group structure of negative-positive-negative-positive, or any other structures.

The instant embodiment uses a projection magnification of ¼, a reference wavelength of 157 nm, and calcium fluoride as a glass material.

An image-side numerical aperture is NA=0.865, and an object-image distance (the first object surface to the second object surface) is L=1598.23 mm. An aberration-corrected object point is in a range of about 2.25 to 16 mm, so that a rectangular exposure area of at least 26 mm long and 7 mm wide can be secured. The aperture stop 103 is located between L319 and L320.

Figure 15:
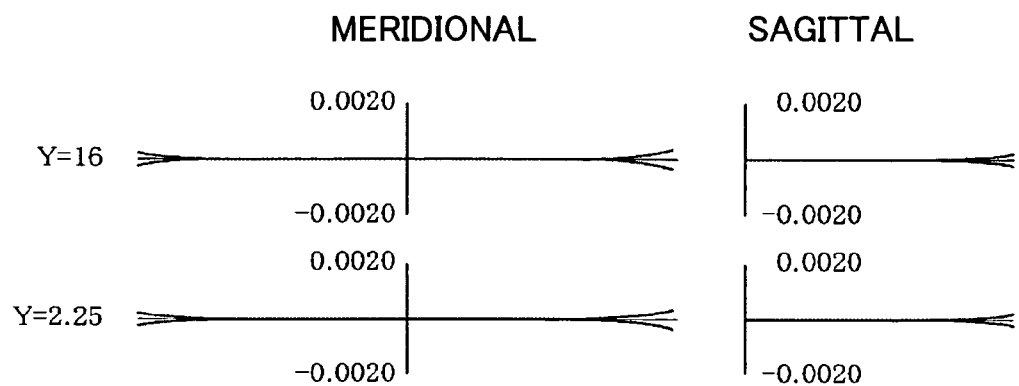
FIG. 15 is an aberrational diagram of the third embodiment according to the present invention.

FIG. 15 shows a lateral aberration diagram of the instant embodiment. Here, that part of the drawing indicated as Y=2.25 shows a lateral aberration diagram for light from an off-axial area where an image point in the second object is 2.25 mm. On the other hand, Y=16 shows a lateral aberration diagram for light from an off-axial area where an image point in the first object is 16 mm. FIG. 15 indicates a reference wavelength of 157.6 nm and a wavelength of +0.6 pm. Understandably, monochrome and chromatic aberrations are satisfactorily corrected.

Fourth Embodiment

FIG. 13 shows a specific lens configuration of a fourth embodiment. A first imaging optical system in the figure includes, in order from the first object side, a dioptric lens group L1A having a positive refractive power, and a dioptric lens group L1B having a positive refractive power. The dioptric lens group L1A having a positive refractive power includes, along a direction of light traveling from the side of the first object 101, a meniscus negative lens L111 with its concave surface oriented toward the first object side, two biconvex aspheric positive lens L112 and L113, a meniscus plus L114 with its convex surface oriented toward the second object side, and a meniscus positive lens L115 with its convex surface oriented toward the first object side. The dioptric lens group L1B having a positive refractive power includes a meniscus aspheric negative lens L116 with its concave surface oriented toward the first object side, three meniscus positive lenses L117, L118 and L119 with their concave surfaces oriented toward the first object side, and a biconvex aspheric positive lens L120. The first imaging optical system Gr1 forms a first intermediate image of the first object 101.

A second imaging optical system Gr2 includes, along a direction of light traveling from the first imaging optical system, a reciprocating optical system part L2 having a negative refractive power and a concave mirror M1, forming an image of the first intermediate image, or a second intermediate image. Concretely, it includes a biconvex positive lens L211, an approximately planoconcave negative lens L212 with its concave surface oriented toward a side opposite to the concave mirror M1, an approximately planoconcave lens L213 with its concave surface oriented toward a side opposite to the concave mirror M1, a meniscus aspheric lens L214 with its concave surface oriented toward a side opposite to the concave mirror M1, and a concave mirror M1 with its concave surface oriented toward a side of the reciprocating optical system part L2 of the second imaging optical system Gr2. In addition, a deflective reflector FM1 is arranged between the first imaging optical system Gr1 and the second imaging optical system Gr2. The light and optical axis AX1 from the first imaging optical system Gr1 are deflected by the deflective reflector FM1, enters the deflective reflector FM2. They are then reflected by the concave mirror M1 before reentering the reciprocating optical system part L2. As the optical axis is deflected from AX1 to AX3, the light is also deflected.

A third imaging optical system Gr3 includes a dioptric lens group L3A having a positive refractive power, a dioptric lens group L3B having a negative refractive power, and a dioptric lens group L3C having a positive refractive power. The dioptric lens group L3A having a positive refractive power includes a biconvex aspheric positive lens L311, a biconvex positive lens L312, and a meniscus positive lens L313 with its convex surface oriented toward the first object side. The dioptric lens group L3B having a negative refractive power includes a meniscus positive lens L314 with its concave surface oriented toward the second object side and a biconcave aspheric negative lens L315. The dioptric lens group L3C having a positive refractive power includes a meniscus aspheric positive lens L316 with its concave surface oriented toward a side of the second object 102, an approximately planoconvex positive lens L317 with its approximately flat surface oriented toward the second object side, a biconvex aspheric positive lens L318, an aperture stop 103, a meniscus negative lens L319 with its concave surface oriented toward the first object side, a biconvex aspheric positive lens L320, two meniscus positive lenses L321 and L322 with their convex surfaces oriented toward the first object side, two approximately planoconvex aspheric positive lenses L324 and L325 with their approximately flat surfaces oriented toward the second object side, a meniscus positive lens L325 with its concave surface oriented toward the second object side, and a planoconvex positive lens L326 with its flat surface oriented toward the second object side. This third imaging optical system Gr3 forms an image of the second intermediate image onto the second object 102.

The instant embodiment uses a projection magnification of ¼, a reference wavelength of 157 nm, and calcium fluoride as a glass material.

An image-side numerical aperture is NA=0.85, and an object-image distance (from the first object surface to the second object surface) is L=1610.13 mm. The object point is aberration-corrected in a range of about 2.25 to 15.5 mm, and so, a rectangular exposure area of at least 26 mm long and 7 mm wide can be secured. The aperture stop 103 is located between L318 and L319.

Figure 16:
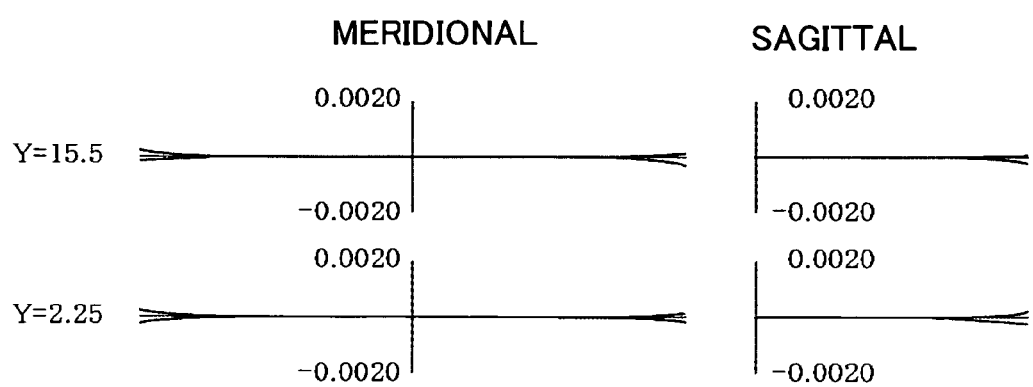
FIG. 16 is an aberrational diagram of the fourth embodiment according to the present invention.

FIG. 16 shows a lateral aberration diagram of the instant embodiment.

Fifth Embodiment

FIG. 14 shows a specific lens configuration of a fifth embodiment. A first imaging optical system in the figure includes, in order from the first object side, a dioptric lens group L1A having a positive refractive power and a dioptric lens group L1B having a positive refractive power. The dioptric lens group L1A having a positive refractive power includes, along a direction of light traveling from the side of the first object 101, a meniscus negative lens L111 with its concave surface oriented toward the first object side, a biconvex aspheric positive lens L112, a planoconvex positive lens L113 with its convex surface oriented toward the first object side, a biconvex positive lens L114, and a meniscus positive lens L115 with its convex surface oriented toward the first object side. The dioptric lens group L1B having a positive refractive power includes a meniscus aspheric negative lens L116 with its concave surface oriented toward the first object side, two meniscus positive lenses L117 and L118 with their concave surfaces oriented toward the first object side, an planoconvex positive lens L119 with its convex surface oriented toward the second object side, and a planoconvex aspheric positive lens L120 with its convex surface oriented toward the first object side. The first imaging optical system Gr1 forms a first intermediate image of the first object 101.

A second imaging optical system Gr2 includes, along a direction of light traveling from the first imaging optical system, a reciprocating optical system part L2 having a negative refractive power and a concave mirror M1, forming an image of the first intermediate image or a second intermediate image. Concretely, it includes a meniscus negative lens L211 with its concave surface oriented toward a side opposite to the concave mirror M1, a meniscus aspheric negative lens L212 with its concave surface oriented toward a side opposite to the concave mirror M1, and a concave mirror M1 with its concave surface oriented toward a side of the reciprocating optical system part L2 of the second imaging optical system Gr2. In addition, a deflective reflector FM1 is arranged between the first imaging optical system Gr1 and the second imaging optical system Gr2. The light and optical axis AX1 from the first imaging optical system Gr1, deflected by the deflective reflector FM1, enters the reciprocating optical system part L2. They are then reflected by the concave mirror M1 before reentering the reciprocating optical system part L2. As the optical axis is deflected from AX1 to AX3, the light is also deflected.

A third imaging optical system Gr3 includes a dioptric lens group L3A having a positive refractive power, a dioptric lens group L3B having a negative refractive power, and a dioptric lens group L3C having a positive refractive power. The dioptric lens group L3A having a positive refractive power includes a biconvex aspheric positive lens L311, a biconvex positive lens L312, and an approximately planoconvex positive lens L313 with its convex surface oriented toward the first object side. The dioptric lens group L3B having a negative refractive power includes a meniscus positive lens L314 with its convex surface oriented toward the first object side, an approximately planoconvex aspheric positive lens L315 with its concave surface oriented toward the first object side, and an approximately planoconcave positive lens L316 with its concave surface oriented toward the second object side. The dioptric lens group L3C having a positive refractive power includes a meniscus aspheric positive lens L317 with its concave surface oriented toward a side of the second object 102, an approximately planoconvex positive lens L318 with its approximately flat surface oriented toward the second object side, an approximately planoconvex aspheric positive lens L319 with its convex surface oriented toward the first object side, a meniscus negative lens L320 with its concave surface oriented toward the first object side, an aperture stop 103, a biconvex aspheric positive lens L321, a meniscus positive lens L322 with its convex surface oriented toward the first object side, two approximately planoconvex aspheric positive lenses L323 and L324 with their approximately flat surfaces oriented toward the second object side, an approximately planoconcave negative lens L325 with its concave surface oriented toward the second object side, and an approximately planoconvex positive lens L326 with its approximately flat surface oriented toward the second object side. This third imaging optical system Gr3 forms an image of the second intermediate image onto the second object 102.

The instant embodiment uses a projection magnification of ¼, a reference wavelength of 157 nm, and calcium fluoride as a glass material.

An image-side numerical aperture is NA=0.86, and an object-image distance (the first object surface to the second object surface) is L=1567.89 mm. An aberration-corrected object point in a range of about 3.13 to 16.5 mm secures a rectangular exposure area of at least 26 mm long and 7 mm wide. The aperture stop 103 is located between L320 and L321.

Figure 17:
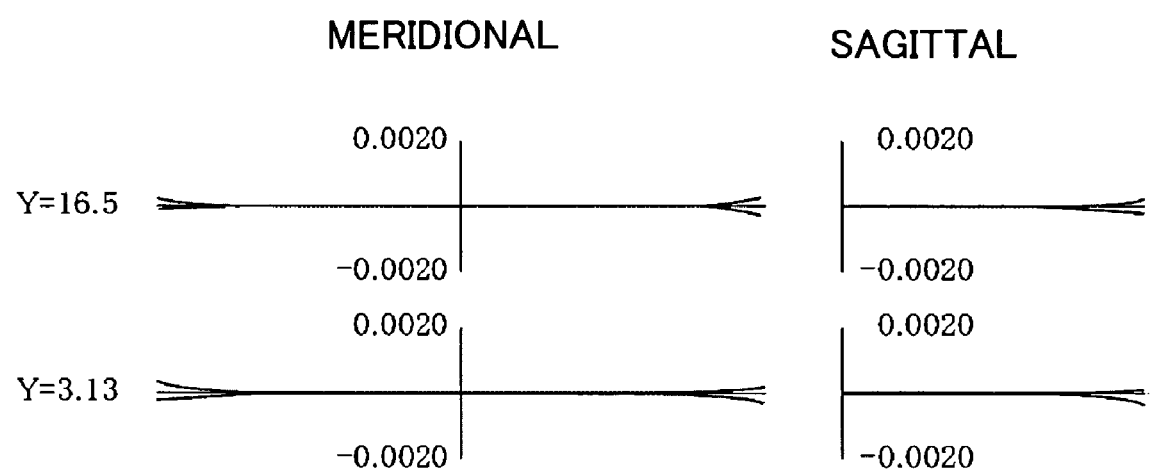
FIG. 17 is an aberrational diagram of the fifth embodiment according to the present invention.

FIG. 17 shows a lateral aberration diagram of the instant embodiment.

While the above third to fifth embodiments use only calcium fluoride as a glass material, other glass materials such as barium calcium fluoride, magnesium calcium fluoride, and the like may be used in combination or singularly. When used for a wavelength of 193 nm (ArF), quartz and calcium fluoride may be used in combination, or just quartz may be used. Other glass materials may also be used. It is more desirable to use the inventive catadioptric projection system if using only a refractive element makes it difficult to correct chromatic aberrations and the like that are introduced by a higher NA or there is a problem of enlarging a lens in an exposure wavelength of 200 nm or less, which includes the wavelengths of $F_2$ and ArF.

The following Tables 5 and 6 show a specification of numerical examples of the third embodiment. The following Tables 7 and 8 show a specification of numerical examples of the fourth embodiment. The following Tables 9 and 10 show a specification of numerical examples of the fifth embodiment. "i" in the tables is a surface number along a direction of light traveling from the first object 101. "ri" is the radius of curvature of each surface corresponding to the surface number. "di" is a surface spacing of each surface. A lens glass material $CaF_2$ has a refractive index to a reference wavelength A=157.6 nm is 1.56. Further, refraction indexes for the wavelengths of +0.6 pm and −0.6 pm for the reference wavelength are 1.55999853 and 1.560000147, respectively. An aspheric shape is given by the following equation:

$$X=(H2/4)/(1+((1-(1+k)\cdot(H/r)2))1/2)+ AH4+BH6+CH8+DH10+EH12+FH14+GH16$$

where X is a displacement in a direction of an optical axis from the lens top, H is a distance from the optical axis, ri is a radius of curvature, k is a conical constant, and A, B, C, D, E, F, and G are aspheric coefficients.

TABLE 5

L = 1598.23 mm
β = ¼
NA = 0.865
| β1 · β2 | = 0.90034
| β1 | = 1.0423
| β2 | = 0.86381
P1 = 0.00876
P2 = −0.01914
P3 = 0.01038
hM1/φM1 = 0.0054
| (β1 · β2) |/NAo = 4.1634
DISTANCE FROM FIRST OBJECT~FIRST SURFACE: 58.79745 mm

| i | ri | di | GLASS MATERIAL |
|---|---|---|---|
| 1 | −137.23037 | 15.00193 | CaF2 |
| 2 | −194.27380 | 1.00000 | |
| 3 | 1396.10895 | 22.86270 | CaF2 |
| 4 | −295.05045 | 1.00000 | |
| 5 | 303.69332 | 25.88983 | CaF2 |
| 6 | −1498.69823 | 48.24549 | |
| 7 | −1127.94608 | 23.05739 | CaF2 |
| 8 | −231.32925 | 1.00000 | |
| 9 | 94.01344 | 31.78943 | CaF2 |
| 10 | 190.69567 | 88.53201 | |
| 11 | −116.64786 | 17.85557 | CaF2 |
| 12 | −203.69343 | 88.90402 | |
| 13 | −183.19491 | 27.74002 | CaF2 |
| 14 | −125.00000 | 1.00000 | |
| 15 | −469.45311 | 27.81052 | CaF2 |
| 16 | −200.00000 | 1.00000 | |
| 17 | −1663.96340 | 31.25949 | CaF2 |
| 18 | −249.50027 | 24.61031 | |
| 19 | 264.40981 | 32.94576 | CaF2 |
| 20 | −1400.00000 | 104.60952 | |
| 21 | 0.00000 | −261.36499 | FM1 |
| 22 | −1792.37319 | −30.00000 | CaF2 |
| 23 | 411.03390 | −12.02075 | |
| 24 | 190.00000 | −15.00000 | CaF2 |
| 25 | 1016.69163 | −54.01460 | |

TABLE 5-continued

L = 1598.23 mm
β = ¼
NA = 0.865
| β1 · β2 | = 0.90034
| β1 | = 1.0423
| β2 | = 0.86381
P1 = 0.00876
P2 = −0.01914
P3 = 0.01038
hM1/φM1 = 0.0054
| (β1 · β2) |/NAo = 4.1634
DISTANCE FROM FIRST OBJECT~FIRST SURFACE: 58.79745 mm

| i | ri | di | GLASS MATERIAL |
|---|---|---|---|
| 26 | 110.68223 | −16.10000 | CaF2 |
| 27 | 2339.77245 | −20.99972 | |
| 28 | 310.99975 | −17.50000 | CaF2 |
| 29 | 621.64789 | −37.99994 | |
| 30 | 183.74571 | 37.99994 | M1 |
| 31 | 621.64789 | 17.50000 | CaF2 |
| 32 | 310.99975 | 20.99972 | |
| 33 | 2339.77245 | 16.10000 | CaF2 |
| 34 | 110.68223 | 54.01460 | |
| 35 | 1016.69163 | 15.00000 | CaF2 |
| 36 | 190.00000 | 12.02075 | |
| 37 | 411.03390 | 30.00000 | CaF2 |
| 38 | −1792.37319 | 261.36499 | |
| 39 | 0.00000 | −114.36936 | FM2 |
| 40 | −1024.78134 | −32.21631 | CaF2 |
| 41 | 379.52065 | −1.00326 | |
| 42 | −664.31702 | −23.21889 | CaF2 |
| 43 | 1793.48644 | −1.00000 | |
| 44 | −365.50764 | −24.34329 | CaF2 |
| 45 | −1750.56188 | −126.45376 | |
| 46 | −211.09523 | −16.08650 | CaF2 |
| 47 | −292.69409 | −30.52013 | |

TABLE 6

| i | ri | di | GLASS MATERIAL |
|---|---|---|---|
| 48 | 300.00000 | −12.00000 | CaF2 |
| 49 | 284.81010 | −36.95300 | |
| 50 | 599.51546 | −12.00000 | CaF2 |
| 51 | −159.12034 | −155.04606 | |
| 52 | −256.96818 | −12.00000 | CaF2 |
| 53 | −263.78703 | −15.08132 | |
| 54 | −524.95792 | −21.37162 | CaF2 |
| 55 | 1538.35443 | −1.00000 | |
| 56 | −421.87131 | −28.35593 | CaF2 |
| 57 | 787.79636 | −1.00000 | |
| 58 | 0.00000 | −19.09358 | APERTURE STOP |
| 59 | 314.97989 | −20.00000 | CaF2 |
| 60 | 747.35429 | −1.00000 | |
| 61 | −1484.71622 | −26.50339 | CaF2 |
| 62 | 351.35689 | −1.00000 | |
| 63 | −239.81108 | −38.83752 | CaF2 |
| 64 | −592.37770 | −1.00000 | |
| 65 | −206.72140 | −23.50170 | CaF2 |
| 66 | −419.81128 | −1.98004 | |
| 67 | −205.60493 | −31.03859 | CaF2 |
| 68 | −2368.00907 | −1.67631 | |
| 69 | −200.00000 | −28.07583 | CaF2 |
| 70 | −1772.60064 | −1.00000 | |
| 71 | −174.24890 | −21.42482 | CaF2 |
| 72 | −414.80896 | −9.26035 | |
| 73 | −413.95733 | −27.63278 | CaF2 |
| 74 | 0.00000 | −6.27422 | |

TABLE 6-continued aspherical surfaces

| i | K | A | B | C |
|---|---|---|---|---|
| 4 | −2.924494E−01 | 2.107888E−08 | 1.268052E−12 | 1.816675E−17 |
| 11 | 6.045219E−01 | 1.027445E−07 | 8.072805E−11 | 2.325938E−14 |
| 19 | 8.837230E−01 | −1.306527E−08 | −1.847813E−13 | −4.205543E−18 |
| 28 | −2.530848E−02 | −4.351236E−08 | 1.511812E−13 | 4.797330E−17 |
| 32 | −2.530848E−02 | −4.351236E−08 | 1.511812E−13 | 4.797330E−17 |
| 41 | 8.790216E−01 | −3.393212E−09 | −3.209923E−14 | −9.088900E−19 |
| 49 | 1.559763E+00 | −3.400099E−08 | 1.164075E−12 | −5.634572E−17 |
| 53 | 1.049769E+00 | −1.535766E−08 | −1.449177E−12 | 1.038437E−16 |
| 56 | 1.308923E+00 | −4.452057E−09 | −1.388776E−12 | 4.751164E−17 |
| 62 | −1.566544E+00 | −2.851229E−08 | −9.726991E−14 | 3.190470E−17 |
| 67 | −4.185863E−02 | 7.536660E−09 | 2.042494E−12 | −2.643247E−17 |
| 70 | 6.734922E+01 | −1.364036E−08 | −2.981043E−12 | 3.897724E−16 |

| i | D | E | F | G |
|---|---|---|---|---|
| 4 | 5.012368E−21 | −5.385900E−25 | 3.987634E−29 | −8.927292E−34 |
| 11 | −2.839633E−17 | 2.422684E−20 | −1.200636E−23 | 2.308426E−27 |
| 19 | 2.221049E−22 | −4.084518E−26 | 2.872768E−30 | −8.367862E−35 |
| 28 | −1.176445E−21 | −1.621272E−25 | 2.106678E−29 | −7.679399E−34 |
| 32 | −1.176445E−21 | −1.621272E−25 | 2.106678E−29 | −7.679399E−34 |
| 41 | 1.092187E−22 | −1.007276E−26 | 4.726463E−31 | −8.890424E−36 |
| 49 | 1.999855E−21 | −1.245803E−25 | 6.179518E−30 | −1.220993E−34 |
| 53 | −1.260628E−21 | −2.403790E−27 | 3.695072E−30 | −9.504329E−34 |
| 56 | 4.830304E−21 | −5.239116E−26 | −4.092669E−31 | 4.125771E−34 |
| 62 | 1.091326E−21 | 2.748648E−26 | 1.339378E−29 | −8.351081E−34 |
| 67 | 6.380862E−21 | −2.485946E−25 | 2.372219E−29 | −3.423708E−33 |
| 70 | −7.860457E−21 | −4.610599E−24 | 5.777653E−28 | −5.200551E−32 |

TABLE 7

L = 1610.13 mm
β = ¼
NA = 0.85
| β1 · β2 | = 1.09741
| β1 | = 1.19
| β2 | = 0.922198
P1 = 0.0085
P2 = −0.01885
P3 = 0.01036
hM1/φM1 = −0.0175
| (β1 · β2) |/NAo = 5.1640
DISTANCE FROM FIRST OBJECT~FIRST SURFACE: 59.03313 mm

| i | ri | di | GLASS MATERIAL |
|---|---|---|---|
| 1 | −128.54939 | 15.00000 | CaF2 |
| 2 | −169.06697 | 1.00000 | |
| 3 | 749.95392 | 22.24024 | CaF2 |
| 4 | −344.15290 | 1.00000 | |
| 5 | 334.23821 | 27.32038 | CaF2 |
| 6 | −601.29488 | 49.51914 | |
| 7 | −1054.99300 | 20.67156 | CaF2 |
| 8 | −234.59444 | 1.00000 | |
| 9 | 90.10900 | 30.76322 | CaF2 |
| 10 | 212.96965 | 82.57235 | |
| 11 | −117.54375 | 28.36649 | CaF2 |
| 12 | −459.69176 | 73.79791 | |
| 13 | −182.53397 | 28.89626 | CaF2 |
| 14 | −125.00000 | 1.00000 | |
| 15 | −467.63000 | 29.86618 | CaF2 |
| 16 | −200.00000 | 1.00000 | |
| 17 | −857.36732 | 35.07798 | CaF2 |
| 18 | −220.56363 | 34.91719 | |
| 19 | 284.84572 | 36.80779 | CaF2 |
| 20 | −1000.00000 | 110.77546 | |
| 21 | 0.00000 | −276.97393 | FM1 |
| 22 | 802.30769 | −30.00000 | CaF2 |
| 23 | 240.00000 | −4.81827 | |
| 24 | 201.39006 | −15.00000 | CaF2 |
| 25 | 1438.43491 | −68.99700 | |
| 26 | 104.03778 | −16.10000 | CaF2 |
| 27 | 710.52471 | −21.00000 | |
| 28 | 224.49186 | −17.50000 | CaF2 |
| 29 | 415.30228 | −38.00000 | |
| 30 | 190.01543 | 38.00000 | M1 |
| 31 | 415.30228 | 17.50000 | CaF2 |
| 32 | 224.49186 | 21.00000 | |
| 33 | 710.52471 | 16.10000 | CaF2 |
| 34 | 104.03778 | 68.99700 | |
| 35 | 1438.43491 | 15.00000 | CaF2 |
| 36 | 201.39006 | 4.81827 | |
| 37 | 240.00000 | 30.00000 | CaF2 |
| 38 | 802.30769 | 276.97393 | |
| 39 | 0.00000 | −121.56160 | FM2 |
| 40 | −963.12119 | −32.57281 | CaF2 |
| 41 | 461.17720 | −1.00000 | |
| 42 | −599.60240 | −30.17525 | CaF2 |
| 43 | 978.00768 | −25.49156 | |
| 44 | −304.43231 | −26.15498 | CaF2 |
| 45 | −926.49316 | −128.86452 | |
| 46 | −154.29841 | −17.80445 | CaF2 |
| 47 | −213.33844 | −40.26858 | |

TABLE 8

| i | ri | di | GLASS MATERIAL |
|---|---|---|---|
| 48 | 324.14407 | −15.00000 | CaF2 |
| 49 | −133.02338 | −161.23190 | |
| 50 | −236.83161 | −12.00000 | CaF2 |
| 51 | −230.14771 | −11.60621 | |
| 52 | −366.92825 | −20.06836 | CaF2 |
| 53 | −29080.77499 | −1.00000 | |
| 54 | −431.76224 | −23.71080 | CaF2 |
| 55 | 889.47737 | −1.00000 | |
| 56 | 0.00000 | −16.13423 | APERTURE STOP |
| 57 | 315.00000 | −20.00000 | CaF2 |
| 58 | 607.62068 | −1.00000 | |
| 59 | −579.20772 | −24.01953 | CaF2 |
| 60 | 555.02345 | −1.00000 | |
| 61 | −220.00000 | −30.00000 | CaF2 |
| 62 | −540.25514 | −1.00000 | |
| 63 | −206.38722 | −21.56461 | CaF2 |
| 64 | −419.52531 | −1.00000 | |
| 65 | −196.08302 | −33.07321 | CaF2 |
| 66 | −1478.06687 | −1.00000 | |
| 67 | −195.58613 | −31.19230 | CaF2 |
| 68 | −1348.24670 | −1.00000 | |
| 69 | −145.60589 | −24.66667 | CaF2 |
| 70 | −389.06764 | −6.45937 | |
| 71 | −303.06065 | −33.60956 | CaF2 |
| 72 | 0.00000 | −3.27422 | | aspherical surfaces

| i | K | A | B | C |
|---|---|---|---|---|
| 4 | −1.576022E+00 | 2.749600E−08 | 9.729677E−13 | −1.277130E−17 |
| 11 | 5.398859E−01 | 9.941599E−08 | 1.008852E−10 | 2.161466E−14 |
| 19 | 9.881587E−01 | −1.190329E−08 | −1.467604E−13 | −2.021605E−18 |
| 28 | 6.909633E−01 | −3.671657E−08 | −6.467565E−13 | 1.459521E−17 |
| 32 | 6.909633E−01 | −3.671657E−08 | −6.467565E−13 | 1.459521E−17 |
| 41 | 1.388425E+00 | −2.495505E−09 | −3.321853E−14 | −9.875212E−19 |
| 48 | −2.491892E+00 | 2.887198E−08 | −3.549585E−12 | 2.157528E−16 |
| 51 | 9.988626E−01 | −1.723317E−08 | −6.992055E−13 | 1.517125E−16 |
| 54 | 2.150204E+00 | −7.492977E−09 | −9.305985E−13 | 1.250777E−16 |
| 60 | −1.936949E+00 | −2.876345E−08 | 3.397155E−13 | 3.213102E−17 |
| 65 | −6.482719E−01 | 2.049179E−08 | 1.941702E−12 | −1.671915E−16 |
| 68 | 1.448941E+02 | −1.848238E−08 | −2.340555E−12 | −2.577542E−16 |

| i | D | E | F | G |
|---|---|---|---|---|
| 4 | 2.225816E−20 | −4.105454E−24 | 3.799466E−28 | −1.394840E−32 |
| 11 | −3.180325E−17 | 2.422684E−20 | −1.200636E−23 | 2.438787E−27 |
| 19 | −2.156760E−23 | −5.908111E−27 | 4.562459E−31 | −1.360043E−35 |
| 28 | 8.619144E−23 | −2.188575E−25 | 2.816037E−29 | −1.322530E−33 |
| 32 | 8.619144E−23 | −2.188575E−25 | 2.816037E−29 | −1.322530E−33 |
| 41 | 1.246002E−22 | −8.413556E−27 | 2.641064E−31 | −2.958734E−36 |
| 48 | −1.726602E−20 | 3.417355E−24 | −4.843851E−28 | 2.840659E−32 |
| 51 | −2.338026E−21 | 4.221164E−25 | −3.974401E−29 | 6.943535E−34 |
| 54 | 4.967014E−21 | −6.965123E−27 | 1.035065E−29 | 1.775542E−34 |
| 60 | 1.998807E−21 | 6.170818E−26 | 5.819869E−30 | −1.179761E−33 |
| 65 | 6.533044E−21 | 1.905257E−25 | −5.916422E−29 | −1.954910E−34 |
| 68 | 1.209846E−19 | −3.142789E−23 | 3.718178E−27 | −2.555341E−31 |

TABLE 9

L = 1567.89 mm  
$\beta = 1/4$  
NA = 0.86  
$|\beta 1 \cdot \beta 2| = 0.78064$  
$|\beta 1| = 0.85521$  
$|\beta 2| = 0.91281$  
P1 = 0.00867  
P2 = −0.01907  
P3 = 0.01039  
hM1/φM1 = −0.000233  
$|(\beta 1 \cdot \beta 2)|/NAo = 3.6309$  
DISTANCE FROM FIRST OBJECT~FIRST SURFACE: 71.67921 mm

| i | ri | di | GLASS MATERIAL |
|---|---|---|---|
| 1 | −127.21306 | 17.02064 | CaF2 |
| 2 | −212.48710 | 2.59624 | |
| 3 | 1083.44021 | 39.43413 | CaF2 |
| 4 | −300.19315 | 1.46982 | |
| 5 | 513.70944 | 25.18335 | CaF2 |
| 6 | 66340.17315 | 7.28099 | |
| 7 | 246.44966 | 42.81141 | CaF2 |
| 8 | −549.40424 | 1.47587 | |
| 9 | 121.94959 | 32.29197 | CaF2 |
| 10 | 236.73664 | 104.23590 | |
| 11 | −114.35256 | 15.00068 | CaF2 |
| 12 | −224.50799 | 69.89493 | |
| 13 | −197.53300 | 35.75587 | CaF2 |
| 14 | −102.75305 | 1.98446 | |
| 15 | −298.90596 | 15.85839 | CaF2 |
| 16 | −219.25120 | 2.00552 | |
| 17 | −36165.69550 | 31.11858 | CaF2 |
| 18 | −237.27531 | 4.23596 | |
| 19 | 211.25460 | 32.63091 | CaF2 |
| 20 | −1339.08130 | 95.44358 | |
| 21 | 0.00000 | −314.92653 | FM1 |

TABLE 9-continued

L = 1567.89 mm  
$\beta = 1/4$  
NA = 0.86  
$|\beta 1 \cdot \beta 2| = 0.78064$  
$|\beta 1| = 0.85521$  
$|\beta 2| = 0.91281$  
P1 = 0.00867  
P2 = −0.01907  
P3 = 0.01039  
hM1/φM1 = −0.000233  
$|(\beta 1 \cdot \beta 2)|/NAo = 3.6309$  
DISTANCE FROM FIRST OBJECT~FIRST SURFACE: 71.67921 mm

| i | ri | di | GLASS MATERIAL |
|---|---|---|---|
| 22 | 105.48551 | −16.10000 | CaF2 |
| 23 | 1198.42736 | −19.06661 | |
| 24 | 234.07245 | −17.50000 | CaF2 |
| 25 | 500.86929 | −36.93303 | |
| 26 | 178.15802 | 36.93303 | M1 |
| 27 | 500.86929 | 17.50000 | CaF2 |
| 28 | 234.07245 | 19.06661 | |
| 29 | 1198.42736 | 16.10000 | CaF2 |
| 30 | 105.48551 | 314.92653 | |
| 31 | 0.00000 | −94.11763 | FM2 |
| 32 | −386.10510 | −31.07059 | CaF2 |
| 33 | 670.19014 | −2.22761 | |
| 34 | −801.74027 | −25.67667 | CaF2 |
| 35 | 587.85913 | −25.25053 | |
| 36 | −546.02372 | −15.71600 | CaF2 |
| 37 | −1295.69292 | −105.84831 | |
| 38 | −190.67982 | −20.25144 | CaF2 |
| 39 | −330.13357 | −54.90451 | |
| 40 | 184.97462 | −12.00000 | CaF2 |
| 41 | −9146.49492 | −41.88823 | |

TABLE 10

| i | ri | di | GLASS MATERIAL |
|---|---|---|---|
| 42 | −1110.05510 | −12.00000 | CaF2 |
| 43 | −348.04948 | −79.12213 | |
| 44 | −239.27227 | −12.00000 | CaF2 |
| 45 | −239.77770 | −19.71901 | |
| 46 | −506.87202 | −18.69178 | CaF2 |
| 47 | −3473.96320 | −1.00717 | |
| 48 | −314.81982 | −37.08372 | CaF2 |
| 49 | 1217.70424 | −19.80658 | |
| 50 | 296.43508 | −19.31141 | CaF2 |
| 51 | 602.79243 | −2.45925 | |
| 52 | 0.00000 | −1.19320 | APERTURE STOP |
| 53 | −991.13744 | −29.08931 | CaF2 |
| 54 | 373.20653 | −50.92930 | |
| 55 | −184.84388 | −33.97952 | CaF2 |
| 56 | −324.69272 | −1.10056 | |
| 57 | −155.65890 | −43.64555 | CaF2 |
| 58 | 2956.61316 | −1.03736 | |
| 59 | −148.36253 | −34.13436 | CaF2 |
| 60 | −1019.14352 | −9.67762 | |
| 61 | −11758.61646 | −15.04935 | CaF2 |
| 62 | −700.59292 | −1.06311 | |
| 63 | −188.86970 | −37.96727 | CaF2 |
| 64 | −3150.51588 | −9.46301 | |

TABLE 10-continued aspherical surfaces

| i  | K            | A             | B             | C             |
|----|--------------|---------------|---------------|---------------|
| 4  | 8.231925E−01 | 1.757709E−08  | 8.649041E−13  | 9.837938E−18  |
| 11 | 2.012405E−01 | 1.075760E−07  | 7.873867E−11  | 2.265504E−14  |
| 19 | 6.087856E−01 | −2.115076E−08 | −4.113005E−13 | −1.276655E−17 |
| 24 | −3.500545E−01| −4.437823E−08 | −5.487449E−13 | 6.043631E−17  |
| 28 | −3.500545E−01| −4.437823E−08 | −5.487449E−13 | 6.043631E−17  |
| 33 | −7.385015E−01| −4.492625E−09 | −8.936495E−14 | 7.619513E−19  |
| 41 | −5.930601E+03| −3.719249E−08 | 3.119095E−12  | 7.589967E−18  |
| 45 | 3.803091E−01 | −6.096883E−09 | −1.553592E−12 | 7.459325E−17  |
| 48 | 8.640243E−01 | −4.057559E−09 | −1.123729E−12 | 1.215477E−17  |
| 54 | −1.469354E+00| −2.795557E−08 | −2.120861E−13 | 1.664543E−17  |
| 57 | −3.427727E−01| 1.571817E−08  | 1.722881E−12  | −9.326799E−18 |
| 60 | 1.957877E+00 | −1.708824E−08 | −1.210579E−12 | 3.986155E−16  |

| i  | D             | E             | F             | G             |
|----|---------------|---------------|---------------|---------------|
| 4  | −6.927911E−22 | 1.885759E−25  | −1.443122E−29 | 4.818413E−34  |
| 11 | −2.464768E−17 | 6.896271E−21  | −1.486043E−25 | −5.402033E−28 |
| 19 | 8.391148E−22  | −1.705301E−25 | 1.321175E−29  | −4.551009E−34 |
| 24 | 6.548473E−22  | −3.042504E−25 | 2.701935E−29  | −8.667684E−34 |
| 28 | 6.548473E−22  | −3.042504E−25 | 2.701935E−29  | −8.667684E−34 |
| 33 | −1.136942E−22 | 1.571850E−26  | −8.534403E−31 | 1.904240E−35  |
| 41 | −1.266827E−21 | −2.603875E−26 | 1.073921E−29  | −3.934649E−34 |
| 45 | 1.372935E−21  | −2.458714E−25 | 1.431932E−29  | −5.167212E−34 |
| 48 | 5.302362E−21  | −3.195123E−25 | 1.301877E−29  | −1.163602E−34 |
| 54 | 9.705743E−22  | −8.673097E−26 | 1.169492E−29  | −4.509501E−34 |
| 57 | 5.155239E−21  | −3.369738E−25 | 1.372621E−29  | −6.069227E−34 |
| 60 | −5.246616E−20 | 2.480073E−24  | −1.103509E−29 | −8.140743E−33 |

A description will be given of a catadioptric projection optical system as one aspect according to the present invention with reference to the accompanying drawings. As discussed above, those elements which are the same elements in FIG. 1 are designated by the same reference numerals, and a duplicate description thereof will be omitted. In the optical system shown in FIG. 1 (or the optical systems in FIGS. 7 and 8), the following conditional equation is preferably met, where β1 is a paraxial imaging magnification of the first imaging optical system Gr1, β2 is a paraxial imaging magnification of the first imaging optical system Gr2, and NAo is a numerical aperture at the first object side:

$$3.5 < |\beta 1 \cdot \beta 2|/NAo < 20 \quad (20)$$

The conditional equation (20) defines composite paraxial imaging magnifications of the first and second imaging optical system relative to the numerical aperture NAo at the first object side. A value below the lower limit of the conditional equation (20) makes excessively small the composite magnification between the first and second imaging optical systems Gr1 and Gr2 to the numerical aperture at the first object side. Then, it is difficult to divide the ray that is reflected by the deflective reflector FM1 and directs to the third imaging optical system Gr3 from the ray that enters the second imaging optical system Gr2 from the first imaging optical system Gr1. Alternatively, the paraxial magnification β2 of the imaging optical system Gr2 is such an excessively reduced magnification that the asymmetrical aberration greatly occurs at the reciprocating optical system part and the imaging performance deteriorates. In an optical system having a high NA, the light incident upon the deflective reflector that attempts deflection has a large incident angle range: The first and second imaging optical systems mostly control the reduction magnification. Thus, an extension of the light emitted from the first object or the numerical aperture NAo at the first object side becomes large by the reduced magnifications due to the first and second imaging optical systems, and the light incident upon the first deflective reflector a large incident angle range. As a result, there is a difference in reflection intensity between P and S due to the influence of the reflective coating of the deflective reflector. This becomes remarkable in a cataoptric optical system that forms images many times when NA exceeds 1, particularly, NA is 1.10 or larger, more particularly, NA is 1.20 or larger in the immersion optical system. The immersion optical system is an optical system that fills liquid between a final surface (i.e., a surface at the image surface side or the second object side) of a final element (which is an optical element at the second object side closest to the image surface in the projection optical system) and a second object 102 surface (such as a wafer). In other words, the immersion optical system is an optical system that is designed on the premise that the liquid is filled between the final element's final surface in the optical system (or a surface at the image surface side of the optical element closest to the image surface side) and the second object surface (or an image surface), and usually used to expose a pattern on the reticle etc. onto the wafer etc. in an exposure apparatus that fills pure water between the final element's final surface and the second object surface. A value above the upper limit of the conditional equation (20) makes excessively large the composite magnification between the first and second imaging optical systems Gr1 and Gr2 to the numerical aperture at the first object side. As a result, when the first object 101 is projected on the second object 102 at a reduction ratio, the third imaging optical system Gr3 has such a small absolute value of the paraxial imaging magnification β3 that the aberrational correction becomes difficult. In addition, the lens near the second intermediate image IMG2 has an excessively large effective diameter.

Preferably, the following conditional equation is met:

$$4.0 < |\beta 1 \cdot \beta 2|/NAo < 10 \quad (21)$$

The optical system defined by the conditional equations (20) and (21) is not limited to those shown in FIG. 1, etc. For example, such an optical system may include first, second and third imaging optical systems, wherein the second imaging optical system has a concave mirror or there is a deflective mirror inn the optical system.

The immersion optical system preferably satisfies the following conditional equation:

$$1.1 < NA < 1.6 \qquad (22)$$

A value below the lower limit of the conditional equation (22) has-difficulties in obtaining expected resolving power when the immersion optical system uses the catadioptric optical system. A value above the 15, upper limit makes the effective diameter of the immersion optical system excessively large, and has difficulties in manufacturing the lens.

More preferably, the following conditional equation is met:

$$1.2 < NA < 1.5 \qquad (23)$$

A description will be given of additional embodiments according to the present invention.

Sixth Embodiment

Figure 18:
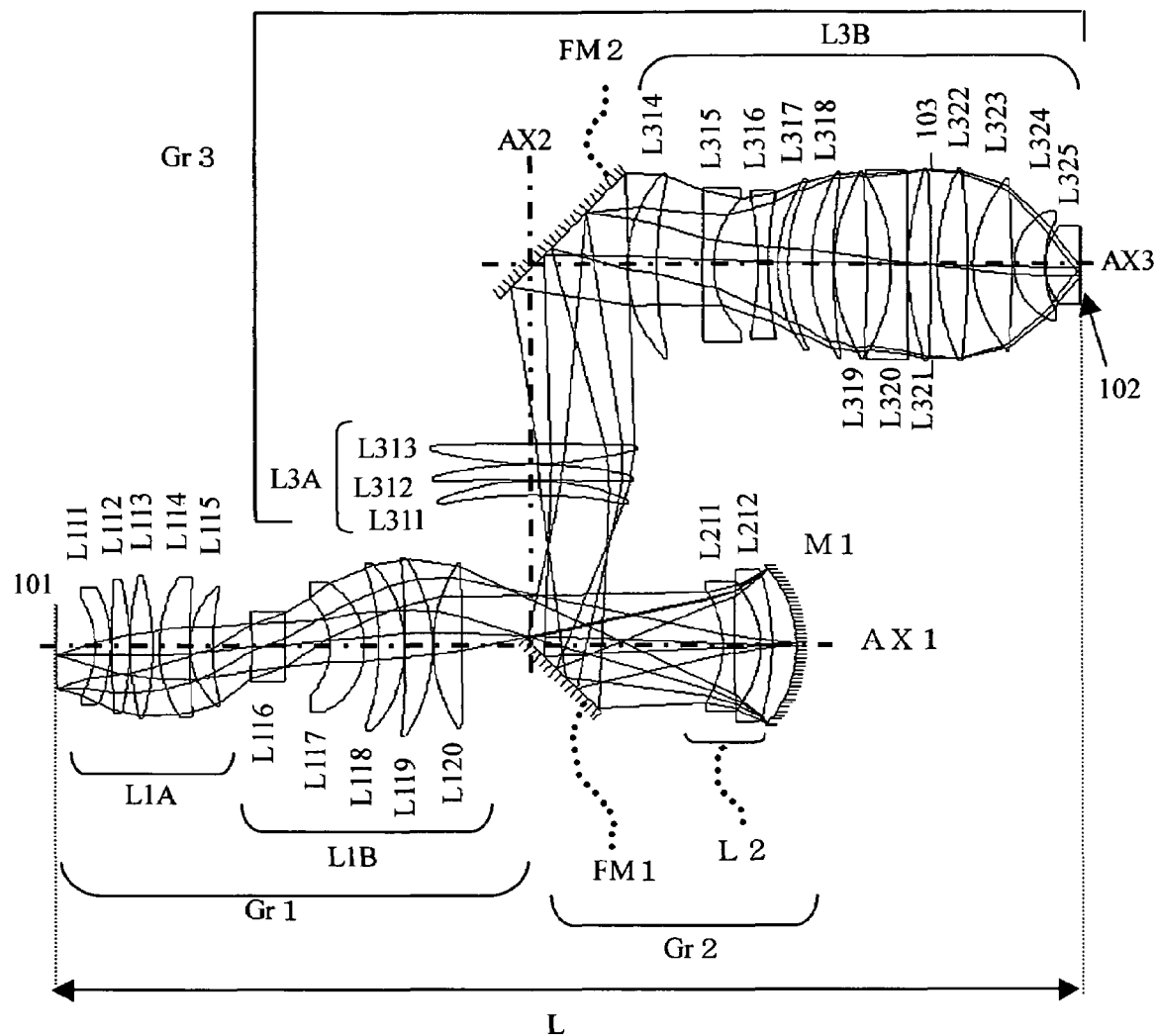
FIG. 18 is an optical-path diagram of a catadioptric projection optical system of a sixth embodiment according to the present invention.

FIG. 18 shows a specific lens configuration of the sixth embodiment. In FIG. 18, the first imaging optical system includes, in order from the first object side, a dioptric lens group L1A having a positive refractive power and a dioptric lens group L1B having a positive refractive power. The dioptric lens group L1A having a positive refractive power includes, along a direction of light traveling from the side of the first object 101, a meniscus negative lens L111 with its concave surface oriented toward the first object side, an approximately planoconvex aspheric positive lens L112 with its approximately flat surface oriented toward the first object side, a biconvex positive lens L113, an approximately planoconvex positive lens L114 with its approximately convex surface oriented toward the first object side, and a meniscus positive lens L115 with its convex surface oriented toward the first object side. The lens group L1B having a positive power includes an approximately planoconvex negative lens L116 with its approximately concave surface oriented toward the first object, two meniscus positive lenses L117 and L118 with their concave surface oriented toward the first object side, an approximately planoconvex positive lens L119 with its approximately flat surface oriented toward the first object side, and an approximately planoconvex aspheric positive lens L120 with its convex surface oriented toward the first object side.

The second imaging optical system Gr2 includes a reciprocating optical system part L2 having a negative refractive power and a concave mirror M1. It includes, along a direction of light traveling from the first imaging optical system Gr1, an approximately planoconcave negative lens L211 with its convex surface oriented toward the first object side, a meniscus aspheric concave lens L212 with its concave surface oriented toward the first object side, and a concave mirror M1 with its concave surface oriented toward the first object side. The light from the first imaging optical system Gr1 enters the reciprocating optical system part L2, then is reflected at the concave mirror M1, and reenters the reciprocating optical system part L2. Then the reflective element FM1 deflects the optical axis AX1 to the optical axis AX2 by 90°. The light is deflected accordingly and the second intermediate image IMG2 is formed. The deflective reflector FM1 is arranged between the second and third imaging optical systems, but preferably it is arranged between the second intermediate image IMG2 and the reciprocating optical system part L2 as shown in the instant embodiment. The instant embodiment makes the deflective reflector of a plane mirror.

The third imaging optical system Gr3 includes a dioptric lens group L3A having a positive refractive power and a dioptric lens group L3B having a positive refractive power. The dioptric lens group L3A having a positive refractive power includes, along a direction of light traveling from the second imaging optical system Gr2, a meniscus positive lens L311 with its concave surface oriented toward the side of the second intermediate image IMG2, an approximately planoconvex positive lens L312 with its approximately flat surface oriented toward the side of the second intermediate image IMG2, and an approximately planoconvex positive lens L313 with its approximately flat surface oriented toward the side of the second deflective reflector FM2. The dioptric lens group L3B having a positive refractive power includes a meniscus positive lens L314 with its concave surface oriented toward a side of the second object 102, an approximately planoconcave negative lens L315 with its concave surface oriented toward the side of the second object 102, a biconcave aspheric negative lens L316, two meniscus positive lenses L317 and L318 with their convex surfaces oriented toward a side opposite to the second object, an approximately planoconvex aspheric positive lens L319 with its flat surface oriented toward the second object side, an approximately planoconcave negative lens L320 with its concave surface oriented toward a side opposite to the second object, an approximately planoconvex aspheric positive lens L321 with its flat surface oriented toward the second object side, an aperture stop 103, an approximately planoconvex positive lens L322 with its convex surface oriented toward a side opposite to the second object 102, an approximately planoconvex positive lens L323 with its convex surface oriented toward a side opposite to the second object 102, a meniscus aspheric positive lens L324 with its concave surface oriented toward the second object side, and an approximately planoconvex positive lens L325 with its flat surface oriented toward the second object 102 side. A second deflective reflector FM2 is arranged between the dioptric lens groups L3A and L3B in the third imaging optical system Gr3. The deflective reflector FM2 is a plane mirror in the instant embodiment, and deflects light reflected from the first deflective reflector in a predetermined direction.

The instant embodiment adopts a so-called immersion optical system that fills liquid between the final lens L325 and the second object 102. The liquid is pure water in the instant embodiment, but may be other liquid. A refractive index of the liquid is not limited to that in the instant embodiment. For example, liquid with a refractive index of about 1.6 can be used. When a similar configuration is used for the $F_2$ laser, PFPE, for example, or other liquid can be used. The final lens may be a flat plate. A flat plate can be used between the first object 101 and the first lens L101. While the instant embodiment arranges the aperture stop 103 between the lenses L321 and L322, a position of the aperture stop 103 is not limited to this position.

The instant embodiment uses a projection magnification of ¼, a reference wavelength of 193 nm, and calcium fluoride as a glass material. An image-side numerical aperture is NA=1.20. An object-image distance (the first object surface to the second object surface) is L=1663.38 mm. An aberration-corrected object point in a range of about 3.38 to 17 mm secures a rectangular exposure area of at least about 26 mm long and about 7.5 mm wide. A slit shape in the exposure area is not limited to a rectangle and may use an arc shape or another shape. The aperture stop 103 is located between L321 and L322.

Figure 22:
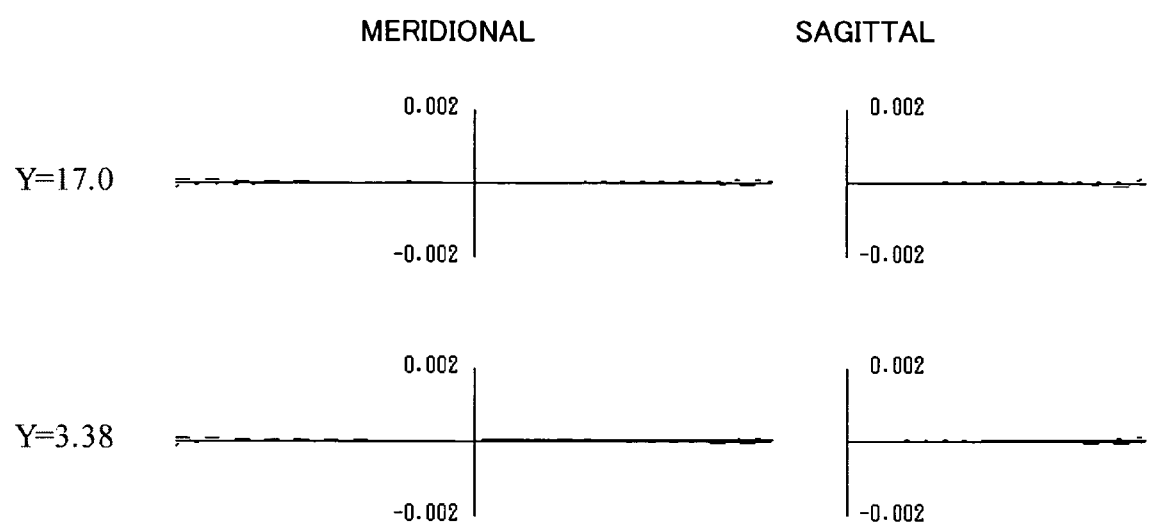
FIG. 22 is an aberrational diagram of the sixth embodiment according to the present invention.

FIG. 22 shows a lateral aberration diagram of the instant embodiment. The part with Y=3.38 in FIG. 22 shows a lateral aberration diagram for light from an off-axis area that has an image point of 3.38 mm in the second object. On the other hand, the part with Y=17.0 shows a lateral aberration diagram for light from an off-axis area that has an image point of 17.0 mm in the second object. FIG. 22 shows a wavelength with a reference wavelength of 193.0 nm±0.2 pm. Understandably, monochrome and chromatic aberrations are satisfactorily corrected.

While the available glass material for a wavelength of 193 nm (ArF) is quarts and calcium fluoride simultaneously, the instant embodiment uses only quarts. Another material can be applied. The available glass material for a wavelength of 157 nm ($F_2$) is calcium fluoride, or other glass materials such as barium calcium fluoride, magnesium calcium fluoride, and the like may be used in combination or singularly.

Seventh Embodiment

Figure 19:
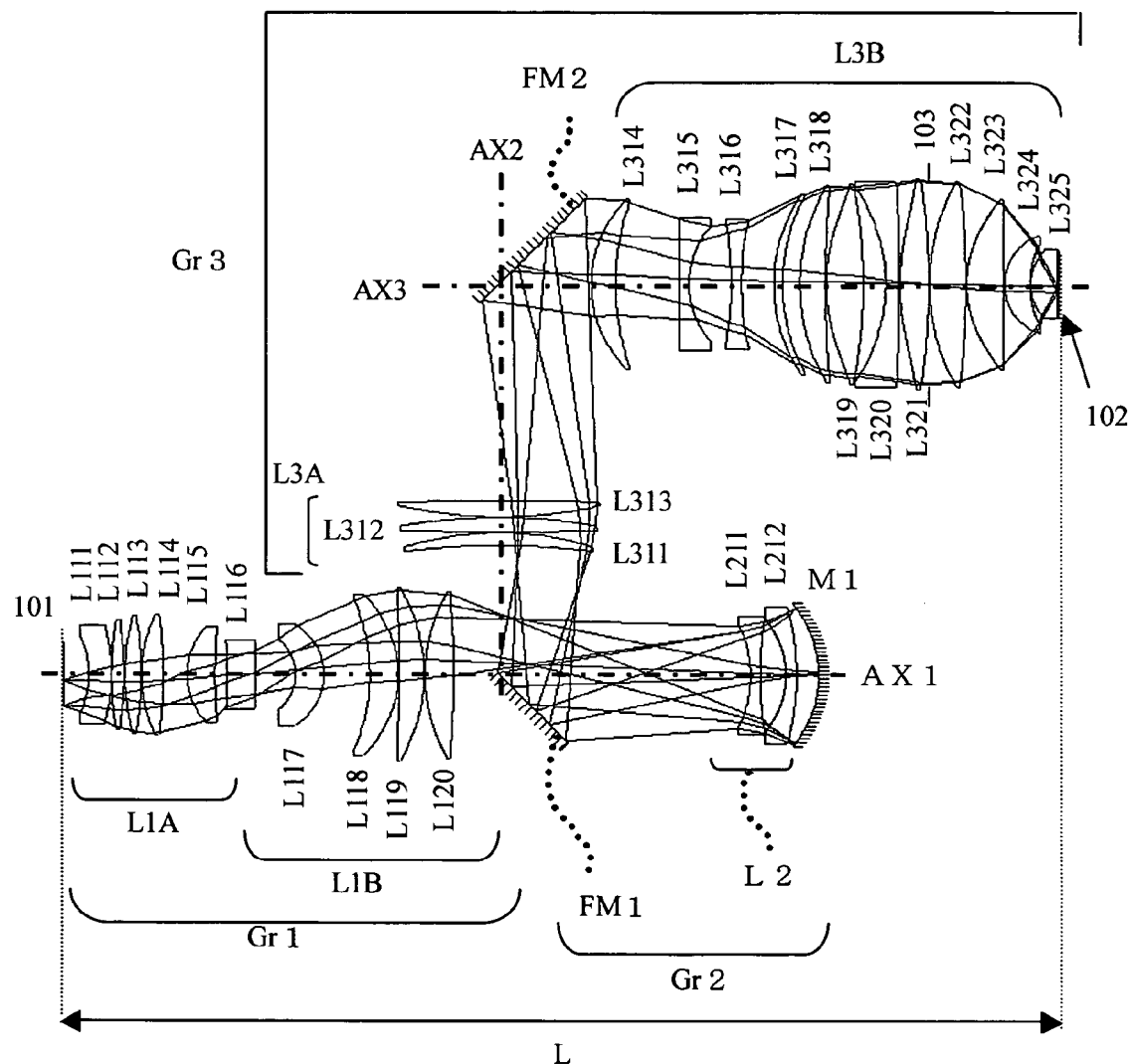
FIG. 19 is an optical-path diagram of a catadioptric projection optical system of a seventh embodiment according to the present invention.

FIG. 19 shows a specific lens configuration of the seventh embodiment. In FIG. 19, the first imaging optical system includes, in order from the first object side, a dioptric lens group L1A having a positive refractive power and a dioptric lens group L1B having a positive refractive power. The dioptric lens group L1A having a positive refractive power includes, along a direction of light traveling from the side of the first object 101, a meniscus negative lens L111 with its concave surface oriented toward the first object side, a biconvex aspheric positive lens L112 with its approximately flat surface oriented toward the first object side, two biconvex positive lenses L113 and L114, an approximately planoconvex positive lens L114 with its approximately convex surface oriented toward the first object side, a meniscus positive lens L115 with its convex surface oriented toward the first object side, and an approximately planoconvex negative lens L116 with its concave surface oriented toward the first object side. The lens group L1B having a positive power includes a meniscus negative lens L117 with its concave surface oriented toward the first object side, a meniscus positive lens L118 with its concave surface oriented toward the first object side, an approximately planoconvex positive lens L119 with its approximately flat surface oriented toward the first object side, and an approximately planoconvex aspheric positive lens L120 with its convex surface oriented toward the first object side.

The second imaging optical system Gr2 includes a reciprocating optical system part L2 having a negative refractive power and a concave mirror M1. It includes, along a direction of light traveling from the first imaging optical system Gr1, a biconcave negative lens L211, a meniscus aspheric concave lens L212 with its concave surface oriented toward the first object side, and a concave mirror M1 with its concave surface oriented toward the first object side. The light from the first imaging optical system Gr1 enters the reciprocating optical system part L2, then is reflected at the concave mirror M1, and reenters the reciprocating optical system part L2. Then the reflective element FM1 deflects the optical axis AX1 to the optical axis AX2 by 90°. The light is deflected accordingly and the second intermediate image IMG2 is formed. The deflective reflector FM1 is arranged between the second and third imaging optical systems, but preferably it is arranged between the second intermediate image IMG2 and the reciprocating optical system part L2 as shown in the instant embodiment. The instant embodiment makes the deflective reflector of a plane mirror.

The third imaging optical system Gr3 includes a dioptric lens group L3A having a positive refractive power and a dioptric lens group L3B having a positive refractive power. The dioptric lens group L3A having a positive refractive power includes, along a direction of light traveling from the second imaging optical system Gr2, a meniscus positive lens L311 with its concave surface oriented toward the side of the second intermediate image IMG2, an approximately planoconvex positive lens L312 with its approximately flat surface oriented toward the side of the second intermediate image IMG2, and an approximately planoconvex positive lens L313 with its approximately flat surface oriented toward the side of the second deflective reflector FM2. The dioptric lens group L3B having a positive refractive power includes a meniscus positive lens L314 with its concave surface oriented toward a side of the second object 102, an approximately planoconcave negative lens L315 with its concave surface oriented toward the side of the second object 102, a biconcave aspheric negative lens L316, a meniscus positive lens L317 with its convex surface oriented toward a side opposite to the second object, an approximately planoconvex positive lens L318 with its flat surface oriented toward the second object 102 side, a biconvex aspheric positive lens L319, an approximately planoconcave negative lens L320 with its concave surface oriented toward a side opposite to the second object, a biconvex aspheric positive lens L321, an aperture stop 103, a biconvex positive lens L322, an approximately planoconvex aspheric positive lens L323 with its convex surface oriented toward a side opposite to the second object 102, a meniscus aspheric positive lens L324 with its concave surface oriented toward the second object side, and an approximately planoconvex positive lens L325 with its flat surface oriented toward the second object 102 side. A second deflective reflector FM2 is arranged between the dioptric lens groups L3A and L3B in the third imaging optical system Gr3. The deflective reflector FM2 is a plane mirror in the instant embodiment, and deflects light reflected from the first deflective reflector in a predetermined direction.

The instant embodiment adopts a so-called immersion optical system that fills liquid between the final lens L325 and the second object 102.

The instant embodiment uses a projection magnification of ¼, a reference wavelength of 193 nm, and calcium fluoride as a glass material. An image-side numerical aperture is NA=1.30. An object-image distance (the first object surface to the second object surface) is L=1759 mm. An aberration-corrected object point in a range of about 3.0 to 14.0 mm secures a rectangular exposure area of at least about 17 mm long and about 8.1 mm wide. A slit shape in the exposure area is not limited to a rectangle and may use an arc shape or another shape. The aperture stop 103 is located between L321 and L322.

Figure 23:
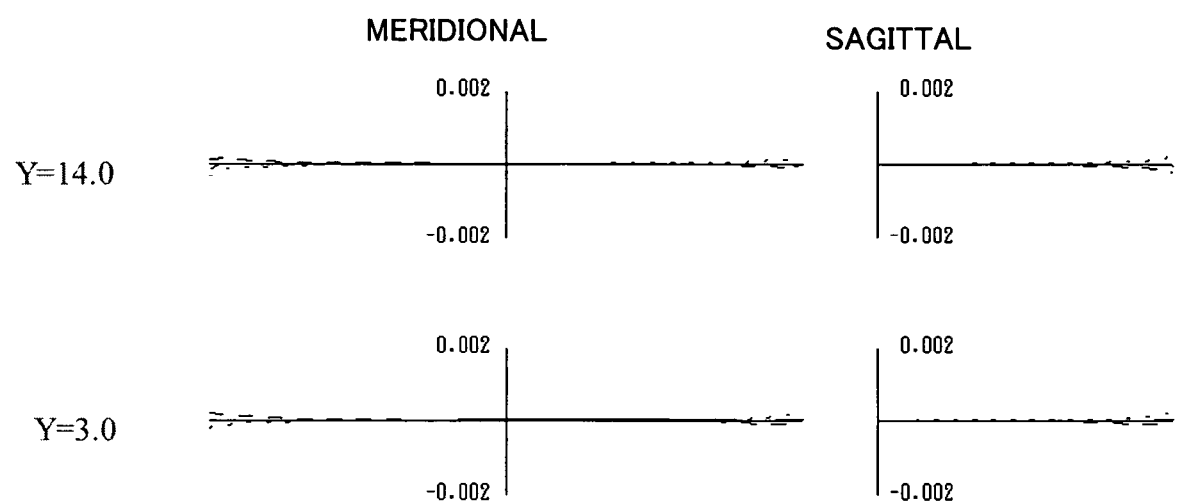
FIG. 23 is an aberrational diagram of the seventh embodiment according to the present invention.

FIG. 23 shows a lateral aberration diagram of the instant embodiment. The part with Y=3.0 in FIG. 23 shows a lateral aberration diagram for light from an off-axis area that has an image point of 3.0 mm in the second object. On the other hand, the part with Y=14.0 shows a lateral aberration diagram for light from an off-axis area that has an image point of 14.0 mm in the second object. FIG. 23 shows a wavelength with a reference wavelength of 193.0 nm±0.2 pm. Understandably, monochrome and chromatic aberrations are satisfactorily corrected.

Eighth Embodiment

Figure 20:
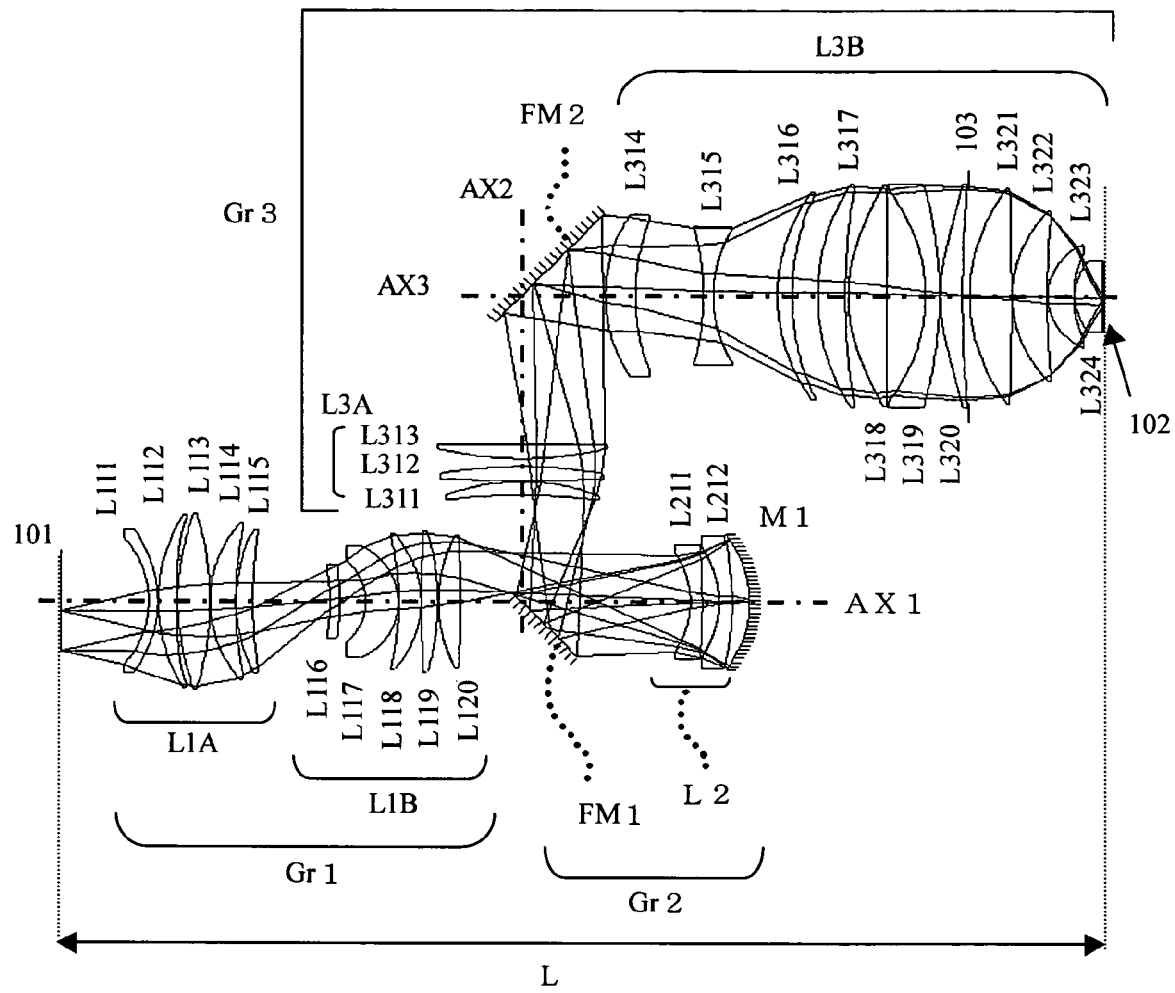
FIG. 20 is an optical-path diagram of a catadioptric projection optical system of an eighth embodiment according to the present invention.

FIG. 20 shows a specific lens configuration of the eighth embodiment. In FIG. 20, the first imaging optical system includes, in order from the first object side, a dioptric lens group L1A having a positive refractive power and a dioptric lens group L1B having a positive refractive power. The dioptric lens group L1A having a positive refractive power includes, along a direction of light traveling from the side of the first object 101, a meniscus negative lens L111 with its concave surface oriented toward the first object side, a meniscus aspheric positive lens L112 with its convex surface oriented toward the first object side, a biconvex positive lens L113, and two meniscus positive lenses L114 and L115 with their convex surfaces oriented toward the first object side. The lens group L1B having a positive power includes a meniscus negative lens L116 with its concave surface oriented toward the first object, two meniscus positive lenses L117 and L118 with their concave surfaces oriented toward the first object side, an approximately planoconvex positive lens L119 with its approximately flat surface oriented toward the first object side, and an approximately planoconvex aspheric positive lens L120 with its convex surface oriented toward the first object side.

The second imaging optical system Gr2 includes a reciprocating optical system part L2 having a negative refractive power and a concave mirror M1. It includes, along a direction of light traveling from the first imaging optical system Gr1, a meniscus negative lens L211 with its convex surface oriented toward the first object side, a meniscus aspheric concave lens L212 with its concave surface oriented toward the first object side, and a concave mirror M1 with its concave surface oriented toward the first object side. The light from the first imaging optical system Gr1 enters the reciprocating optical system part L2, then is reflected at the concave mirror M1, and reenters the reciprocating optical system part L2. Then the reflective element FM1 deflects the optical axis AX1 to the optical axis AX2 by 90°. The light is deflected accordingly and the second intermediate image IMG2 is formed. The deflective reflector FM1 is arranged between the second and third imaging optical systems, but preferably it is arranged between the second intermediate image IMG2 and the reciprocating optical system part L2 as shown in the instant embodiment. The instant embodiment makes the deflective reflector of a plane mirror.

The third imaging optical system Gr3 includes a dioptric lens group L3A having a positive refractive power and a dioptric lens group L3B having a positive refractive power. The dioptric lens group L3A having a positive refractive power includes, along a direction of light traveling from the second imaging optical system Gr2, a meniscus positive lens L311 with its concave surface oriented toward the side of the second intermediate image IMG2, an approximately planoconvex positive lens L312 with its approximately flat surface oriented toward the side of the second intermediate image IMG2, and an approximately planoconvex positive lens L313 with its approximately flat surface oriented toward the side of the second deflective reflector FM2. The dioptric lens group L3B having a positive refractive power includes a meniscus positive lens L314 with its concave surface oriented toward the second object 102 side, a biconcave aspheric negative lens L315, two meniscus positive lenses L316 and L317 with their convex surfaces oriented toward a side opposite to the second object, an approximately planoconvex aspheric positive lens L318 with its flat surface oriented toward the second object 102 side, a meniscus negative lens L319 with its concave surface oriented toward a side opposite to the second object, an approximately planoconvex aspheric positive lens L320 with its flat surface oriented toward the second object 102 side, an aperture stop 103, an approximately planoconvex positive lens L321 with its convex surface oriented toward a side opposite to the second object side 102, a meniscus aspheric positive lens L322 with its convex surface oriented toward the second object 102, a meniscus aspheric positive lens L323 with its concave surface oriented toward the second object 102, and an approximately planoconvex positive lens L324 with its flat surface oriented toward the second object 102 side. A second deflective reflector FM2 is arranged between the dioptric lens groups L3A and L3B in the third imaging optical system Gr3.

The instant embodiment also adopts a so-called immersion optical system that fills liquid between the final lens L324 and the second object 102.

The instant embodiment uses a projection magnification of ⅙, a reference wavelength of 193 nm, and calcium fluoride and quartz as a glass material. An image-side numerical aperture is NA=1.30. An object-image distance (the first object surface to the second object surface) is L=1704.76 mm. An aberration-corrected object point in a range of about 2.75 to 13.75 mm secures a rectangular exposure area of at least about 17 mm long and about 8 mm wide. The aperture stop 103 is located between L320 and L321.

Figure 24:
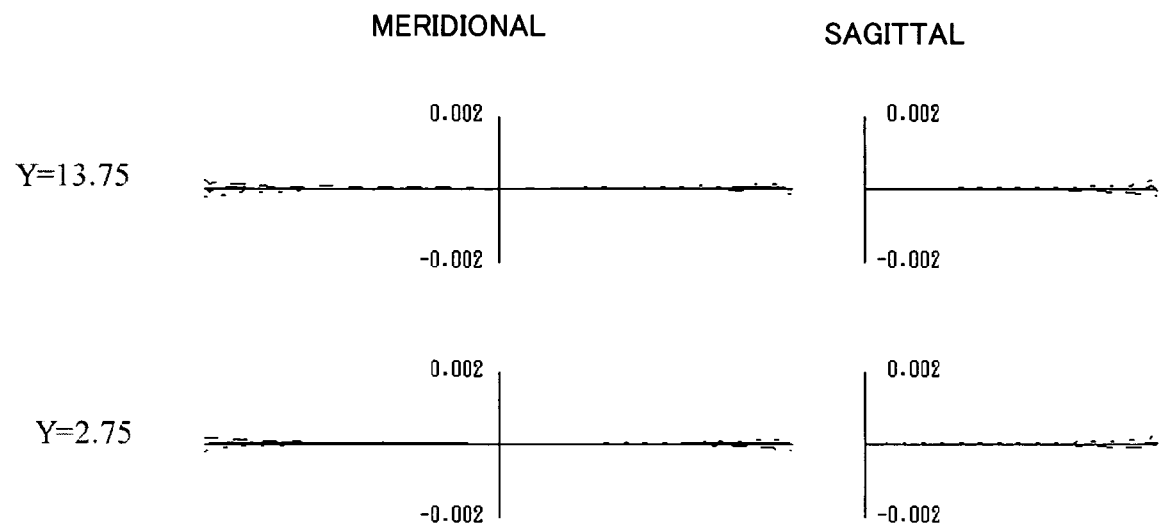
FIG. 24 is an aberrational diagram of the eighth embodiment according to the present invention.

FIG. 24 shows a lateral aberration diagram of the instant embodiment. The part with Y=2.75 in FIG. 24 shows a lateral aberration diagram for light from an off-axis area that has an image point of 2.75 mm in the second object. On the other hand, the part with Y=13.75 shows a lateral aberration diagram for light from an off-axis area that has an image point of 13.75 mm in the second object. FIG. 24 shows a wavelength with a reference wavelength of 193.0 nm±0.2 pm. Understandably, monochrome and chromatic aberrations are satisfactorily corrected.

Ninth Embodiment

Figure 21:
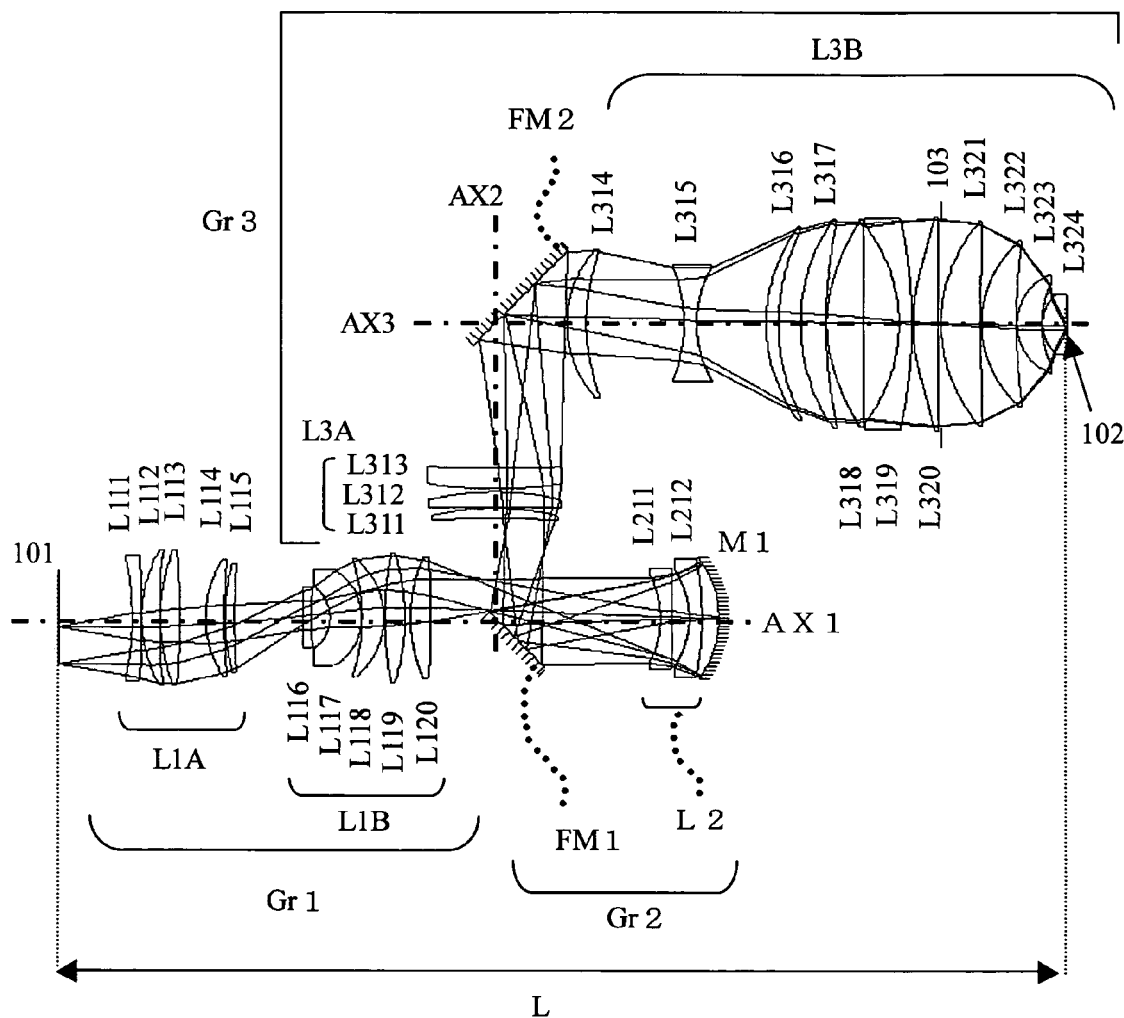
FIG. 21 is an optical-path diagram of a catadioptric projection optical system of a ninth embodiment according to the present invention.

FIG. 21 shows a specific lens configuration of the ninth embodiment. In FIG. 21, the first imaging optical system includes, in order from the first object side, a dioptric lens group L1A having a positive refractive power and a dioptric lens group L1B having a positive refractive power. The dioptric lens group L1A having a positive refractive power includes, along a direction of light traveling from the side of the first object 101, an approximately planoconcave negative lens L111 with its concave surface oriented toward the first object side, an approximately planoconvex aspheric positive lens L112 with its convex surface oriented toward the first object side, a biconvex positive lens L113, and two approximately planoconvex positive lenses L114 and L115 with their convex surfaces oriented toward the first object side. The lens group L1B having a positive power includes an approximately meniscus negative lens L116 with its concave surface oriented toward a side opposite to the first object, a meniscus negative lens L117 with its concave surface oriented toward the first object side, a meniscus positive lens L118 with its concave surface oriented toward the first object side, a biconvex positive lens L119, and an approximately planoconvex aspheric positive lens L120 with its convex surface oriented toward the first object side.

The second imaging optical system Gr2 includes a reciprocating optical system part L2 having a negative refractive power and a concave mirror M1. It includes, along a direction of light traveling from the first imaging optical system Gr1, an approximately planoconcave negative lens L211 with its concave surface oriented toward the first object side, a meniscus aspheric concave lens L212 with its concave surface oriented toward the first object side, and a concave mirror M1 with its concave surface oriented toward the first object side. The light from the first imaging optical system Gr1 enters the reciprocating optical system part L2, then is reflected at the concave mirror M1, and reenters the reciprocating optical system part L2. Then the reflective element FM1 deflects the optical axis AX1 to the optical axis AX2 by 90°. The light is deflected accordingly and the second intermediate image IMG2 is formed. The deflective reflector FM1 is arranged between the second and third imaging optical systems, but preferably it is arranged between the second intermediate image IMG2 and the reciprocating optical system part L2 as shown in the instant embodiment.

The third imaging optical system Gr3 includes a dioptric lens group L3A having a positive refractive power and a dioptric lens group L3B having a positive refractive power. The dioptric lens group L3A having a positive refractive power includes, along a direction of light traveling from the second imaging optical system Gr2, an approximately planoconvex positive lens L311 with its approximately flat surface oriented toward the side of the second intermediate image IMG2, an approximately planoconvex positive lens L312 with its approximately flat surface oriented toward the side of the second intermediate image IMG2, and an approximately planoconvex positive lens L313 with its approximately flat surface oriented toward the side of the second deflective reflector FM2. The dioptric lens group L3B having a positive refractive power includes a meniscus positive lens L314 with its concave surface oriented toward the second object 102 side, a biconcave aspheric negative lens L315, two meniscus positive lenses L316 and L317 with their convex surfaces oriented toward a side opposite to the second object, an approximately planoconvex aspheric positive lens L318 with its flat surface oriented toward the second object 102 side, a meniscus negative lens L319 with its concave surface oriented toward a side opposite to the second object, an approximately planoconcave aspheric positive lens L320 with its approximately flat surface oriented toward the second object 102 side, an aperture stop 103, an approximately planoconvex positive lens L321 with its convex surface oriented toward a side opposite to the second object side 102, two meniscus aspheric positive lenses L322 and L323 with their convex surfaces oriented toward a side opposite to the second object 102, and an approximately planoconvex positive lens L324 with its flat surface oriented toward the second object 102 side. A second deflective reflector FM2 is arranged between the dioptric lens groups L3A and L3B in the third imaging optical system Gr3.

The instant embodiment also adopts a so-called immersion optical system that fills liquid between the final lens L324 and the second object 102.

The instant embodiment uses a projection magnification of ⅛, a reference wavelength of 193 nm, and calcium fluoride and quartz as a glass material. An image-side numerical aperture is NA=1.35. An object-image distance (the first object surface to the second object surface) is L=1753.2 mm. An aberration-corrected object point in a range of about 2.06 to 10.3 mm secures a rectangular exposure area of at least about 13 mm long and about 5.9 mm wide. The aperture stop 103 is located between L320 and L321.

Figure 25:
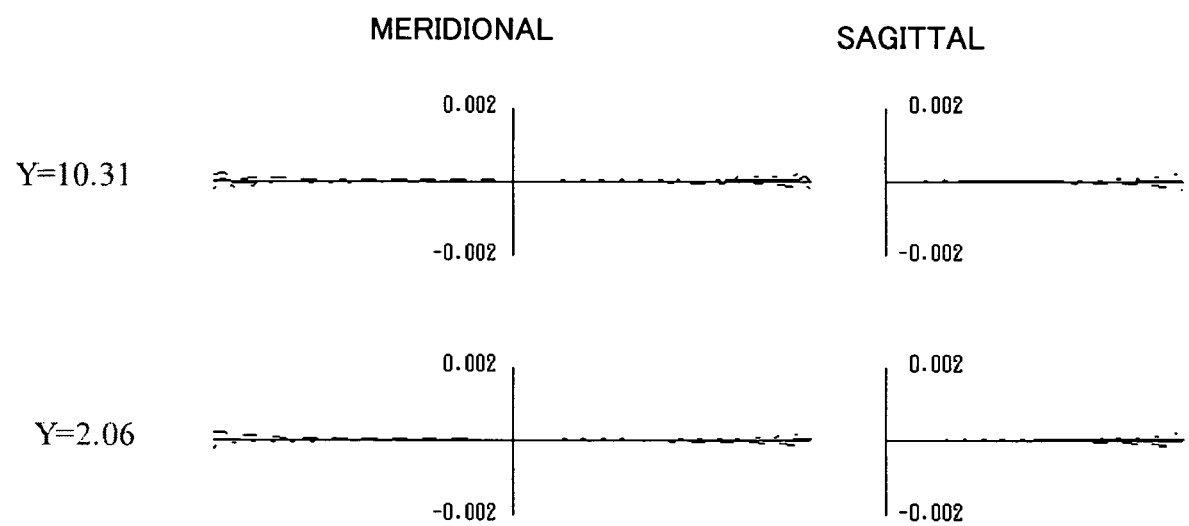
FIG. 25 is an aberrational diagram of the ninth embodiment according to the present invention.

FIG. 25 shows a lateral aberration diagram of the instant embodiment. The part with Y=2.06 in FIG. 25 shows a lateral aberration diagram for light from an off-axis area that has an image point of 2.06 mm in the second object. On the other hand, the part with Y=10.3 shows a lateral aberration diagram for light from an off-axis area that has an image point of 10.3 mm in the second object. FIG. 25 shows a wavelength with a reference wavelength of 193.0 nm±0.2 pm. Understandably, monochrome and chromatic aberrations are satisfactorily corrected.

The following Tables 11 and 12 show a specification of numerical examples of the sixth embodiment. The following Tables 13 and 14 show a specification of numerical examples of the seventh embodiment. The following Tables 15 and 16 show a specification of numerical examples of the eighth embodiment. The following Tables 17 and 18 show a specification of numerical examples of the ninth embodiment. Since symbols in each table are similar to those in tables 1 and 2, a description thereof will be omitted.

The lens's glass materials $SiO_2$ and $CaF_2$ and water (preferably pure water) have refractive indexes of 1.5609, 1.5018 and 1.437, respectively, to a reference wavelength $\lambda=193.0$ nm. $SiO_2$ has refractive indexes of 1.56089968 and 1.56090031 to wavelengths of the reference wavelength +0.2 pm and −0.2 pm. $CaF_2$ has refractive indexes of 1.5079980 and 1.50180019 to these wavelengths. Water has refractive indexes of 1.43699576 and 1.437000424 to these wavelengths.

TABLE 11

L = 1663.38 mm
β = ¼
NA = 1.2
|β1 · β2| = 1.58004
|β1| = 1.14442
|β2| = 1.38065
P1 = 0.007888
P2 = −0.018174
P3 = 0.010286
(φGr2__max + φL3B__max)/(2Y) = 0.452
hM1/φM1 = 0.016428
θp = 32.04~42.53
| (β1 · β2) |/NAo = 5.2668
DISTANCE FROM FIRST OBJECT~FIRST SURFACE: 64.34385 mm

| i | ri | di | glass material |
|---|---|---|---|
| 1 | −149.75183 | 26.09099 | SiO2 |
| 2 | −218.44939 | 1.00000 | |
| 3 | 2396.67702 | 28.97069 | SiO2 |
| 4 | −396.73989 | 1.00000 | |
| 5 | 516.09139 | 35.82029 | SiO2 |
| 6 | −430.33907 | 10.84902 | |
| 7 | 223.12587 | 48.98928 | SiO2 |
| 8 | 1383.40789 | 1.00000 | |
| 9 | 134.00369 | 35.81423 | SiO2 |
| 10 | 366.50519 | 63.92927 | |
| 11 | −1122.06589 | 54.62215 | SiO2 |
| 12 | −19313.59036 | 71.93406 | |
| 13 | −113.02146 | 55.79289 | SiO2 |
| 14 | −120.15251 | 23.90335 | |
| 15 | −374.64398 | 41.20793 | SiO2 |
| 16 | −201.97208 | 1.00000 | |
| 17 | −1488.50492 | 43.36950 | SiO2 |
| 18 | −266.74881 | 1.00000 | |
| 19 | 232.61873 | 46.79106 | SiO2 |
| 20 | −15265.01733 | 423.31789 | |
| 21 | −165.60762 | 18.00000 | SiO2 |
| 22 | 2610.25929 | 43.00000 | |
| 23 | −141.52101 | 18.44904 | SiO2 |
| 24 | −384.71896 | 39.37247 | |
| 25 | −193.24884 | −39.37247 | M1 |
| 26 | −384.71896 | −18.44904 | SiO2 |
| 27 | −141.52101 | −43.00000 | |
| 28 | 2610.25929 | −18.00000 | SiO2 |

TABLE 11-continued

L = 1663.38 mm  
β = ¼  
NA = 1.2  
|β1 · β2| = 1.58004  
|β1| = 1.14442  
|β2| = 1.38065  
P1 = 0.007888  
P2 = −0.018174  
P3 = 0.010286  
(φGr2_max + φL3B_max)/(2Y) = 0.452  
hM1/φM1 = 0.016428  
θp = 32.04~42.53  
| (β1 · β2) |/NAo = 5.2668  
DISTANCE FROM FIRST OBJECT~FIRST SURFACE: 64.34385 mm

| i  | ri          | di         | glass material |
|----|-------------|------------|----------------|
| 29 | −165.60762  | −306.43207 |                |
| 30 | 0.00000     | 247.45784  | FM1            |
| 31 | −735.00000  | 23.74583   | SiO2           |
| 32 | −380.56645  | 1.00000    |                |
| 33 | −7249.20270 | 26.11788   | SiO2           |
| 34 | −644.97780  | 1.00000    |                |
| 35 | 640.81989   | 32.87887   | SiO2           |
| 36 | −3860.84472 | 291.02056  |                |
| 37 | 0.00000     | −153.00000 | FM2            |

TABLE 12

| i  | ri            | di         | GLASS MATERIAL |
|----|---------------|------------|----------------|
| 38 | −220.86072    | −49.01253  | SiO2           |
| 39 | −690.16770    | −72.88062  |                |
| 40 | −3677.96730   | −18.00000  | SiO2           |
| 41 | −151.94597    | −71.35735  |                |
| 42 | 577.21695     | −18.00000  | SiO2           |
| 43 | −610.59831    | −15.33267  |                |
| 44 | −252.17496    | −15.89391  | SiO2           |
| 45 | −300.51060    | −38.31824  |                |
| 46 | −292.80069    | −35.43518  | SiO2           |
| 47 | −950.77179    | −1.00000   |                |
| 48 | −245.97037    | −53.99831  | SiO2           |
| 49 | 2057.28159    | −38.92896  |                |
| 50 | 283.55268     | −25.00000  | SiO2           |
| 51 | −355227.48486 | −1.00000   |                |
| 52 | −328.66462    | −37.86513  | SiO2           |
| 53 | 2983.96320    | −1.02024   |                |
| 54 | 0.00000       | −10.11169  | APERTURE STOP  |
| 55 | −390.72131    | −47.65150  | SiO2           |
| 56 | 1425.98062    | −9.92855   |                |
| 57 | −193.76429    | −62.50116  | SiO2           |
| 58 | 1899.01565    | −3.72073   |                |
| 59 | −98.05750     | −49.82863  | SiO2           |
| 60 | −185.70257    | −1.00000   |                |
| 61 | −104.55853    | −55.79289  | SiO2           |
| 62 | 0.00000       | −2.49568   | water          | aspherical surfaces

| i  | K            | A             | B             | C             |
|----|--------------|---------------|---------------|---------------|
| 4  | 1.401232E+00 | 1.491470E−08  | 2.579155E−13  | 3.658922E−18  |
| 19 | 5.274387E−01 | −1.257756E−08 | −2.155703E−13 | −3.965950E−18 |
| 23 | −1.364948E−01| 1.701040E−08  | 1.028792E−12  | 4.633252E−17  |
| 27 | −1.364948E−01| 1.701040E−08  | 1.028792E−12  | 4.633252E−17  |
| 43 | 9.591215E−02 | 1.241258E−10  | −5.097072E−14 | 8.978586E−19  |
| 48 | −1.006751E+00| 6.714909E−09  | 6.101093E−14  | 1.038240E−18  |
| 52 | −4.188964E−01| 2.347743E−08  | −8.697596E−14 | 1.622228E−18  |
| 57 | −1.722694E−01| 1.154097E−08  | −6.055947E−14 | −1.460241E−19 |
| 60 | 1.334718E+00 | −4.883784E−08 | −4.310300E−12 | 6.151464E−16  |

TABLE 12-continued

| i | D | E | F | G |
|---|---|---|---|---|
| 4 | 1.035637E−22 | −1.451560E−26 | 9.064770E−31 | −2.572115E−35 |
| 19 | −5.061930E−23 | −4.372997E−27 | 1.311557E−31 | −5.268035E−36 |
| 23 | 1.448171E−21 | 1.178716E−25 | −4.598562E−30 | 4.060472E−34 |
| 27 | 1.448171E−21 | 1.178716E−25 | −4.598562E−30 | 4.060472E−34 |
| 43 | 6.643640E−23 | 1.503646E−27 | −1.697847E−31 | −5.610523E−36 |
| 48 | 5.999548E−23 | 1.557171E−28 | −9.523159E−33 | 7.662435E−37 |
| 52 | −2.628677E−22 | 8.092818E−27 | −1.071834E−31 | 5.817902E−37 |
| 57 | 4.475631E−22 | 1.797305E−26 | −1.010578E−30 | 1.323077E−35 |
| 60 | −6.867197E−20 | 1.145948E−23 | −7.688950E−28 | 2.337414E−32 |

TABLE 13

L = 1759 mm
$\beta = 1/4$
NA = 1.3
$|\beta1 \cdot \beta2| = 2.344921$
$|\beta1| = 1.542679$
$|\beta2| = 1.520032$
P1 = 0.007527
P2 = −0.018044
P3 = 0.010518
$(\phi Gr2\_max + \phi L3B\_max)/(2Y) = 0.441$
$hM1/\phi M1 = 0.01994$
$\theta p = 33.14 \sim 42.52$
$|(\beta1 \cdot \beta2)|/NAo = 7.2151$
DISTANCE FROM FIRST OBJECT~FIRST SURFACE: 45.17502 mm

| i | ri | di | GLASS MATERIAL |
|---|---|---|---|
| 1 | −163.55145 | 40.20723 | SiO2 |
| 2 | −359.84795 | 1.00000 | |
| 3 | 626.20592 | 22.39508 | SiO2 |
| 4 | −405.00000 | 1.00000 | |
| 5 | 399.06366 | 28.85880 | CaF2 |
| 6 | −653.82642 | 1.00000 | |
| 7 | 241.35887 | 37.11570 | SiO2 |
| 8 | −951.60096 | 42.42890 | |
| 9 | 120.13808 | 50.00000 | SiO2 |
| 10 | 949.99519 | 21.58565 | |
| 11 | −720.92407 | 50.00000 | SiO2 |
| 12 | 1601.86158 | 69.82644 | |
| 13 | −81.61049 | 50.00000 | SiO2 |
| 14 | −105.00000 | 80.96225 | |
| 15 | −333.25886 | 50.00000 | SiO2 |
| 16 | −198.02368 | 1.00000 | |
| 17 | −3973.53837 | 44.82861 | CaF2 |
| 18 | −304.90999 | 1.00000 | |

TABLE 13-continued

L = 1759 mm
$\beta = 1/4$
NA = 1.3
$|\beta1 \cdot \beta2| = 2.344921$
$|\beta1| = 1.542679$
$|\beta2| = 1.520032$
P1 = 0.007527
P2 = −0.018044
P3 = 0.010518
$(\phi Gr2\_max + \phi L3B\_max)/(2Y) = 0.441$
$hM1/\phi M1 = 0.01994$
$\theta p = 33.14 \sim 42.52$
$|(\beta1 \cdot \beta2)|/NAo = 7.2151$
DISTANCE FROM FIRST OBJECT~FIRST SURFACE: 45.17502 mm

| i | ri | di | GLASS MATERIAL |
|---|---|---|---|
| 19 | 275.32316 | 50.87725 | CaF2 |
| 20 | −1869.89917 | 526.38065 | |
| 21 | −216.40277 | 16.34450 | SiO2 |
| 22 | 647.47738 | 45.17972 | |
| 23 | −144.10382 | 17.97700 | SiO2 |
| 24 | −464.80018 | 39.11417 | |
| 25 | −196.61753 | −39.11417 | M1 |
| 26 | −464.80018 | −17.97700 | SiO2 |
| 27 | −144.10382 | −45.17972 | |
| 28 | 647.47738 | −16.34450 | SiO2 |
| 29 | −216.40277 | −445.88654 | |
| 30 | 0.00000 | 229.90650 | FM1 |
| 31 | −1262.48951 | 22.83870 | SiO2 |
| 32 | −540.95423 | 1.00000 | |
| 33 | 5306.05887 | 25.93914 | SiO2 |
| 34 | −966.16176 | 1.00000 | |
| 35 | 785.96285 | 31.80902 | SiO2 |
| 36 | −3720.18615 | 386.30091 | |
| 37 | 0.00000 | −163.96908 | FM2 |

TABLE 14

| i | ri | di | GLASS MATERIAL |
|---|---|---|---|
| 38 | −211.23856 | −43.25638 | SiO2 |
| 39 | −434.04046 | −113.09484 | |
| 40 | −6008.82934 | −18.00000 | SiO2 |
| 41 | −155.41531 | −74.07301 | |
| 42 | 645.49454 | −18.00000 | SiO2 |
| 43 | −734.52030 | −55.67757 | |
| 44 | −290.87337 | −15.37576 | SiO2 |
| 45 | −337.78602 | −30.06546 | |
| 46 | −346.14457 | −44.99901 | SiO2 |
| 47 | −2057.50280 | −1.00000 | |
| 48 | −301.88346 | −65.97155 | SiO2 |
| 49 | 940.17883 | −40.10072 | |
| 50 | 305.94369 | −23.78347 | SiO2 |
| 51 | 3176.73354 | −1.00000 | |

TABLE 14-continued

| | | | |
|---|---|---|---|
| 52 | −367.85832 | −50.82828 | SiO2 |
| 53 | 1232.69785 | −1.00000 | |
| 54 | 0.00000 | −1.00810 | APERTURE STOP |
| 55 | −376.13288 | −64.87849 | SiO2 |
| 56 | 1468.96802 | −1.00000 | |
| 57 | −199.03661 | −65.00145 | SiO2 |
| 58 | 12769.93730 | −1.00000 | |
| 59 | −91.80284 | −45.69624 | SiO2 |
| 60 | −180.85062 | −1.00000 | |
| 61 | −88.05912 | −48.98059 | CaF2 |
| 62 | 0.00000 | −0.48376 | water | aspherical surfaces

| i | K | A | B | C |
|---|---|---|---|---|
| 4 | −8.457059E−01 | 3.730962E−08 | 6.941040E−13 | 4.119594E−18 |
| 19 | 8.631092E−01 | −1.076495E−08 | −1.450559E−13 | −2.255607E−18 |
| 23 | −2.099377E−01 | 1.960978E−08 | 1.240831E−12 | 5.572912E−17 |
| 27 | −2.099377E−01 | 1.960978E−08 | 1.240831E−12 | 5.572912E−17 |
| 43 | 1.933946E+01 | −1.186250E−08 | −2.597548E−13 | −1.393731E−17 |
| 48 | −7.834348E−01 | 5.135736E−09 | 1.305507E−13 | −9.684862E−19 |
| 52 | −6.051382E−02 | 2.155030E−08 | −7.945184E−14 | 2.282806E−18 |
| 57 | −2.118548E−01 | 9.876014E−09 | 2.499851E−15 | −7.651280E−18 |
| 60 | 9.389581E−01 | −3.706946E−08 | −5.025562E−12 | 6.705793E−16 |

| i | D | E | F | G |
|---|---|---|---|---|
| 4 | 3.880816E−22 | −1.180363E−25 | 8.990058E−30 | −2.630036E−34 |
| 19 | −2.209803E−23 | −2.067162E−27 | 5.778163E−32 | −1.858768E−36 |
| 23 | 1.981631E−21 | 7.947697E−26 | 2.209766E−30 | 7.635654E−35 |
| 27 | 1.981631E−21 | 7.947697E−26 | 2.209766E−30 | 7.635654E−35 |
| 43 | −8.816454E−23 | −6.459428E−26 | 3.206873E−30 | −2.320899E−34 |
| 48 | 7.766507E−23 | −1.209707E−27 | 2.935626E−32 | −1.925350E−37 |
| 52 | −2.592429E−22 | 7.085388E−27 | −8.300162E−32 | 3.730985E−37 |
| 57 | 3.142967E−22 | 3.052543E−26 | −1.178103E−30 | 1.295929E−35 |
| 60 | −8.669953E−20 | 1.437866E−23 | −1.256408E−27 | 5.393982E−32 |

TABLE 15

L = 1704.76 mm
β = ⅙
NA = 1.3
|β1 · β2| = 1.298113
|β1| = 0.896756
|β2| = 1.447565
P1 = 0.007539
P2 = −0.019031
P3 = 0.011492
(φGr2_max + φL3B_max)/(2Y) = 0.57
hM1/φM1 = 0.02568
θp = 31.81~42.43
| (β1 · β2) |/NAo = 5.9913
DISTANCE FROM FIRST OBJECT~FIRST SURFACE: 145.94546 mm

| i | ri | di | GLASS MATERIAL |
|---|---|---|---|
| 1 | −154.28700 | 15.00000 | SiO2 |
| 2 | −196.67456 | 1.00000 | |
| 3 | 271.02074 | 30.66734 | SiO2 |
| 4 | 3307.51664 | 1.00000 | |
| 5 | 413.33733 | 52.66500 | SiO2 |
| 6 | −494.51307 | 1.00000 | |
| 7 | 195.58448 | 41.17963 | SiO2 |
| 8 | 596.55890 | 1.00000 | |
| 9 | 255.65356 | 27.18086 | SiO2 |
| 10 | 779.93188 | 125.52779 | |
| 11 | −279.35189 | 15.00000 | SiO2 |
| 12 | −519.58501 | 42.92339 | |
| 13 | −85.40352 | 53.38301 | SiO2 |
| 14 | −99.37546 | 1.00000 | |
| 15 | −448.36094 | 36.61211 | SiO2 |
| 16 | −164.25892 | 1.00000 | |
| 17 | 2393.93825 | 26.68106 | SiO2 |
| 18 | −397.60573 | 1.00000 | |
| 19 | 227.34498 | 36.35167 | SiO2 |
| 20 | −1683.66137 | 373.74735 | |
| 21 | −143.15737 | 19.53570 | SiO2 |
| 22 | −1119.01014 | 27.55110 | |
| 23 | −146.62325 | 21.17304 | SiO2 |
| 24 | −472.87721 | 28.24428 | |
| 25 | −177.44307 | −28.24428 | M1 |
| 26 | −472.87721 | −21.17304 | SiO2 |
| 27 | −146.62325 | −27.55110 | |
| 28 | −1119.01014 | −19.53570 | SiO2 |
| 29 | −143.15737 | −274.51119 | |
| 30 | 0.00000 | 175.55596 | FM1 |
| 31 | −1007.86975 | 22.51471 | SiO2 |
| 32 | −350.68784 | 1.31349 | |

TABLE 15-continued

L = 1704.76 mm
β = ⅙
NA = 1.3
|β1 · β2| = 1.298113
|β1| = 0.896756
|β2| = 1.447565
P1 = 0.007539
P2 = −0.019031
P3 = 0.011492
(φGr2_max + φL3B_max)/(2Y) = 0.57
hM1/φM1 = 0.02568
θp = 31.81~42.43
| (β1 · β2) |/NAo = 5.9913
DISTANCE FROM FIRST OBJECT~FIRST
SURFACE: 145.94546 mm

| i | ri | di | GLASS MATERIAL |
|---|---|---|---|
| 33 | 2593.33387 | 23.65495 | SiO2 |
| 34 | −731.02692 | 15.16668 | |
| 35 | 567.38767 | 23.75420 | SiO2 |
| 36 | 23428.27016 | 245.78935 | |
| 37 | 0.00000 | −135.18935 | FM2 |

TABLE 16

| i | ri | di | GLASS MATERIAL |
|---|---|---|---|
| 38 | −237.46337 | −48.94270 | SiO2 |
| 39 | −345.85731 | −111.65040 | |
| 40 | 417.56614 | −16.35639 | SiO2 |
| 41 | −219.30461 | −104.37575 | |
| 42 | −290.48971 | −22.94275 | SiO2 |
| 43 | −386.22049 | −42.36333 | |
| 44 | −335.82829 | −45.51854 | SiO2 |
| 45 | −1059.63870 | −5.00240 | |
| 46 | −267.22081 | −63.25321 | SiO2 |
| 47 | 14661.61326 | −62.02904 | |
| 48 | 285.16620 | −23.32677 | SiO2 |
| 49 | 651.16397 | −1.00000 | |
| 50 | −280.63451 | −37.42811 | SiO2 |
| 51 | −2186.11909 | −10.40784 | |
| 52 | 0.00000 | −1.00000 | APERTURE STOP |
| 53 | −288.21530 | −68.22077 | SiO2 |
| 54 | 5967.10424 | −1.00000 | |
| 55 | −186.83016 | −57.59271 | SiO2 |
| 56 | −1369.28288 | −1.00000 | |
| 57 | −90.93232 | −41.79047 | SiO2 |
| 58 | −175.53158 | −1.62165 | |
| 59 | −85.37446 | −46.16012 | CaF2 |
| 60 | 0.00000 | −1.23285 | water | aspherical surfaces

| i | K | A | B | C |
|---|---|---|---|---|
| 4 | 1.295067E+02 | 3.297417E−08 | 5.500704E−14 | 6.229347E−19 |
| 19 | 1.102358E+00 | −2.108264E−08 | −4.785323E−13 | −1.257926E−17 |
| 23 | −5.735946E−02 | 3.096093E−08 | 1.359473E−12 | 5.790890E−17 |
| 27 | −5.735946E−02 | 3.096093E−08 | 1.359473E−12 | 5.790890E−17 |
| 41 | 1.491604E−01 | −3.998720E−09 | 1.165315E−13 | −4.222672E−18 |
| 46 | −6.748458E−01 | 3.981173E−09 | 8.065036E−14 | −4.459159E−19 |
| 50 | −8.293088E−01 | 2.629535E−08 | −2.446508E−14 | −1.516995E−18 |
| 55 | −1.646877E−01 | 8.027696E−09 | −5.338898E−13 | −6.351902E−19 |
| 58 | 1.115290E+00 | −2.683821E−08 | −7.764043E−12 | 1.332891E−15 |

TABLE 16-continued

| i | D | E | F | G |
|---|---|---|---|---|
| 4 | −8.172163E−23 | 1.084560E−27 | 1.203985E−32 | −3.711867E−37 |
| 19 | −1.258379E−22 | −4.061811E−26 | 2.042733E−30 | −9.262486E−35 |
| 23 | 1.064632E−21 | −1.427878E−26 | −9.529667E−30 | 1.289660E−33 |
| 27 | 1.064632E−21 | −1.427878E−26 | −9.529667E−30 | 1.289660E−33 |
| 41 | 6.525210E−22 | −2.932342E−26 | 2.234264E−31 | 1.397471E−35 |
| 46 | 3.297952E−23 | −5.241931E−29 | 3.252312E−34 | 1.200981E−37 |
| 50 | −3.173867E−22 | 1.131857E−26 | −1.516431E−31 | 7.642264E−37 |
| 55 | 1.440657E−21 | −4.741168E−26 | 1.648924E−30 | −2.164446E−35 |
| 58 | −2.073183E−19 | 2.737199E−23 | −1.861469E−27 | 5.739376E−32 |

TABLE 17

L = 1753.20 m
β = ⅛
NA = 1.35
|β1 · β2| = 0.996200
|β1| = 0.769355
|β2| = 1.294850
P1 = 0.007114
P2 = −0.019102
P3 = 0.011987
(φGr2_max + φL3B_max)/(2Y) = 0.555
hM1/φM1 = 0.01181
θp = 34.41~42.93
| (β1 · β2) |/NAo = 5.9034
DISTANCE FROM FIRST OBJECT~FIRST SURFACE: 130.20833 mm

| i | ri | di | GLASS MATERIAL |
|---|---|---|---|
| 1 | −486.56530 | 15.00096 | SiO2 |
| 2 | −3101.02582 | 1.00000 | |
| 3 | 231.06784 | 31.83036 | SiO2 |
| 4 | −332567.28878 | 1.00000 | |
| 5 | 323.02816 | 33.68869 | SiO2 |
| 6 | −1543.68665 | 44.93138 | |
| 7 | 189.51087 | 32.72995 | SiO2 |
| 8 | 1392.22713 | 1.00000 | |
| 9 | 379.15724 | 16.05595 | SiO2 |
| 10 | 1209.58329 | 118.79104 | |
| 11 | 907.52582 | 15.00000 | SiO2 |
| 12 | 573.25035 | 32.44034 | |
| 13 | −65.26274 | 54.35428 | SiO2 |
| 14 | −99.06292 | 1.00000 | |
| 15 | −311.87561 | 37.55720 | SiO2 |
| 16 | −135.08941 | 1.00495 | |
| 17 | 542.10439 | 34.59664 | SiO2 |
| 18 | −388.89034 | 9.50630 | |
| 19 | 251.45912 | 33.91586 | SiO2 |
| 20 | −2718.98055 | 400.89640 | |

TABLE 17-continued

L = 1753.20 m
β = ⅛
NA = 1.35
|β1 · β2| = 0.996200
|β1| = 0.769355
|β2| = 1.294850
P1 = 0.007114
P2 = −0.019102
P3 = 0.011987
(φGr2_max + φL3B_max)/(2Y) = 0.555
hM1/φM1 = 0.01181
θp = 34.41~42.93
| (β1 · β2) |/NAo = 5.9034
DISTANCE FROM FIRST OBJECT~FIRST SURFACE: 130.20833 mm

| i | ri | di | GLASS MATERIAL |
|---|---|---|---|
| 21 | −169.28348 | 21.21541 | SiO2 |
| 22 | −3584.89452 | 29.47604 | |
| 23 | −142.91647 | 21.65833 | SiO2 |
| 24 | −550.12289 | 29.06864 | |
| 25 | −176.45169 | −29.06864 | M1 |
| 26 | −550.12289 | −21.65833 | SiO2 |
| 27 | −142.91647 | −29.47604 | |
| 28 | −3584.89452 | −21.21541 | SiO2 |
| 29 | −169.28348 | −288.91741 | |
| 30 | 0.00000 | 173.92119 | FM1 |
| 31 | −1415.66719 | 17.77721 | SiO2 |
| 32 | −434.10960 | 1.06896 | |
| 33 | −12196.01923 | 27.71709 | SiO2 |
| 34 | −465.14226 | 5.06132 | |
| 35 | 747.67938 | 37.10629 | SiO2 |
| 36 | 5377.28976 | 252.60352 | |
| 37 | 0.00000 | −124.83676 | FM2 |

TABLE 18

| i | ri | di | GLASS MATERIAL |
|---|---|---|---|
| 38 | −192.86959 | −33.38633 | SiO2 |
| 39 | −325.47941 | −172.44662 | |
| 40 | 267.94200 | −21.92463 | SiO2 |
| 41 | −220.09999 | −119.52488 | |
| 42 | −284.81937 | −21.45152 | SiO2 |
| 43 | −364.34587 | −37.98167 | |
| 44 | −320.05394 | −44.49918 | SiO2 |
| 45 | −878.10201 | −1.00000 | |
| 46 | −262.55054 | −63.65972 | SiO2 |
| 47 | 26148.43280 | −62.35996 | |
| 48 | 284.13774 | −22.59832 | SiO2 |
| 49 | 838.82650 | −1.00000 | |

TABLE 18-continued

| | | | |
|---|---|---|---|
| 50 | −283.84333 | −45.24747 | SiO2 |
| 51 | −15023796.69980 | −3.00111 | |
| 52 | 0.00000 | −1.00000 | APERTURE STOP |
| 53 | −276.07517 | −67.68713 | SiO2 |
| 54 | −4860.73737 | −1.00000 | |
| 55 | −180.69277 | −61.07528 | SiO2 |
| 56 | −1039.35461 | −1.00000 | |
| 57 | −92.40826 | −44.33383 | SiO2 |
| 58 | −178.99277 | −1.00000 | |
| 59 | −67.93290 | −43.12765 | CaF2 |
| 60 | 0.00000 | −0.46939 | water | aspherical surfaces

| i | K | A | B | C |
|---|---|---|---|---|
| 4  | −2.147900E+07 | 3.749330E−08 | 1.970547E−13 | −2.130192E−19 |
| 19 | 1.778306E+00 | −2.384853E−08 | −5.523103E−13 | −1.265419E−17 |
| 23 | −7.011156E−02 | 3.208451E−08 | 1.390429E−12 | 7.954938E−17 |
| 27 | −7.011156E−02 | 3.208451E−08 | 1.390429E−12 | 7.954938E−17 |
| 41 | 4.504983E−01 | −1.169682E−08 | 1.259138E−13 | −9.817312E−18 |
| 46 | −6.849227E−01 | 4.022367E−09 | 8.088426E−14 | −5.198350E−19 |
| 50 | −7.958376E−01 | 2.601538E−08 | −1.250656E−14 | −1.750622E−18 |
| 55 | −1.882451E−01 | 8.953186E−09 | −4.314651E−13 | 6.563698E−19 |
| 58 | 9.996148E−01 | −1.704842E−08 | −1.032246E−11 | 1.856197E−15 |

| i | D | E | F | G |
|---|---|---|---|---|
| 4  | 8.247744E−23 | −8.260915E−27 | 4.824234E−31 | −8.680517E−36 |
| 19 | −8.833538E−22 | 5.242704E−26 | −5.020206E−30 | 9.805998E−35 |
| 23 | 8.854393E−22 | 7.262098E−25 | −1.812557E−28 | 1.120765E−32 |
| 27 | 8.854393E−22 | 7.262098E−25 | −1.812557E−28 | 1.120765E−32 |
| 41 | −2.250554E−22 | 8.556556E−26 | −1.082856E−29 | 4.475034E−34 |
| 46 | 3.368240E−23 | −1.600869E−28 | 5.355569E−33 | 1.335343E−38 |
| 50 | −3.218019E−22 | 1.144740E−26 | −1.528227E−31 | 7.672950E−37 |
| 55 | 1.296406E−21 | −5.351070E−26 | 1.891330E−30 | −2.153992E−35 |
| 58 | −2.893960E−19 | 3.321301E−23 | −2.068161E−27 | 5.463746E−32 |

The above first and ninth embodiments can be arbitrarily combined as long as there is no contradiction. In particular, making the projection optical systems shown in FIGS. 1, 2 and 7–11 of an immersion optical system is within a scope of the present invention and a combination between each numerical conditional equation and the above first and ninth embodiments is also within a scope of the present invention. This is true even when the projection optical systems of the first to ninth embodiments are incorporated with and used for tenth and eleventh embodiments.

Tenth Embodiment

A tenth embodiment is directed to an exemplified exposure apparatus to which a projection optical system in the above embodiments is applied.

Figure 26:
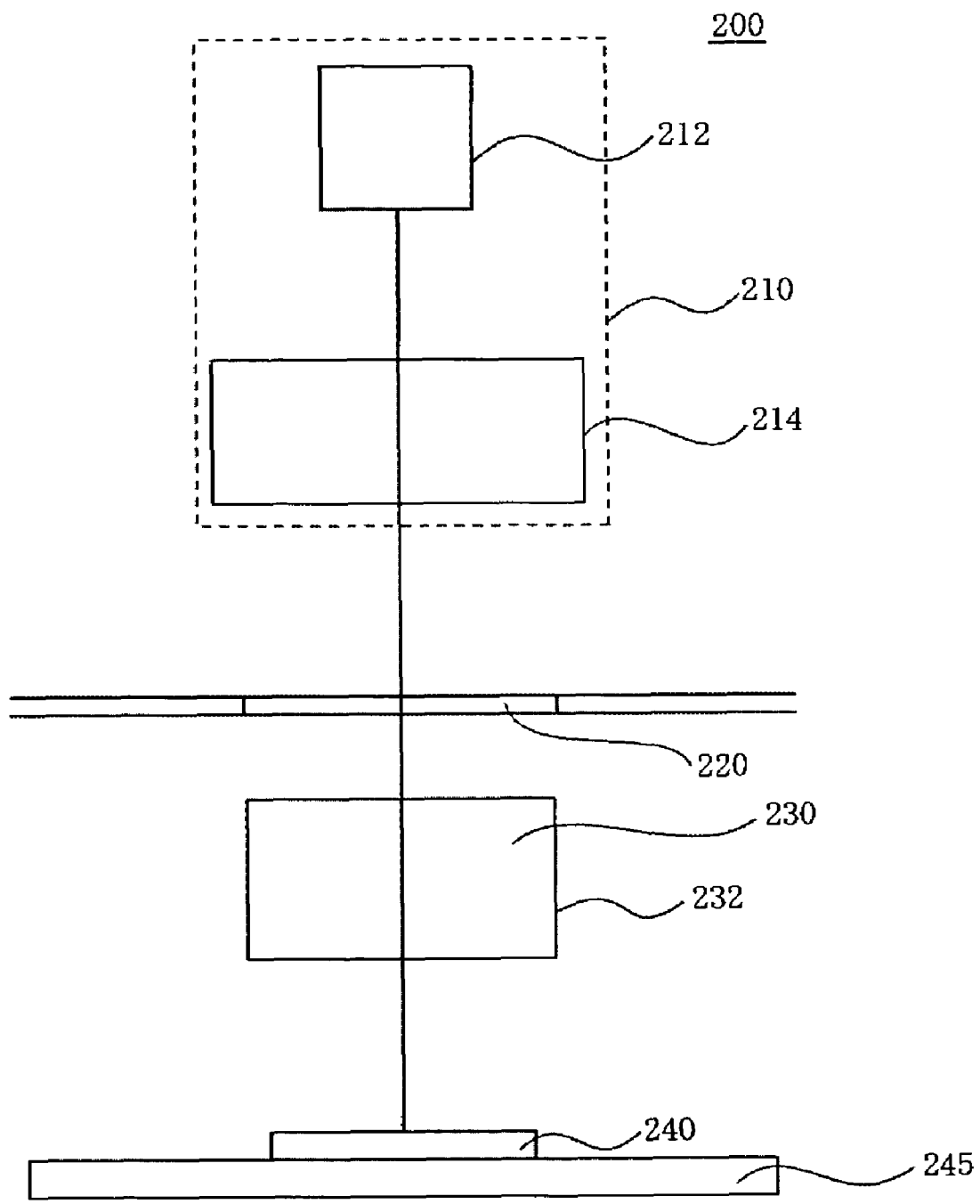
FIG. 26 is a schematic block sectional view showing an illustrative projection optical system of one aspect according to the present invention.

Referring now to FIG. 26, a description will be given of an exemplary exposure apparatus 200 to which the projection optical system 230 of the present invention is applied. FIG. 26 is a schematic block sectional diagram showing an illustrative exposure apparatus 200 of one aspect according to the present invention. While the projection optical system 230 is simplified, it follows the above first and second embodiments. The exposure apparatus 200 includes, as shown in FIG. 26, an illumination apparatus 210 for illuminating a mask (as a first object) 220 which forms a circuit pattern, a projection optical system 230 that projects diffracted light created from the illuminated mask pattern onto a plate (as a second object or a wafer) 240, and a stage 245 for supporting the plate 240.

The exposure apparatus 200 is a projection exposure apparatus that exposes onto the plate 240 a circuit pattern created on the mask, e.g., in a step-and-scan or step-and-repeat manner. Such an exposure apparatus is suitable for a sub-micron or quarter-micron lithography process. The instant embodiment exemplarily describes a step-and-scan exposure apparatus (which is also called "scanner"). "The step-and-scan manner", as is used herein, is an exposure method that exposes a mask pattern onto a wafer by continuously scanning the wafer relative to the mask, and by moving, after a shot of exposure, the wafer stepwise to the next exposure area to be shot. "The step-and-repeat manner" is another mode of exposure method that moves a wafer stepwise to an exposure area for the next shot every short of cell projection.

The illumination apparatus 210 illuminates the mask 220 that forms a circuit pattern to be transferred. It includes a light source unit 212 and an illumination optical system 214.

The light source unit 212 uses as a light source, for example, an $F_2$ laser with a wavelength of approximately 157 nm, an ArF excimer laser with a wavelength of approximately 193 nm, etc. However, the type of laser is not limited to excimer laser. A KrF excimer laser with a wavelength of approximately 248 nm or a YAG laser may be used, for example. Similarly, the number of laser units is not limited. An extreme ultraviolet ("EUV") light source and the like are also applicable. For example, two independently acting solid lasers (or a gas laser) would cause no coherence between these solid lasers and significantly reduce speckles resulting from the coherence. An optical system for reducing speckles may swing linearly or rotationally. When the light source unit 212 uses laser, it is desirable to employ the light shaping optical system that shapes a parallel beam from a laser source to a desired beam shape and an incoherently turning optical system that turns a coherent laser beam into an incoherent one. A light source applicable to the light source unit 212 is not limited to a laser. One or more lamps, such as a mercury lamp and a xenon lamp, may be used.

The illumination optical system 214 is an optical system that illuminates the mask 220. It includes a lens, a mirror, a light integrator, a stop, and the like. For example, a condenser lens, a fly-eye lens, an aperture stop, a condenser lens, a slit, and an imaging optical system are arranged in this order. The illumination optical system 214 can use any light regardless of whether it is on-axial or off-axial light. The light integrator may include a fly-eye lens or an integrator formed by stacking two sets of cylindrical lens array plates (or lenticular lenses), and be replaced with an optical rod or a diffractive element.

The mask 220 is made for example, of quartz, and forms a circuit pattern (or an image) to be transferred. It is supported and driven by a mask stage (not shown). Diffracted light emitted from the mask 220 passes the projection optical system 230. Then it is projected onto the plate 240. The mask 220 and the plate 240 are located in an optically conjugate relationship. Since the exposure apparatus 200 of the instant embodiment is a scanner, the mask 220 and the plate 240 are scanned at the speed of the reduction ratio. Thus, the pattern on the mask 220 is transferred to the plate 240. If it is a step-and-repeat exposure apparatus (referred to as a "stepper"), the mask 220 and the plate 240 remain still in exposing the mask pattern.

The projection optical system 230 may use an optical system solely including a plurality of lens elements, an optical system including a plurality of lens elements and at least one concave mirror (a catadioptric optical system), an optical system including a plurality of lens elements and at least one diffractive optical element such as a kinoform, and a full mirror type optical system, and so on. Any necessary correction of the chromatic aberrations may use a plurality of lens units made from glass materials having different dispersion values (Abbe values) or can arrange a diffractive optical element such that it disperses in a direction opposite to that of the lens unit.

The plate 240 is an exemplary object to be exposed, such as, a wafer and a LCD. A photoresist is applied to the plate 240. A photoresist application step includes a pretreatment, an adhesion accelerator application treatment, a photoresist application treatment, and a pre-bake treatment. The pretreatment includes cleaning, drying, etc. The adhesion accelerator application treatment is a surface reforming process so as to enhance the adhesion, between the photoresist and a base (i.e., a process to increase the hydrophobicity by applying a surface active agent), through a coat or vaporous process using an organic film such as HMDS (Hexamethyl-disilazane). The pre-bake treatment is a baking (or burning) step, softer than that after development, which removes the solvent.

The stage 245 supports the plate 240. The stage 240 may use any structure known in the art. A detailed description of its structure and operation is omitted. The stage 245 may use, for example, a linear motor to move the plate 240 in the XY directions. The mask 220 and plate 240 are, for example, scanned synchronously. The positions of the stage 245 and a mask stage (not shown) are monitored, for example, by a laser interferometer and the like, so that both are driven at a constant speed ratio. The stage 245 is installed on a stage stool supported on the floor and the like, for example, via a dampener. The mask stage and the projection optical system 230 are installed on a lens barrel stool (not shown) which is supported, for example, via a dampener to a base frame on the floor.

In exposure, light is emitted from the light source 212, e.g., Koehler-illuminated the mask 220 via the illumination optical system 214. Light that passes through the mask 220 and reflects the mask pattern is imaged onto the plate 240 by the projection optical system 230.

Eleventh Embodiment

Figure 27:
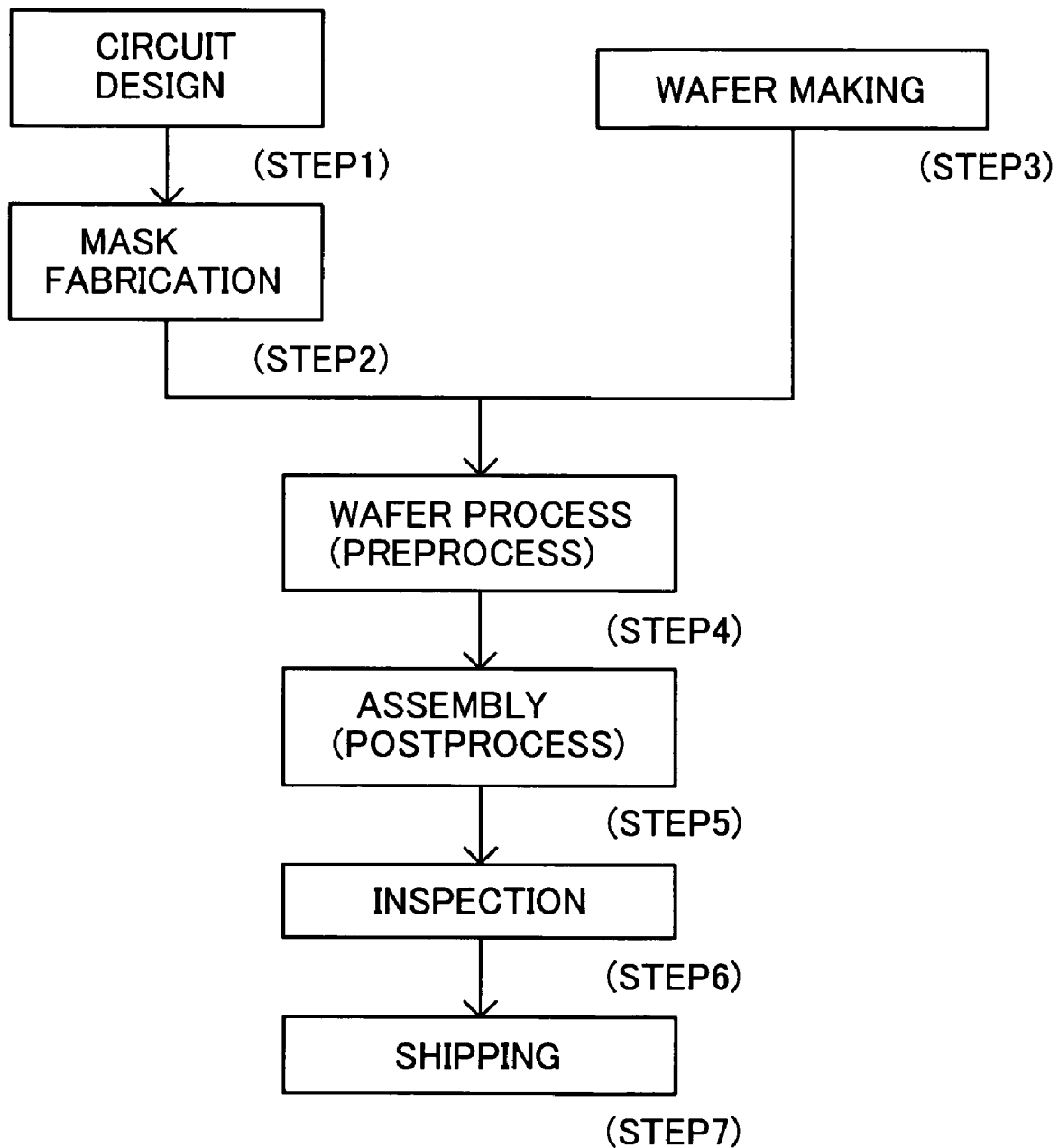
FIG. 27 is a flowchart for explaining device fabrication (such as semiconductor chips such as ICs, LSI and the like, LCDs, CCDs, and the like).
Figure 28:
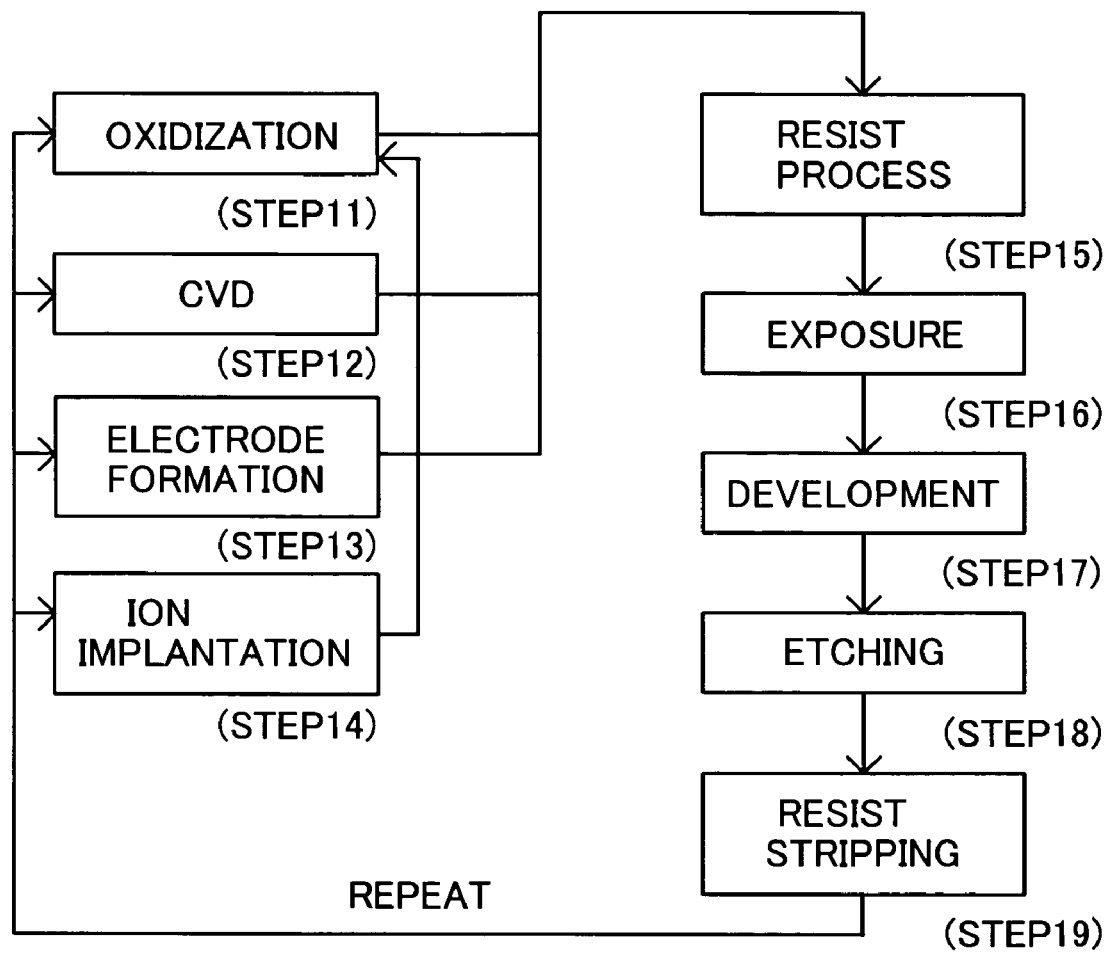
FIG. 28 is a detailed flowchart for Step 4 shown in FIG. 27.

Referring to FIGS. 27 and 28, a description will now be given of a device fabrication method of an eleventh embodiment which uses the above exposure apparatus.

FIG. 27 is a flowchart for explaining how to fabricate devices (i.e., semiconductor chips such as IC and LSI, LCDs, CCDs, etc.). A description will now be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms the actual circuitry on the wafer through photolithography of the present invention using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 28 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor arrangement and the like. Step 14 (ion implantation) implants ions into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes unused resist after etching. These steps are repeated to form multilayer circuit patterns on the wafer. According to the device fabrication method of the instant embodiment, it is possible to fabricate devices of higher quality than the conventional one. In this way, a device fabrication method using the above described exposure apparatus and/or devices as a resulting product, constitutes another aspect of the present invention.

As described above, the instant embodiments will provide an easy solution to a space problem for a first object surface (e.g., a reticle), lenses, mirrors, etc. that make up an optical system. Additionally, it will control influences by a mirror's coating which raises a problem at higher NA. Thus, this helps to realize a high NA catadioptric optical system with no light shielding at the pupil and a large enough imaging area on the image surface, in addition to a projection exposure apparatus and device fabrication method based on the projection optical system.

As many various embodiments of the present invention can be made without departing from the spirit and scope thereof, it is to be understood that the invention is not limited to the specific embodiments thereof except as defined in the claims.

What is claimed is:

1. A projection optical system for projecting an image of a first object onto a second object, said projection optical system comprising:
   a first imaging optical system that forms a first intermediate image of the first object, and includes a lens;
   a second imaging optical system that forms a second intermediate image of the first object, and includes a lens and a concave mirror; and
   a third imaging optical system that forms an image of the first object onto the second object, and includes a lens,
   wherein the first, second and third imaging optical systems are arranged along an optical path from the first object in this order, and
   wherein $0.7 < |\beta 1 \cdot \beta 2| < 3.0$ is met where $\beta 1$ is a paraxial magnification of the first imaging optical system, and $\beta 2$ is a paraxial magnification of the second imaging optical system.

2. A projection optical system for projecting an image of a first object onto a second object, said projection optical system comprising:
   a first imaging optical system that forms a first intermediate image of the first object, and includes a lens;
   a second imaging optical system that forms a second intermediate image of the first object, and includes, in order from a side of the first object, a first deflective reflector, a dioptric lens group, and a concave mirror; and
   a third imaging optical system that forms an image of the first object onto the second object, and includes a lens and a second deflective reflector having a normal that makes practically 90° with a normal for the first deflective reflector;
   wherein the first, second and third imaging optical systems are arranged along an optical path from a side of the first object in this order,
   wherein the concave mirror is arranged opposite to the first object,
   wherein light from the first imaging optical system reflects in turn at the concave mirror and the first deflective reflector, thus being led to the third imaging optical system, and
   wherein light from the first deflective reflector is deflected at the second deflective reflector, then being led to the second object.

3. A projection optical system for projecting an image of a first object onto a second object, said projection optical system comprising:
   a first imaging optical system that forms a first intermediate image of the first object, and includes a lens;
   a second imaging optical system that forms a second intermediate image of the first object, and includes, in order from a side of the first object, a deflective reflector, a dioptric lens group, and a concave mirror; and
   a third imaging optical system that forms the image of the first object onto the second object, and includes a lens,
   wherein the first, second and third imaging optical systems are arranged in this order from the side of the first object along an optical path,
   wherein the concave mirror is arranged opposite to the first object, and
   wherein the deflective reflector is arranged to form a predetermined angle with the optical axis of the second imaging optical system so that light from the first imaging optical system to the concave mirror and light reflected at the deflective reflector intersect each other.

4. A projection optical system according to claim 2, wherein $0.70 < |\beta 1 \cdot \beta 2| < 3.0$ is met where $\beta 1$ is a paraxial magnification of the first imaging optical system, and $\beta 2$ is a paraxial magnification of the second imaging optical system.

5. A projection optical system according to claim 3, wherein $0.70 < |\beta 1 \cdot \beta 2| < 3.0$ is met where $\beta 1$ is a paraxial magnification of the first imaging optical system, and $\beta 2$ is a paraxial magnification of the second imaging optical system.

6. A projection optical system according to claim 1, wherein $0.80 < |\beta 1 \cdot \beta 2| < 2.0$ is met.

7. A projection optical system according to claim 1, wherein $0.70 < |\beta 1| < 2.0$ is met.

8. A projection optical system according to claim 1, wherein $0.70 < |\beta 2| < 2.0$ is met.

9. A projection optical system according to claim 7, wherein $0.80 < |\beta 1| < 1.5$ is met.

10. A projection optical system according to claim 8, wherein $0.80 < |\beta 2| < 1.5$ is met.

11. A projection optical system according to claim 1, wherein P1>0, P2<0 and P3>0 are met where P1 is a Petzval sum of the first imaging optical system, P2 is a Petzval sum of the second imaging optical system, and P3 is a Petzval sum of the third imaging optical system.

12. A projection optical system according to claim 1, wherein $0 \leq |hM1/\phi M1| < 0.10$ is met where $\phi M1$ is an effective diameter of a concave mirror that the second imaging optical system includes, and hM1 is a height from an optical axis of the first imaging optical system at a position that a most off-axial principal ray of light emitted from the first object enters.

13. A projection optical system according to claim 1, further comprising a first deflective reflector that reflects light reflected from a concave mirror of the second imaging optical system, and a second deflective reflector that is arranged at an angle of about 90° with the first deflective reflector, and reflects the light reflected from the first deflective reflector, thus leading it to the second object,
   wherein $0.2 < (\phi Gr2\_max + \phi L3B\_max)/(2Y) < 0.9$ is met where Y is a distance between an optical axis of the first imaging optical system and an optical axis of an optical system located between the second deflective reflector and the second object, $\phi Gr2\_max$ is the maximum effective diameter in the second imaging optical system, and $\phi L3B\_max$ is the maximum effective diameter in an optical system located between the second deflective reflector and the second object.

14. A projection optical system according to claim 1, further comprising a first deflective reflector that reflects light reflected from the concave mirror of the second imaging optical system, wherein $20° < \theta p < 45°$ is met where $\theta p$ is an angle made by a principal ray of light from the off-axis of the first object and a normal of a reflecting surface of the first deflective reflector.

15. A projection optical system according to claim 14, wherein $30° < \theta p < 44°$ is met.

16. A projection optical system according to claim 1, further comprising two deflective reflectors arranged in an interval from the concave mirror of the second imaging optical system up to the second object.

17. An exposure apparatus comprising:
   an illumination optical system that uses light from a light source to illuminate a first object; and
   a projection optical system according to claim 1 for projecting an image of the first object onto a second object.

18. An exposure apparatus comprising:
an illumination optical system that uses light from a light source to illuminate a first object; and
a projection optical system according to claim 2 for projecting an image of the first object onto a second object.

19. An exposure apparatus comprising:
an illumination optical system that uses light from a light source to illuminate a first object; and
a projection optical system according to claim 3 for projecting an image of the first object onto a second object.

20. A device fabrication method comprising the steps of:
exposing the second object by using an exposure apparatus according to claim 17; and
developing the exposed second object.

21. A device fabrication method comprising the steps of:
exposing the second object by using an exposure apparatus according to claim 18; and
developing the exposed second object.

22. A device fabrication method comprising the steps of:
exposing the second object by using an exposure apparatus according to claim 19; and
developing the exposed second object.

23. A projection optical system that projects an image of a first object onto a second object, comprising:
a first imaging optical system that forms a first intermediate image of the first object, and includes a lens;
a second imaging optical system that forms a second intermediate image of the first object, and includes a lens and a concave mirror; and
a third imaging optical system that forms the image of the first object onto the second object, and includes a lens,
wherein the first, second and third imaging optical systems are arranged in this order along an optical path from the first object, and
wherein $0.7<|\beta 1|<2.0$ is met where $\beta 1$ is a paraxial magnification of the first imaging optical system.

24. A projection optical system according to claim 23, comprising a first deflective reflector arranged between the first imaging optical system and the second imaging optical system, and a second deflective reflector arranged between the second imaging optical system and the third imaging optical system.

25. A projection optical system according to claim 23, wherein the concave mirror is arranged opposite to the first object.

26. A projection optical system according to claim 23, wherein $0.8<|\beta 1|<1.5$ is met.

27. A projection optical system according to claim 24, wherein a normal of a reflecting surface of the first deflective reflector and a normal of a reflecting surface of the second deflective reflector are practically orthogonal to each other.

28. A projection optical system according to claim 24, wherein the first and second deflective reflectors are arranged such that light from the first imaging optical system traveling to the concave mirror and light reflected from the concave mirror and traveling to the third imaging optical system intersect each other.

29. An exposure apparatus comprising:
an illumination optical system that uses light from a light source to illuminate a first object; and
a projection optical system according to claim 23 for projecting an image of the first object onto a second object.

30. A device fabrication method comprising the steps of:
exposing the second object by using an exposure apparatus according to claim 29; and
developing the exposed second object.

31. A projection optical system for projecting an image on a first object onto a second object, said projection optical system comprising:
a first imaging optical system that includes a lens and forms a first intermediate image of the first object;
a second imaging optical system that includes a lens and a concave mirror, and forms a second intermediate of the first object; and
a third imaging optical system that includes a lens and forms the image of the first object onto the second object,
wherein said first, second and third imaging optical systems are arranged along an optical path from the first object in order of said first imaging optical system, said second imaging optical system and said third imaging optical system, and
wherein $3.5<|\beta 1 \cdot \beta 2|/NAo<20$ is met, where $\beta 1$ is a paraxial magnification of said first imaging optical system, $\beta 2$ is a paraxial magnification of said second imaging optical system, and NAo is a numerical aperture of said projection optical system at a side of the first object.

32. A projection optical system according to claim 31, wherein $4.0<|\beta 1 \cdot \beta 2|/NAo<10$.

33. A projection optical system according to claim 31, wherein $1.1<NA<1.6$ is met where NA is a numerical aperture of said projection optical system at a side of the second object.

34. A projection optical system according to claim 33, wherein $1.2<NA<1.5$ is met.

35. A projection optical system according to claim 31, wherein said projection optical system is an immersion optical system.

* * * * *

UNITED STATES PATENT AND TRADEMARK OFFICE
CERTIFICATE OF CORRECTION

PATENT NO.   : 6,995,833 B2
DATED        : February 7, 2006
INVENTOR(S)  : Takashi Kato et al.

It is certified that error appears in the above-identified patent and that said Letters Patent is hereby corrected as shown below:

<u>Column 43,</u>
Line 14, delete "15,".

Signed and Sealed this

Eleventh Day of April, 2006

JON W. DUDAS
*Director of the United States Patent and Trademark Office*